US012560665B1

(12) United States Patent
Balcom et al.

(10) Patent No.: US 12,560,665 B1
(45) Date of Patent: Feb. 24, 2026

(54) MAGNETIC RESONANCE METHODS AND DEVICES FOR CHARACTERIZING RHEOLOGICAL PROPERTIES OF A FLUID

(71) Applicants: Bruce J. Balcom, Fredericton (CA); Jiangfeng Guo, Beijing (CN); Benedict Newling, Fredericton (CA); Mary-Margaret Lawrence, Truro (CA); Devin Morin, Fredericton (CA)

(72) Inventors: Bruce J. Balcom, Fredericton (CA); Jiangfeng Guo, Beijing (CN); Benedict Newling, Fredericton (CA); Mary-Margaret Lawrence, Truro (CA); Devin Morin, Fredericton (CA)

(73) Assignee: THE UNIVERSITY OF NEW BRUNSWICK, Fredericton (CA)

( * ) Notice: Subject to any disclaimer, the term of this patent is extended or adjusted under 35 U.S.C. 154(b) by 314 days.

(21) Appl. No.: 18/102,500

(22) Filed: Jan. 27, 2023

Related U.S. Application Data

(63) Continuation-in-part of application No. 17/728,063, filed on Apr. 25, 2022.

(Continued)

(51) Int. Cl.
| | |
|---|---|
| *G01R 33/563* | (2006.01) |
| *G01F 1/716* | (2006.01) |
| *G01N 24/08* | (2006.01) |

(52) U.S. Cl.
CPC ..... *G01R 33/56308* (2013.01); *G01N 24/082* (2013.01); *G01F 1/716* (2013.01)

(58) Field of Classification Search
CPC ........... G01F 1/708; G01F 1/716; G01F 1/74; G01N 24/082

(Continued)

(56) References Cited

U.S. PATENT DOCUMENTS

| | | | | | |
|---|---|---|---|---|---|
| 4,609,872 | A | * | 9/1986 | O'Donnell | ....... G01R 33/56308 324/306 |
| 5,532,593 | A | * | 7/1996 | Maneval | ................ G01N 11/08 324/306 |

(Continued)

FOREIGN PATENT DOCUMENTS

| | | | | | |
|---|---|---|---|---|---|
| CN | 108254588 A | * | 7/2018 | ................ | G01P 5/00 |

OTHER PUBLICATIONS

Liao; Translation of CN 108254588 A; Jul. 6, 2018; Translated by Clarivate Analytics (Year: 2018).*

*Primary Examiner* — Alesa Allgood
*Assistant Examiner* — Rahul Maini
(74) *Attorney, Agent, or Firm* — Eugene Derenyi; Fogler, Rubinoff LLP

(57) ABSTRACT

A magnetic resonance method and device for method for characterizing the pattern of flow of a flowing fluid including processing at least one odd echo acquired from radio frequency pulses of a measurement volume containing a flowing fluid, wherein the echo includes signals from streamlines in the flowing fluid in the measurement volume, processing the signals to concurrently determine a signal magnitude and a net phase accumulation and using the signal magnitude and the net phase accumulation to determine a flow behaviour index and an average velocity for the flowing fluid, and calculating velocity as a function of the radius of the conduit using the flow behaviour index and the average velocity and relating the function to a pattern of flow to characterize the pattern of flow exhibited by the flowing fluid.

14 Claims, 24 Drawing Sheets

Related U.S. Application Data

(60) Provisional application No. 63/178,891, filed on Apr. 23, 2021.

(58) Field of Classification Search
USPC ......................................................... 324/306
See application file for complete search history.

(56) References Cited

U.S. PATENT DOCUMENTS

| | | | | | |
|---|---|---|---|---|---|
| 5,810,727 | A | * | 9/1998 | Groen .............. | G01R 33/56308 |
| | | | | | 324/307 |
| 6,140,817 | A | * | 10/2000 | Flaum ...................... | G01V 3/32 |
| | | | | | 324/303 |
| 2004/0140800 | A1 | * | 7/2004 | Madio ...................... | G01V 3/32 |
| | | | | | 324/306 |
| 2005/0007109 | A1 | * | 1/2005 | Thomann ................. | G01V 3/32 |
| | | | | | 324/306 |
| 2016/0077026 | A1 | * | 3/2016 | Pusiol .............. | G01R 33/56308 |
| | | | | | 324/306 |

* cited by examiner

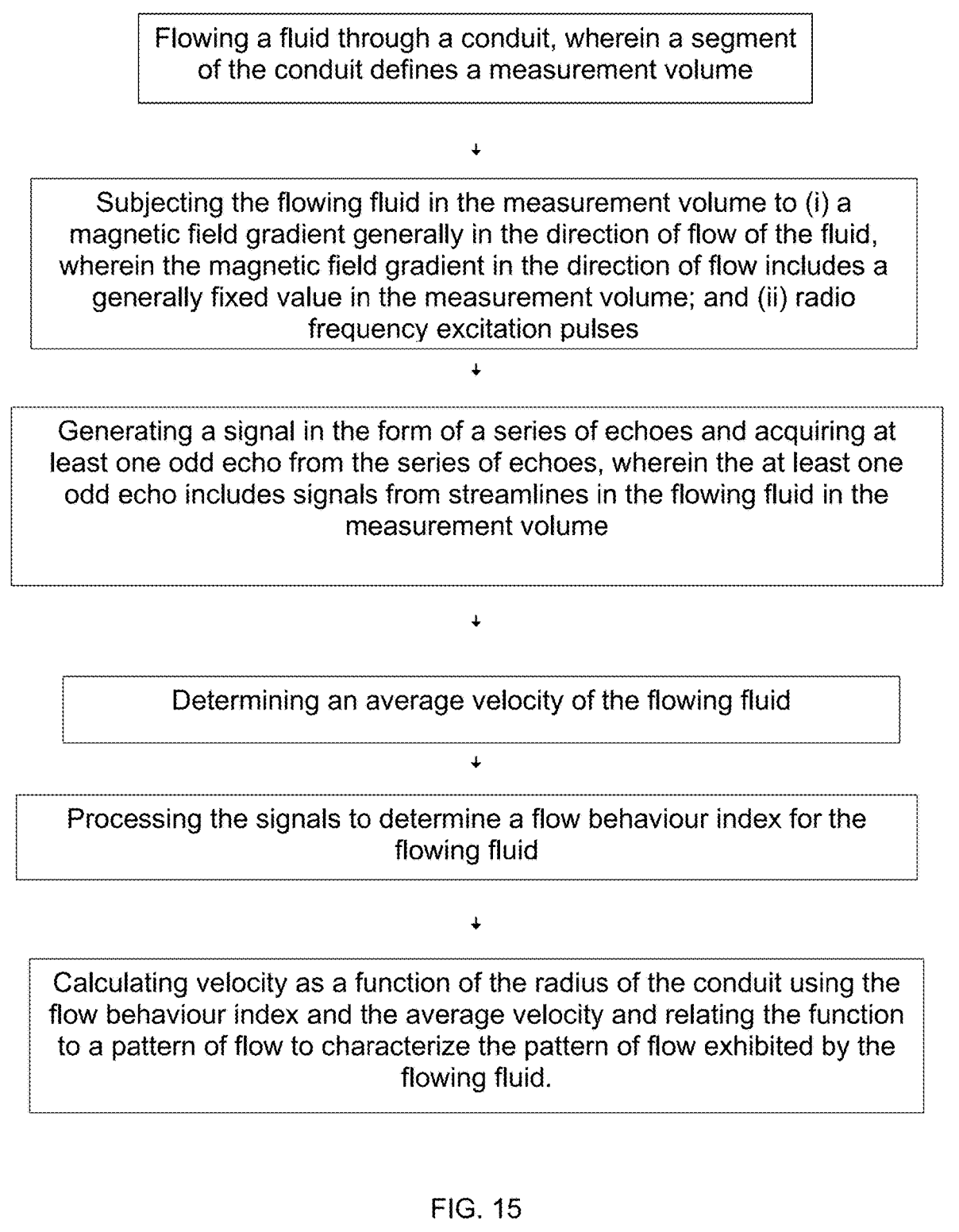

Flowing a fluid through a conduit, wherein a segment of the conduit defines a measurement volume

↓

Subjecting the flowing fluid in the measurement volume to (i) a magnetic field gradient generally in the direction of flow of the fluid, wherein the magnetic field gradient in the direction of flow includes a generally fixed value in the measurement volume; and (ii) radio frequency excitation pulses

↓

Generating a signal in the form of a series of echoes and acquiring at least one odd echo from the series of echoes, wherein the at least one odd echo includes signals from streamlines in the flowing fluid in the measurement volume

↓

Determining an average velocity of the flowing fluid

↓

Processing the signals to determine a flow behaviour index for the flowing fluid

↓

Calculating velocity as a function of the radius of the conduit using the flow behaviour index and the average velocity and relating the function to a pattern of flow to characterize the pattern of flow exhibited by the flowing fluid.

FIG. 15

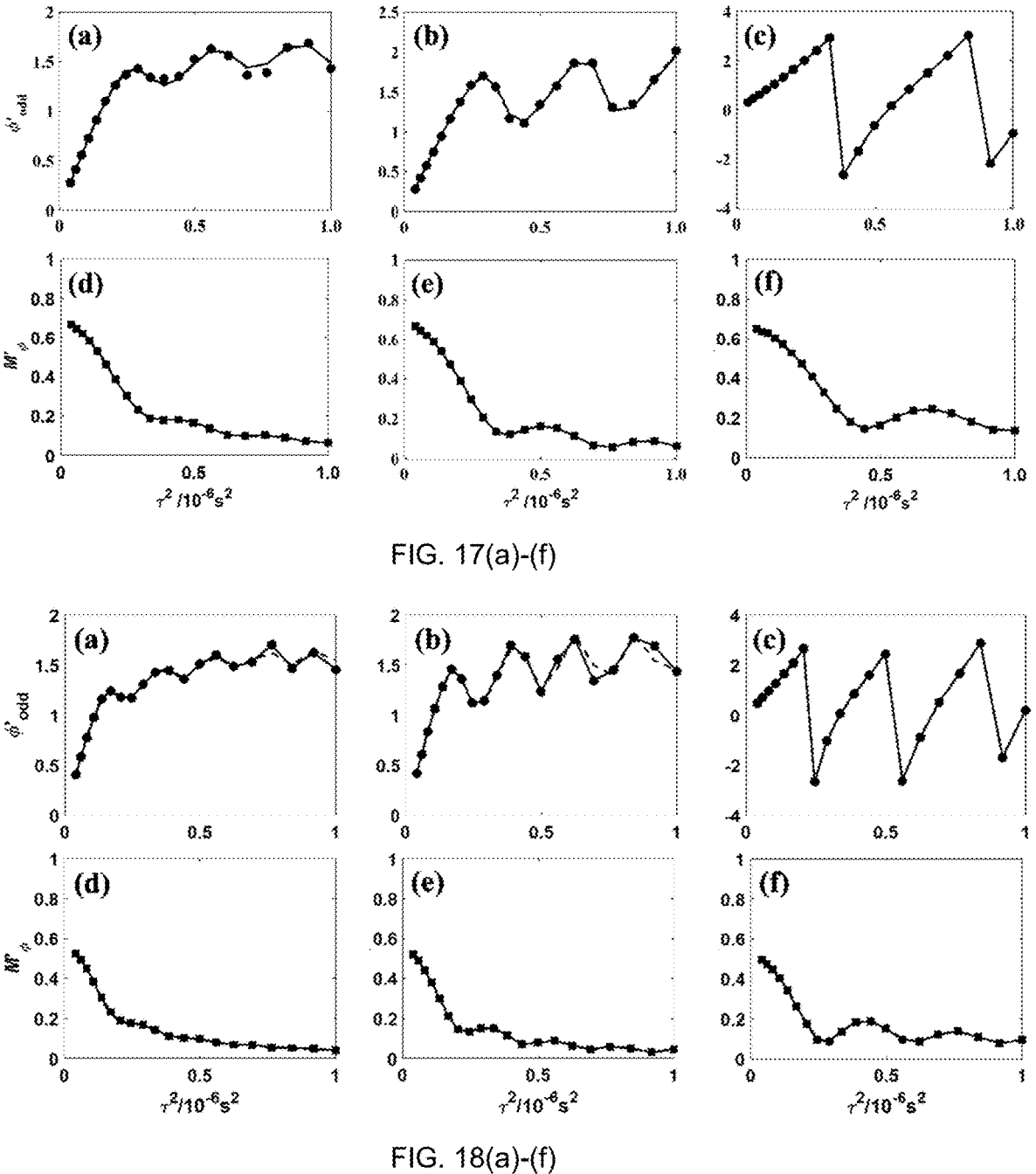
FIG. 17(a)-(f)
FIG. 18(a)-(f)

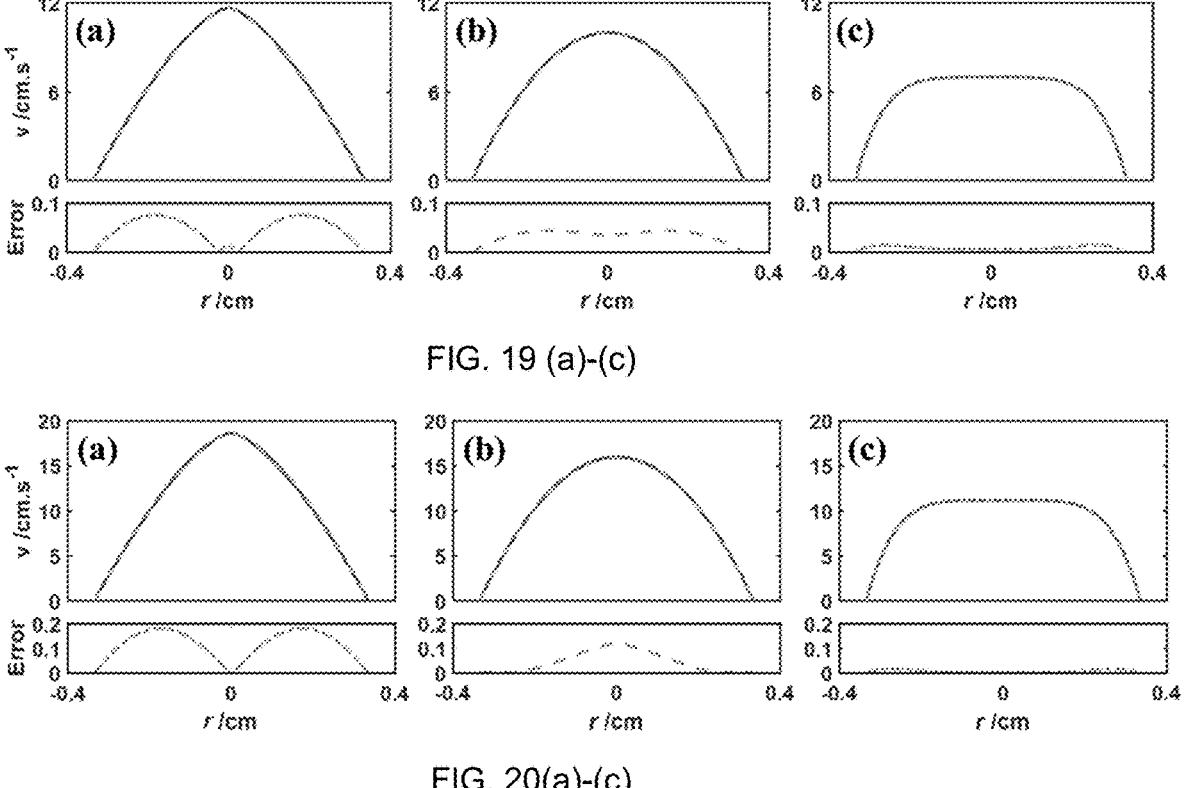
FIG. 19 (a)-(c)
FIG. 20(a)-(c)

MAGNETIC RESONANCE METHODS AND DEVICES FOR CHARACTERIZING RHEOLOGICAL PROPERTIES OF A FLUID

CROSS-REFERENCE TO RELATED APPLICATIONS

This application is a continuation-in-part of U.S. patent application Ser. No. 17/728,063, filed Apr. 25, 2022 which claims the benefit under 35 U.S.C. § 120 of U.S. Provisional Patent Application Ser. No. 63/178,891, filed Apr. 23, 2021.

FIELD OF THE DISCLOSURE

The present disclosure relates generally to methods and devices for characterizing rheological properties of a fluid in general, and a pattern of flow in particular.

BACKGROUND OF THE DISCLOSURE

Laminar flow, in fluid dynamics, is characterized by each fluid micro element flowing in parallel layers without interference and mixing with the adjacent layers [1]. The characterization of laminar flow, including average velocity and velocity profile, is of considerable value in chemical and allied processing industries [2-4]. Various fluids exhibit different flow behaviours under laminar conditions, dependent on fluid rheological properties [5-8]. Laminar flow characterization is therefore helpful to characterize the rheological properties.

Magnetic resonance/magnetic resonance imaging (MR/MRI) in flow measurements is attractive because of its non-invasive capabilities for measuring optically opaque objects [8-10]. Multiple MR- and MRI-based methods have been reported to characterize fluid flow. MRI-based methods for measuring flows are based on the application of magnetic field gradients, including frequency-, phase-, and motion-encoding gradients, to yield quantitative information about velocity distributions of the flowing fluid [9-15]. There are also some modified MRI-based methods that only use one type of gradient [16-19]. MRI-based methods, resolving flow velocity profiles, have been used to measure various types of flows, for example laminar flow [14, 15, 20], turbulence [21-24], and flow in porous media [25-27]. Unfortunately, these measurements are predominantly performed on laboratory research instruments. The chief challenges of MRI-based methods, for widespread industrial application, are the expense of the superconducting equipment and the demand of the high-performance gradient systems. MR-based methods for flow measurements do not need complicated equipment, as a permanent magnet with a static magnetic field gradient is sufficient. It therefore has wide industrial application prospect and great developmental potential in characterizing fluid flow.

MR-based methods for characterizing flow are based on the effect of flow on the MR signal. Suryan (1951) measured MR signals of flowing water in a U-tube between the pole pieces of a magnet at 20 MHz, and reported the continuous wave MR signal increased as the partially saturated spins are replaced by unsaturated flowing spins [28]. Singer (1959) exploited this principle to demonstrate in vivo flow measurements [29]. Hirschel and Libello (1962) showed the steady state MR signal is a function of fluid velocity in the presence of flow [30]. Arnold and Burkhart (1965) employed a spin echo to study the influence of flow on MR signal under laminar flow conditions [31]. Stejkal (1965), Grover and Singer (1971), and Hayward et al. (1972) extended this work using a pulsed field gradient technique [32-34].

Since the effect of flow on MR signal was first studied, multiple MR-based methods for characterizing flows were reported. These methods can be mainly classified into two categories: (1) net phase accumulation-based techniques [33-35] and (2) magnitude-based time-of-flight techniques [36-39]. Net phase accumulation-based techniques rely on the application of a constant static or pulsed magnetic field gradient in the direction of flow. The phase shift of the signal detected occurs due to flows with a flow-oriented gradient, which is proportional to the average velocity. For example, Song et al. (2005) employed the Multiple Modulation Multiple Echoes (MMME) technique to measure fluid flow with a static magnetic field gradient [35]. A series of coherence pathways were generated by the MMME technique, and each of them exhibits a phase shift dependent on average velocity. Magnitude-based time-of-flight techniques is based on the variation of signal magnitude proportional to the quality of excited spins in the detector, related to flow velocity. This technique does not require the use of any magnetic field gradients. It is therefore very popular to employ this technique in low-cost low-field MR spectrometers. Beyond the two kinds of MR-based methods, O'Neill et al. (2016; 2017; 2019) invented an Earth's field magnetic resonance flow meter to measure the velocity probability distribution and T1-velocity probability distribution of multiphase flow [40-42].

From the descriptions of the existing MR-based methods, it can be found these methods focus on the average velocity of fluid flow, which is insufficient to support the study of fluid rheology.

Further Background

Fluid flow is a continuous deformation process with time under the action of gravity or another external force. For laminar flow, the fluid particles move smoothly in the flow direction at a moderate Reynolds number [50]. The laminar flow velocity profile is directly related to the rheological properties of the fluid and, if known, can be used to evaluate those properties of the fluid [51, 7, 52-54]. Many technologies have been developed to measure flow velocity profiles, such as optical coherence tomography [55-57], ultrasound velocity profiling [58, 59], and magnetic resonance (MR) velocimetry [8-10]. Magnetic resonance, a non-invasive and non-destructive method, can measure velocity without disturbing the flow, which is advantageous for wide application of the technology.

Magnetic resonance flow measurements can be divided into two categories: Magnetic resonance imaging (MRI)-based methods and bulk Magnetic resonance (MR)-based methods. MRI-based methods employ frequency-, phase-, and motion-encoding magnetic field gradient pulses for spatially resolved measurements [11-14]. MRI-based methods have been employed for velocity profiling in laminar flow [51, 8, 11, 15, 14, 60], granular flow [61-63], turbulent flow [21, 23, 64, 65], and flow in porous media [28-30]. MRI-based methods, however, require complicated equipment and sophisticated measurements, restricting more routine usage. Bulk MR-based methods employ Carr-Purcell-Meiboom-Gill (CPMG) or simple spin echo measurements to acquire phase and magnitude data for flow measurement. Bulk MR-based methods developed to date have mainly been employed for average velocity determination by net phase accumulation e.g. [33, 66, 67] or magnitude-based time-of-flight approaches e.g. [36, 38]. Net phase accumulation-based methods work well since the phase shift of odd echo signals with a flow-oriented gradient is related to the fluid flow velocity. Time-of-flight methods can work well since a signal magnitude change is related to a change in the number of excited spins in the detector, which depends, in turn, on flow velocity.

The velocity profile of laminar flow, in a circular pipe, is related to the average velocity, but also depends on the flow behaviour index. Bulk MR-based methods are generally unable to yield the laminar flow velocity profile, but are of great value for industrial application due to the simplicity of the measurement and simplicity of the hardware.

SUMMARY OF THE DISCLOSURE

The flow behaviour index is an important parameter of fluid rheology, which has a direct impact on flow velocity profile under laminar conditions. Determination of the velocity profile is, therefore, helpful to study fluid rheology. In some aspects of the present disclosure, MR methods are applied to fluid rheology. In other aspects of the present disclosure, MR-based methods are used to characterize flow in a conduit, for example laminar flow in a conduit such as a pipe, including average velocity and velocity profile. In another aspect, the MR methods are based on Carr-Purcell-Meiboom-Gill (CPMG) MR measurements.

A method according to one aspect of the present disclosure relates to a magnetic resonance method for characterizing the pattern of flow of a flowing fluid including the steps of flowing the fluid through a conduit, wherein a segment of the conduit defines a measurement volume, subjecting the flowing fluid in the measurement volume to a magnetic field gradient generally in the direction of flow of the fluid, wherein the magnetic field gradient in the direction of flow comprises a generally fixed value in the measurement volume, and radio frequency excitation pulses, generating a signal in the form of a series of echoes and acquiring at least one odd echo from the series of echoes, wherein the at least one odd echo comprises signals from streamlines in the flowing fluid in the measurement volume, determining an average velocity of the flowing fluid, processing the signals to determine a flow behaviour index for the flowing fluid, and calculating velocity as a function of the radius of the conduit using the flow behaviour index and the average velocity and relating the function to a pattern of flow to characterize the pattern of flow exhibited by the flowing fluid.

A device, according to another aspect of the present disclosure, relates to a palm-sized sensor (hereinafter also referred to as the "Proteus magnet"), with a constant magnetic field gradient, designed to be used for the measurement of fluid flows, including laminar flows. The Proteus magnet in one aspect consists of two portable disk magnets tilted at an angle of 1° from a starting separation of 1.4 cm. Other tilt angles and separations can be used to achieve a magnetic field gradient generally in the direction of the flow of fluid being measured. In one aspect, the Proteus magnet has a 1H resonance frequency of 20.48 MHz to measure laminar flow. However, other suitable resonance frequencies can be used. In some other aspects, methods of the present disclosure relate to a phase-based method, magnitude-based method, and velocity spectrum method as further described in this disclosure to characterize flow in a pipe, including average velocity and velocity profile, from a CPMG measurement. Other suitable MR measurements can be used.

In a method according to another aspect of the present disclosure, a phase shift occurs on the odd echoes during CPMG measurement for flow measurement with a flow-directed constant gradient. The phase accumulation is related to gradient, echo time, and average velocity. A phase-based method according to an aspect of the present disclosure employs multiple odd echo phase accumulations at different echo times to fit the average velocity of flow. In one aspect, only one measurement is required for a varied echo time CPMG scheme to obtain desired data.

In a method according to another aspect of the present disclosure, a normalized magnitude $M_\phi$ of odd echoes, due to the phase accumulation, is derived, dependent on gradient, echo time, average velocity, and flow behaviour index. The magnitude-based method according to one aspect obtains average velocity and flow behaviour index based on the fitting by $M_\phi$ of odd echoes at different echo times. In one aspect, with a modest number (on the order of 10 for example) of odd echo data points at different echo times, the average velocity can be obtained from a phase-based method according to an aspect of the present disclosure, and then fitted to obtain a flow behaviour index, with known average velocity, by the $M_\phi$. A magnitude-based method according to an aspect of the present disclosure provides the possibility that the flow velocity profile is determined with a CPMG measurement.

In a method according to another aspect of the present disclosure, a velocity spectrum method is based on a Fourier transform approach. Due to the fixed gradient of the Proteus magnet, this method changes T during the measurement. The maximum flow velocity can be determined based on the break point in the velocity spectrum. Combined with the average velocity from the phase-based method, flow behaviour index can be resolved, and in turn flow profile is determined.

A CPMG measurement according to another aspect of the method of the present disclosure can be used on low-field MR equipment with a flow-oriented gradient for the determination of a flow velocity profile based on methods according to the present disclosure. Methods according to some aspects of the present disclosure are developed to process the measured data at complete polarization. According to another aspect, a flow measurement, based on the Proteus magnet, requires a short T1 of measured fluid, usually using a contrast agent, to make the detected fluid completely polarized.

The method according to another aspect of the present disclosure relates to a computer-implemented method of processing at least one odd echo acquired from radio frequency pulses of a measurement volume containing a flowing fluid, wherein the echo includes signals from streamlines in the flowing fluid in the measurement volume, processing the signals to determine a flow behaviour index for the flowing fluid, determining an average velocity of the flowing fluid, and calculating velocity as a function of the radius of the conduit using the flow behaviour index and the average velocity and relating the function to a pattern of flow to characterize the pattern of flow exhibited by the flowing fluid.

The method according to another aspect of the present disclosure relates a method based on bulk magnetic resonance measurements at incomplete polarization with a constant flow-oriented magnetic field gradient to calculate the velocity profile of laminar flow in a circular pipe. In one aspect, incomplete polarization occurs when the flow velocity of individual streamlines of the flow results in a residence time in the magnet which is shorter than 5*T1 where T1 is the spin lattice relaxation time of the fluid. This method utilizes phase accumulations and magnitude changes of the first odd echoes, due to fluid flow and incomplete polarization, to determine n' and vavg. Discrete simulations for shear-thickening, Poiseuille, and shear-shinning flows in a circular pipe reveal the feasibility and effectiveness of the method for the velocity profile determination of laminar flow. In another aspect, a portable magnet with a constant flow-oriented gradient can replace the superconducting magnet to measure laminar flow velocity profiles by this method.

The method according to another aspect relates to a magnetic resonance method for characterizing the pattern of flow of a flowing fluid including the steps of flowing the fluid through a conduit, wherein a segment of the conduit defines a measurement volume, subjecting the flowing fluid in the measurement volume to a magnetic field gradient generally in the direction of flow of the fluid, wherein the magnetic field gradient in the direction of flow comprises a generally fixed value in the measurement volume; and radio frequency excitation pulses generating a signal in the form of a series of echoes, acquiring at least one odd echo from the series of echoes, wherein the at least one odd echo comprises signals from streamlines in the flowing fluid in the measurement volume, processing the signals to concurrently determine a signal magnitude and a net phase accumulation and using the signal magnitude and the net phase accumulation to determine a flow behaviour index and an average velocity for the flowing fluid, and calculating velocity as a function of the radius of the conduit using the flow behaviour index and the average velocity and relating the function to a pattern of flow to characterize the pattern of flow exhibited by the flowing fluid.

BRIEF DESCRIPTIONS OF DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 13($b$) is a plot of 1D flow velocity profiles for the xanthan gum solution flows based on the fitted m and vavg;

FIG. 15 is an example of a method for characterizing the pattern of flow of a flowing fluid according to an implementation;

FIG. 17($a$)-($f$) are graphs of simulated first odd echo $\phi'_{add}$ and $M'_\phi$ ($\bullet$ and $\blacksquare$) at different $\tau$, theoretical first odd echo $\phi'_{add}$ and $M'_\phi$ (-) at different $\tau$, and processed results (----) by the Nelder-Mead algorithm, for shear-thickening flow (a and d), for Poiseuille flow (b and e), and for shear-thinning flow (c and f) at an average of 5 cm/s. Phase angles are in radians.

$\phi'_{add} < 0$ in (c) means the observed phase accumulation is negative, but the actual phase accumulation is greater than $\pi$:

FIG. 18($a$)-($f$) are graphs of simulated first odd echo $\phi'_{add}$ and $M'_\phi$ ($\bullet$ and $\blacksquare$) at different $\tau$, theoretical first odd echo $\phi'_{add}$ and $M'_\phi$ (-) at different $\tau$, and processed results (----) by the Nelder-Mead algorithm, for shear-thickening flow (a and d), for Poiseuille flow (b and e), and for shear-thinning flow (c and f) at an average of 8 cm/s. Phase angles are in radians.

Figure 21:
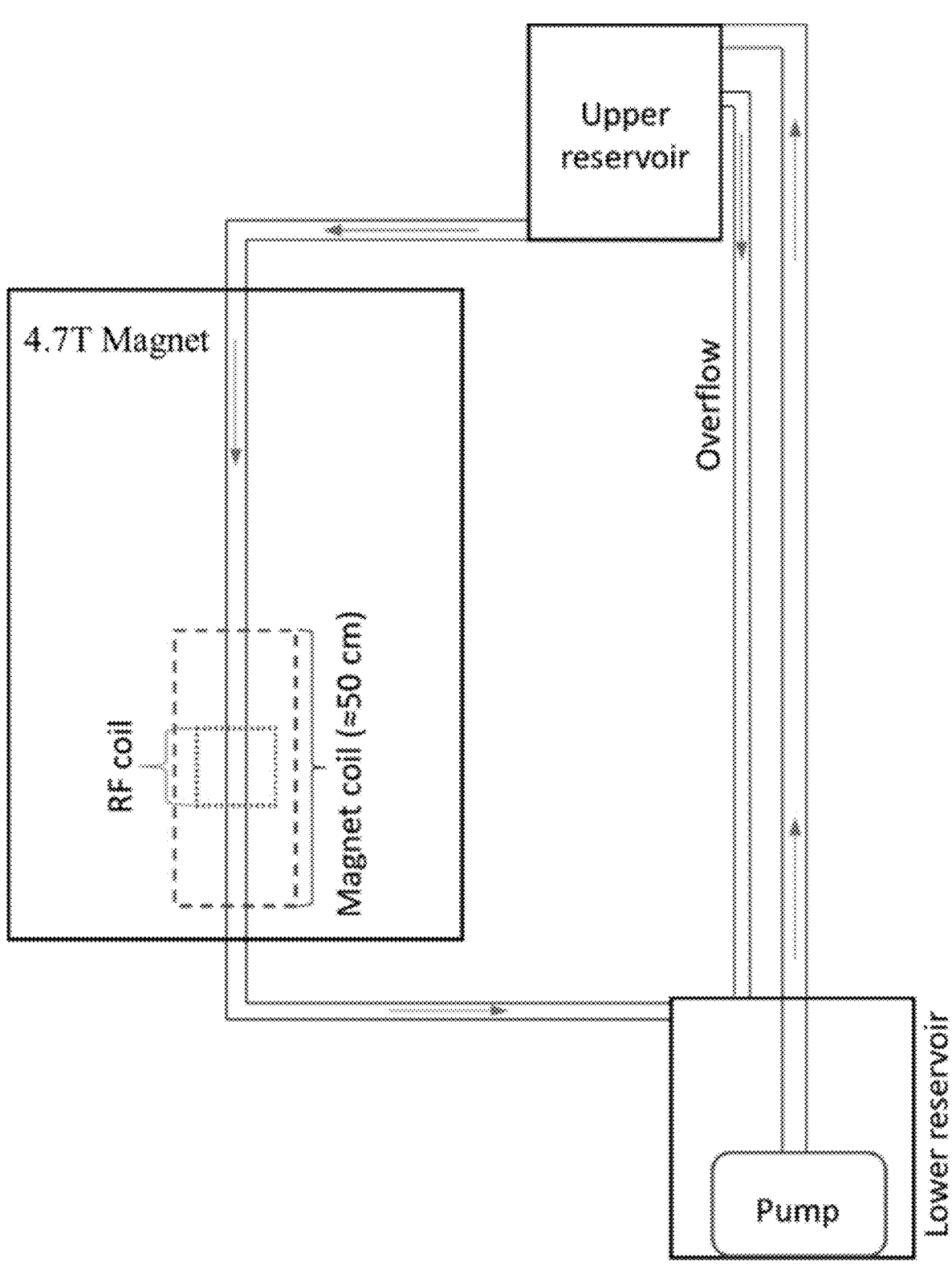
Figure 23:
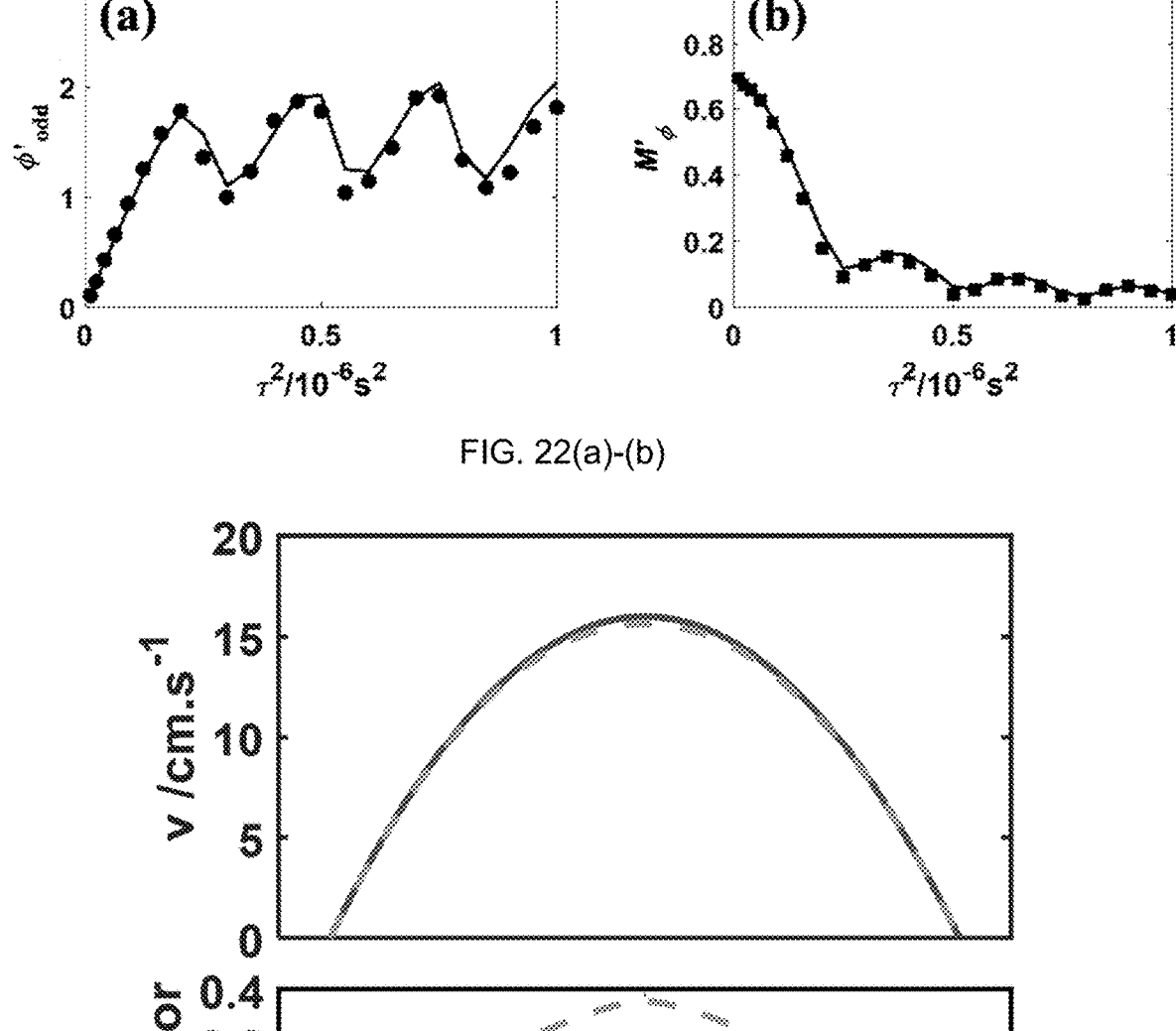
Figure 24:
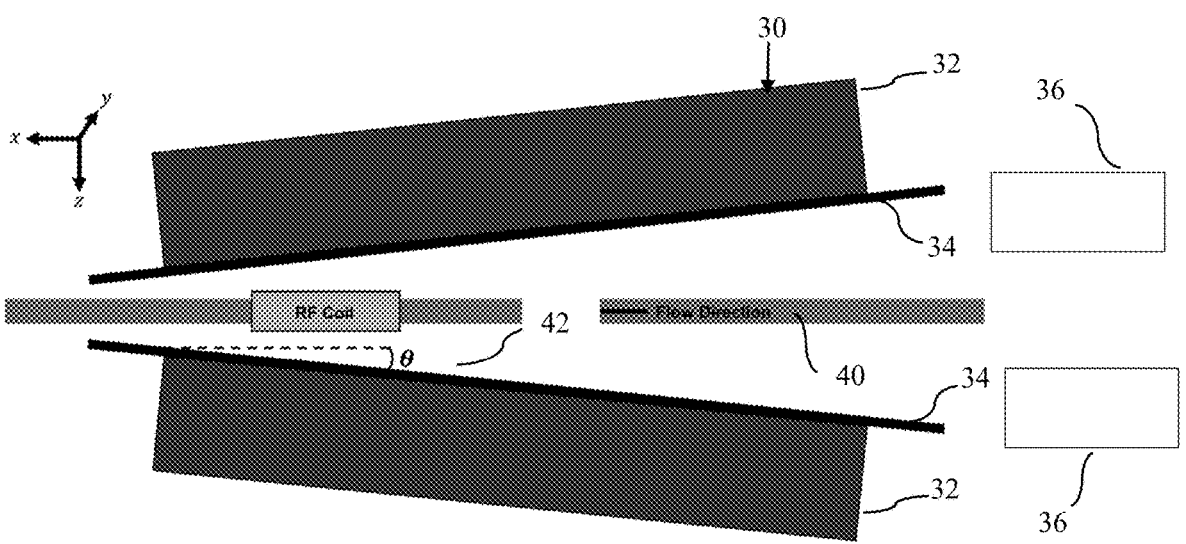

$\phi'_{add} < 0$ in (c) means the observed phase accumulation is negative, but the actual phase accumulation is greater than $\pi$:

FIG. 19($a$)-($c$) are graphs of comparisons of the constructed 1D flow velocity profiles (----) with the corresponding model (-) for shear-thickening flow (a), for Poiseuille flow (b), and for shear-thinning flow (c) at an average of 5 cm/s. The bottom subplots show the absolute error of predicted velocity. All predicted velocity errors are less than 0.1 cm/s;

FIG. 20($a$)-($c$) are graphs of comparisons of the constructed 1D flow velocity profiles (----) with the corresponding model (-) for shear-thickening flow (a), for Poiseuille flow (b), and for shear-thinning flow (c) at an average of 8 cm/s. The bottom subplots show the absolute error of predicted velocity. All predicted velocity errors are less than 0.2 cm/s;

FIG. 21 is a schematic diagram of a gravity fed flow network used in an experiment of a method according to an embodiment of the present invention;

FIG. 22($a$)-($b$) are graphs of measured and fitted results for the tap water flow measurements. (a) The measured and fitted phase shifts ($\bullet$ and $\blacksquare$) and (b) the measured and fitted normalized signal magnitude ($\bullet$ and $\blacksquare$) for the first odd echoes at different $\tau$;

FIG. 23 is a graph comparison of 1D velocity profiles of the tap water flow from the theoretical prediction (-) with from the proposed method (----). The bottom subplot shows the error of the flow velocity profile from the proposed method; and FIG. 24 is a schematic diagram of a magnet sensor according to an aspect of the present disclosure.

DETAILED DESCRIPTION

Sensor Design and Hardware

Figure 1A:
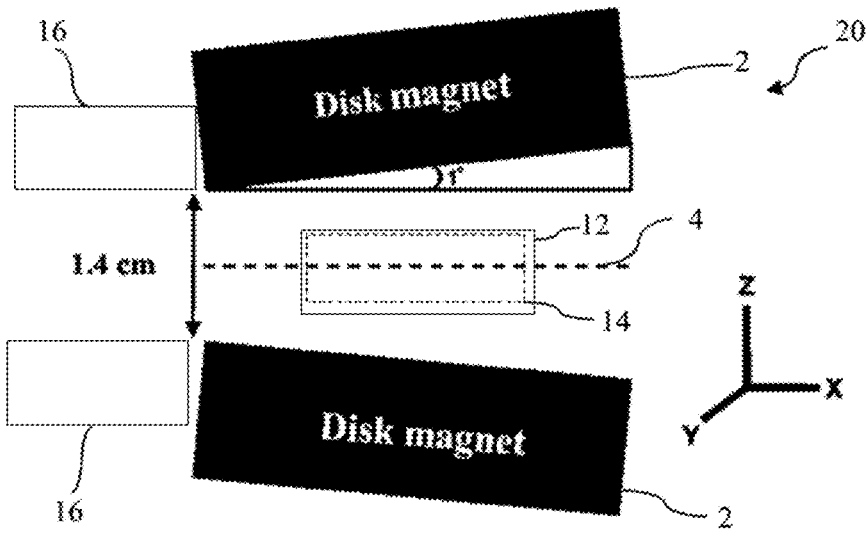
FIG. 1(a) is a schematic diagram of the position of two disk magnets for a Proteus magnet sensor according to an aspect of the present disclosure.
Figure 1B:
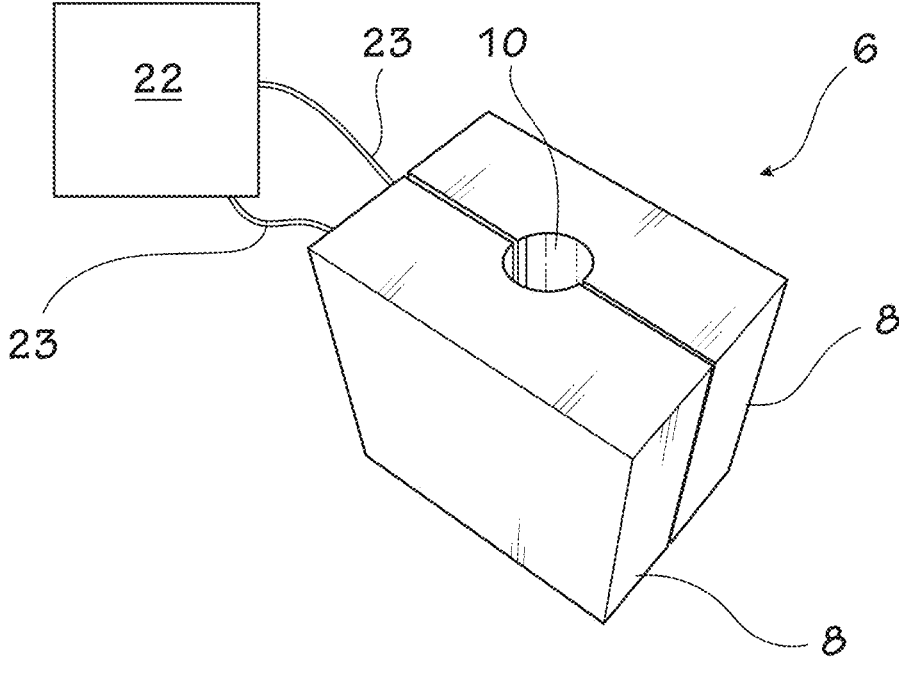
FIG. 1(b) is a photograph of the casing of a sensor according to an aspect of the present disclosure.

The present invention according to some embodiments relates to an MR sensor, indicated generally at 20 in FIG. 1($a$), suitable for use with an NMR measuring device, wherein the sensor includes two disk magnets 2. Varying the distance between the two disk magnets 2, as a function of distance along the symmetry axis, leads to a magnetic field gradient directed along the symmetry axis 4. In one embodiment, the optimal separation and tilt angle for a desired constant gradient of 60 gauss/cm between the two N52 NdFeB K&J Magnetics (Pipersville, PA) disk magnets of 5.1 cm diameter and 1.3 cm thickness was determined via CST Studio Suite (Providence, RI). Referring to FIG. 1($a$), each disk magnet 2 was separated and tilted at an angle of 1° from a starting separation of 1.4 cm between the magnets 2 to generate a constant magnetic field gradient directed along the x axis 4 in the central region of the two magnets 2. A design gradient of 60 gauss/cm with this geometry was judged to be near ideal for the flow measurements envisaged. FIG. 1($a$) depicts two disk magnets 2, each rotated by 10 about the y axis.

Referring to FIG. 1($b$), a 6×6×4 cm casing indicated generally at 6 fabricated from Garolite G-10 (McMaster Carr, Elmhurst, IL) was machined to house the magnets. The casing 6 was divided into two separate pieces 8, where each piece had slots (not shown) into which the magnets 2 could be placed. Each slot was machined to permit the 1° tilt relative to the symmetry axis. The casing 6 included a 1 cm diameter cylindrical passageway 10 through the casing 6, along the direction of the imposed gradient (see the x axis in FIG. 1($a$)), to permit the placement of a glass tubing conduit to support the flow. A 4-turn solenoidal RF coil was loosely formed around a glass pipe, 0.67 cm inner diameter, and was capacitively matched to 50 O. The RF coil, fabricated from 0.8 mm diameter copper wire, was centered in the Proteus magnet. The interior and exterior of the sensor (also referred to in this specification as the "Proteus magnet") was wrapped with 0.2 mm copper tape to limit external RF interference and suppress acoustic ringing. FIG. 1($b$) shows the picture of the Proteus magnet according to one embodiment of the present invention.

Magnetic field plots of the sensitive spot in the Proteus magnet were acquired with a LakeShore 460 3-Channel Gaussmeter (Westerville, OH) connected to a BiSlide Positioning System and VXM Stepping Motor Controller (Velmex Inc., Bloomfield, NY). Magnetic field data was read and processed through a custom MATLAB script (Mathworks, Natick, MA).

Figure 2A:
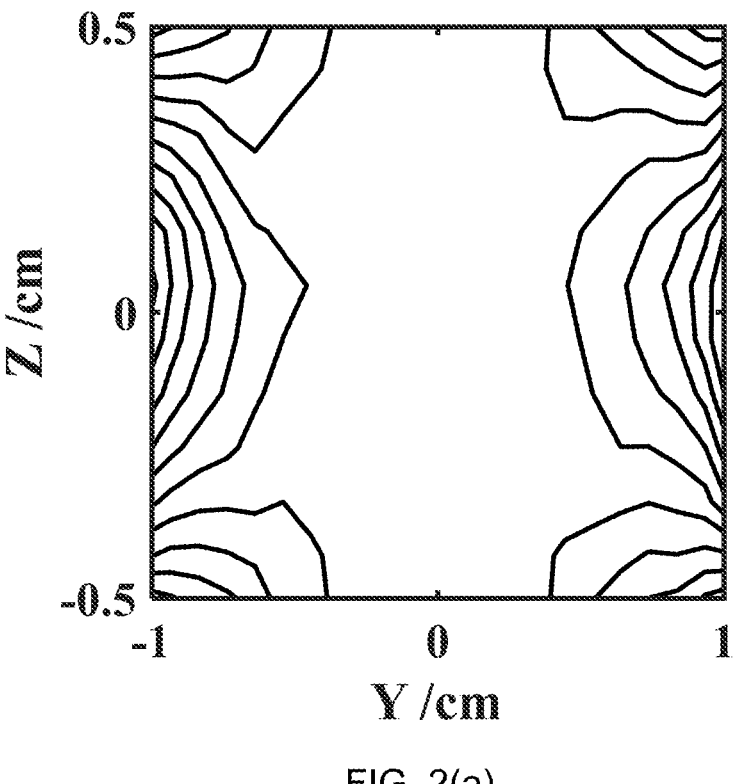
FIG. 2(a) is a plot of simulated 2D magnetic field magnitudes of the tilted Proteus magnet sensor of FIG. 1(a) in the central 2D Y-Z axis plane.
Figure 2B:
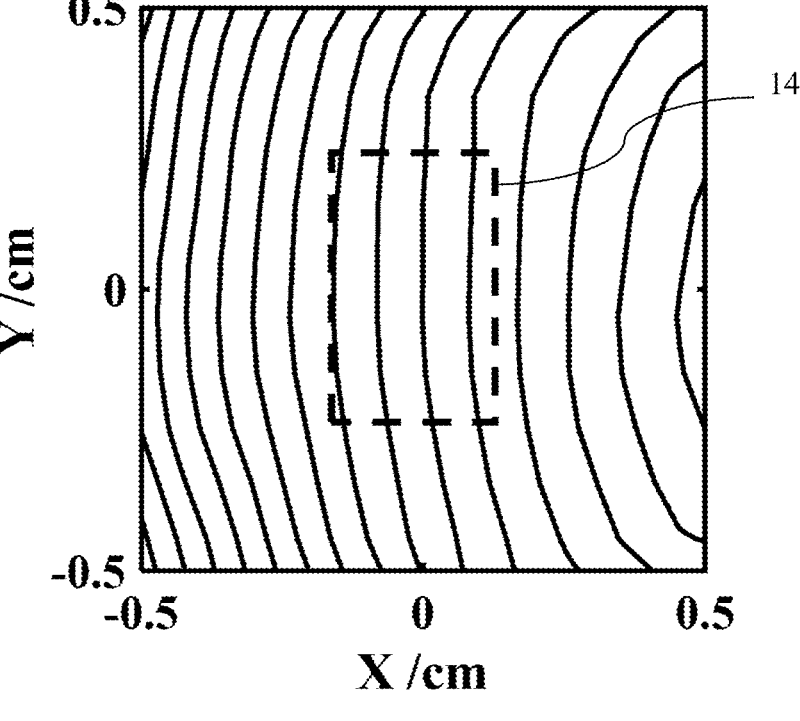
FIG. 2(b) is a plot of simulated 2D magnetic field magnitudes of the tilted Proteus magnet sensor of FIG. 1(a) in the central 2D X-Y axis plane.
Figure 2C:
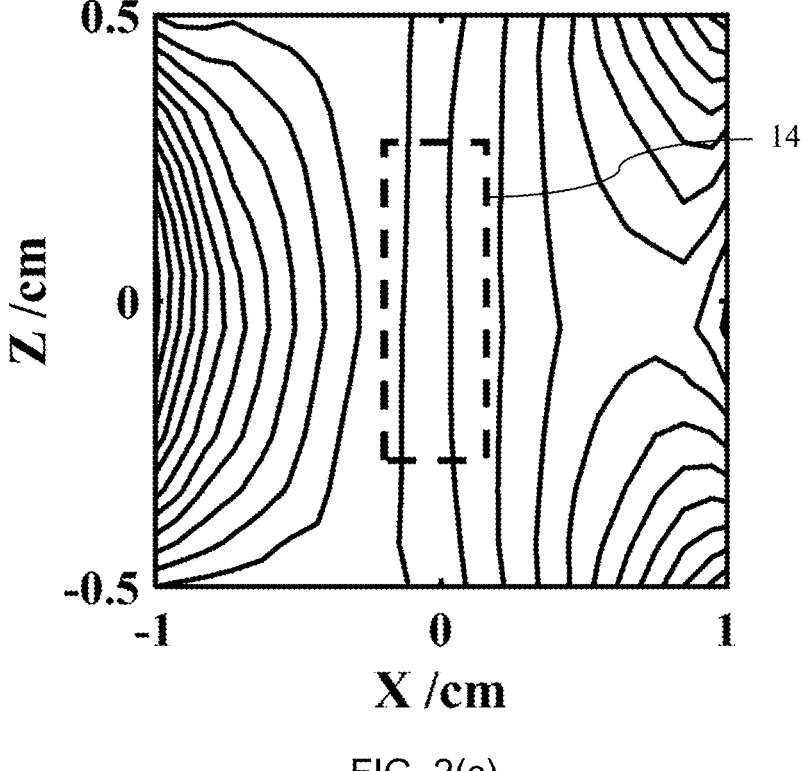
FIG. 2(c) is a plot of simulated 2D magnetic field magnitudes of the tilted Proteus magnet of FIG. 1(a) in the central 2D X-Z axis plane.
Figure 3A:
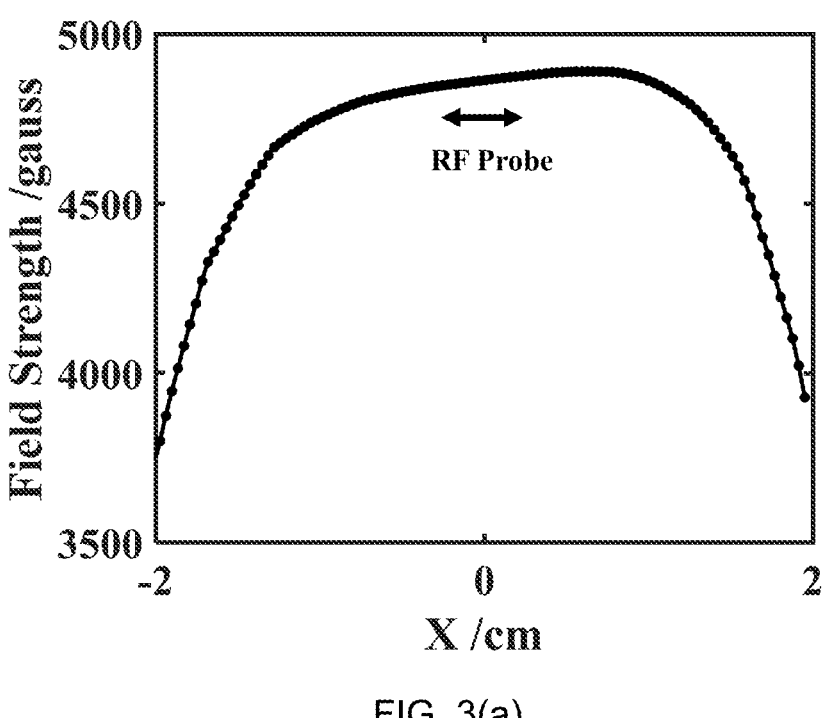
FIG. 3(a) is a graph of 1D field magnitude along the central line of the X-Z transverse plane, obtained from FIG. 2(c)

FIGS. 2(a), 2(b) and 2(c) depict the simulated two-dimensional (2D) magnetic field magnitudes of the tilted Proteus magnet in the Y-Z, X-Y, and X-Z planes. The magnetic field has contributions from Bx, By, and Bz, but in all cases Bz dominates. The disk magnets 2 were axially separated by 1.4 cm, with each symmetrically rotated an angle of 1° to generate a design gradient of 60 gauss/cm. The proposed gradient strength was selected on the basis of ability to observe flow rates within an average velocity range of 1-5 cm/s with echo times below 1 ms. FIG. 3(a) is the 1D profile of the magnetic magnitude field along the central axis of the X-Z plane, taken from FIG. 2(c). The 60 gauss/cm gradient Gx is observed ±1.5 cm about the origin in FIG. 3(a). Simulation shows, in the region of the RF CPMG, that gradient Gx is uniform to within 3 gauss/cm when displaced 3.45 mm off the central axis in the X-Y plane and within 2 gauss/cm in the X-Z plane. In order to ensure that the phase-shift measured would be observed in a region of constant gradient, an RF coil (shown as block 12 in FIG. 1(a)) with a length of 0.32 cm and inner diameter of 0.67 cm, 110 mm3 measurement volume 14 (also known as a sample volume), was employed and placed in the centre most region. It is to be understood that other suitable magnet sizes, tilt angles, magnet separation, and design gradient can be used depending upon the particular MR measurement experiment to be carried out.

An RF coil 12 with a length of 0.32 cm and inner diameter of 0.67 cm is placed in the desired measurement volume 14 and shown in stippled lines in FIG. 2(b) and FIG. 2(c). Referring to FIG. 2(a), the field plot in the Y-Z plane is largely uniform within the measurement volume of interest. The field contour interval is 7 gauss. FIG. 2(b) and FIG. 2(c) illustrate the constant gradient within the central region of the magnet that extends ~1.5 cm in X, ~0.7 cm in Y and ~1 cm along Z. Field contour intervals are 6 and 12 gauss, respectively.

Figure 3B:
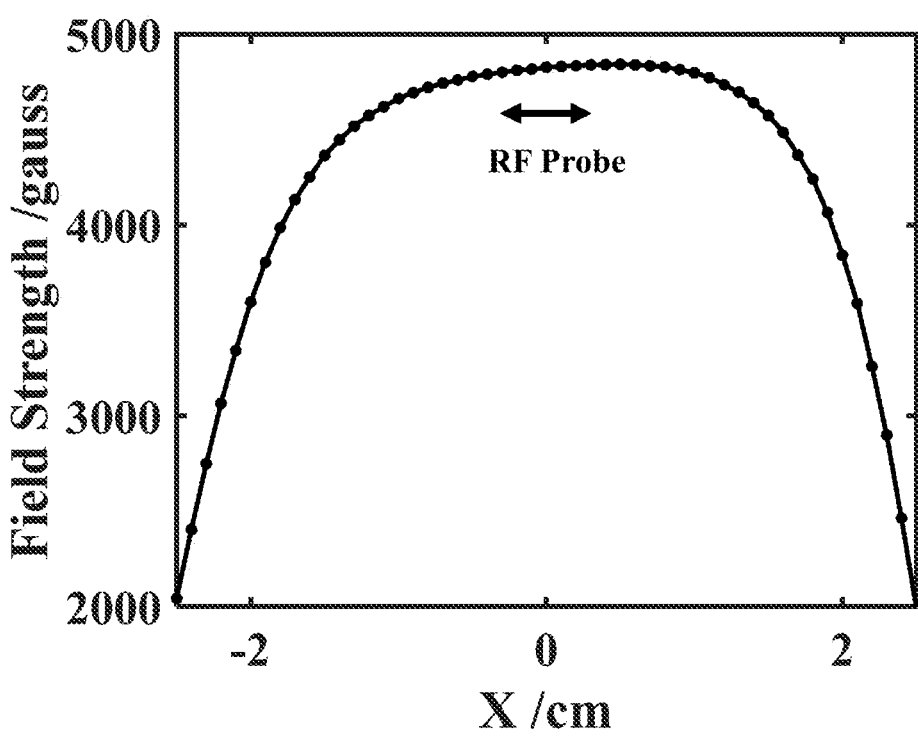
FIG. 3(b) is a graph of 1D field magnitude measured along X with Y=0, Z=0 of the 1° tilted Proteus magnet.

FIG. 3(a) shows 1D field magnitude along the central line of the X-Z transverse plane, obtained from FIG. 2(c). FIG. 3(b) is an experimental field plot of 1D magnetic field magnitude along the X central axis, Y=0, Z=0. As before, the magnetic field has contributions from Bx, By, and Bz. The finite size of the field sensor permitted only one axis measurement. From simulation, the region of constant gradient, on axis, was ±1.5 cm about the origin. The experimental field plot showed the region of constant gradient was reduced to 6 mm compared to simulation. The experimental field plot yields a Gx value, near the origin, of 64 gauss/cm. The discrepancies in spatial extent and Gx value from simulation are likely due to non-ideal disk magnets as well as imperfections in the built shell, which houses the magnets. The RF probe was centered about the magnet origin. The Proteus magnet was tuned to a 1H frequency of 20.48 MHz. Average velocity measurements of known water flow were performed to confirm the Gx gradient amplitude of 65 gauss/cm.

The field strength and region of the desired constant gradient are determined coarsely compared to the simulated results, but are, nevertheless, similar. The RF coil of length 0.32 cm and inner diameter of 0.67 cm, 110 mm3 measurement volume, was placed about the central region of the Proteus magnet. Discrepancies observed in the experimental compared to the simulated field are likely indicative of imperfections in the disk magnets or in the geometry of the custom shell housing.

The RF probe was attached to a TecMag (Houston, TX) transcoupler with a λ/4 cable via BNC connectors. The transcoupler was joined to a Tomco Technologies (Stepney, Australia) 250 W RF amplifier and a L3 Nard-MITEQ (Hauppauge, NY) 0.7-200 MHz preamplifier with a Mini-Circuits (Toronto, Ontario) 30 MHz low-band-pass filter.

Flow Network

A flow network identical to the setup previously employed in [38] for time-of-flight flow experiments was used to test a Proteus magnet sensor according to an embodiment of the present invention. In this configuration, a gravity-fed flow from a reservoir suspended several feet above the Proteus magnet sensor was refreshed via a pump from another reservoir at floor level to establish a constant flow through the Proteus magnet sensor. To ensure a constant fluid level in the upper reservoir, and therefore a constant pressure head driving the flow, a submersible pump (Hidom Electric, Shenzhen, China) provided more inflow to the upper reservoir than was flowing through the magnet. An overflow was installed in the upper reservoir to return excess water to the lower reservoir. A Masterflex Variable-Area Flowmeter (Cole-Parmer model #RK-32460-34, Montreal, Canada) was used to control the average flow rate. Flexible Fisherbrand clear PVC (Fisher Scientific Company, Ottawa, Canada) with an inner diameter of 0.8 cm was incorporated throughout the construction of the flow network except for the portion running through the magnet, where a 70-cm length of glass tubing with an ID of 0.67 cm was utilized.

Basic Fluid Dynamics

When a power-law fluid flows in a circular pipe under laminar conditions, the shear stress is proportional to the shear rate raise to the power ω, where ω is the flow behaviour index. Assuming the flow direction in x, the constitutive equation can be expressed as [43]

$$\sigma_{xr} = k \dot{\gamma}^\omega \qquad (1)$$

where $\sigma_{xr}$ is the shear stress on the radial position r, k is the fluid consistency coefficient, $\dot{\gamma}$ is the stress rate and it can be expressed as $$\dot{\gamma} = -\frac{dv(r)}{dr} \qquad (2)$$

where v(r) is the flow velocity on the radial position r.

The axial momentum of the fluid in a pipe can be written as $$0 = -\frac{dp}{dz} + \frac{1}{r}\frac{\partial(r\sigma_{xr})}{\partial r}, \qquad (3)$$

where $$\frac{dp}{dz} = \frac{\Delta p}{L}$$

is the pressure gradient along the pipe. Integrating Eq. (3) with respect to r, we can obtain $$\sigma_{xr} = \frac{r\Delta p}{2L}. \qquad (4)$$

Substituting Eqs. (2) and (4) into Eq. (1), we can obtain $$\frac{r\Delta p}{2L} = -k\left(\frac{dv(r)}{dr}\right)^{\omega}. \tag{5}$$

Integrating Eq. (5) with respect to r, we can obtain the flow velocity profile in a pipe $$v(r) = \left(\frac{\Delta pR}{2kL}\right)^{\frac{1}{\omega}} \frac{\omega R}{\omega+1}\left(1 - \left(\frac{r}{R}\right)^{\frac{1}{\omega}+1}\right). \tag{6}$$

The volume flux Q of the pipe flow can be expressed as $$Q = \int_0^R 2\pi r v(r)dr = \frac{\pi\omega R^3}{1+3\omega}\left(\frac{\Delta pR}{2kL}\right)^{\frac{1}{\omega}} = v_{wg}\pi R^2. \tag{7}$$

Eq. (7) shows $$v_{avg} = \frac{\omega R}{1+3\omega}\left(\frac{\Delta pR}{2kL}\right)^{\frac{1}{\omega}}. $$

Substituting $v_{avg}$ into Eq. (6), we obtain $$v(r) = \frac{3\omega+1}{\omega+1}v_{avg}\left(1 - \left(\frac{r}{R}\right)^{\frac{1}{\omega}+1}\right). \tag{8}$$

For computational convenience, we define $$m = \frac{1}{\omega} + 1,$$

and then Eq. (8) can be simplified as $$v(r) = \frac{m+2}{m}v_{avg}\left(1 - \left(\frac{r}{R}\right)^m\right). \tag{9}$$

Eq. (9) shows the maximum flow velocity $v_{max}$ at centre of the pipe, under laminar conditions, is related to $v_{avg}$, described as $$v_{max} = \frac{m+2}{m}v_{avg}. \tag{10}$$

Different fluids exhibit different m for pipe flow. For m<2.0 ($\omega$>1), the fluid exhibits shear-thickening behaviour. For m=2.0 ($\omega$=1), the fluid shows Newtonian behaviour. For m>2.0 ($\omega$<1), the fluid shows shear-thinning behaviour. We plot three typical 1D velocity profiles (m=1.5, 2.0, and 5.0) of laminar flow at the same vavg=5 cm/s, in FIG. 4. The velocity profile shape depends on m, and the larger the m, the lower the maximum flow velocity at the same vavg. With increasing m, the velocity decay gradually slows in the middle of the pipe. Therefore, m and vavg are the two necessary parameters for determining the flow velocity profile.

Figure 4:
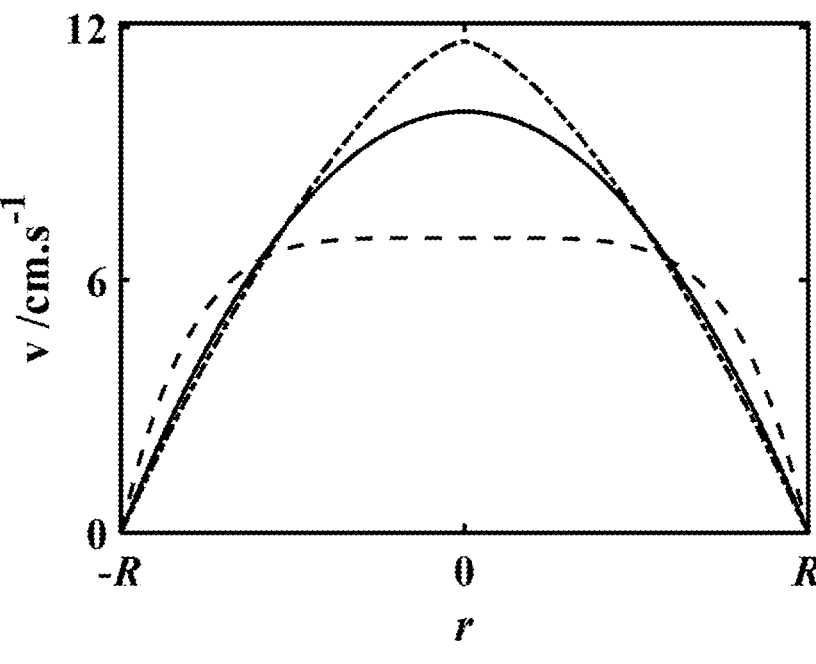
FIG. 4 is a graph of three typical 1D velocity profiles of laminar flows at the same vavg=5 cm/s with m=1.5, 2.0, and 5.0.

FIG. 4 is a graph of three typical 1D velocity profiles of laminar flows at the same vavg=5 cm/s with m=1.5 (-), 2.0 (-), and 5.0 (- - -). The velocity profile shape varies from m, and the larger m, the lower maximum flow velocity. The velocity decay gradually slows in the middle of pipe as m increases.

Flow Parameter Determination from CPMG Measurement
Phase-Based Method

The CPMG MR method is composed of a 90x° pulse followed by a series of 180y° pulses with 2τ time spacing. This measurement can be described as $$90_x^0 - [\tau - 180_y^0 - \tau - echo]_n. \tag{11}$$

Each 180y° pulse refocuses the magnetization to generate an echo at the time t=2nτ, where n denotes the nth spin echo during the CPMG measurement.

When the CPMG measurement is performed for fluid flow with a constant magnetic field gradient (G) in the direction of flow, a phase shift for all odd echoes will occur.

For a constant velocity vc, the net phase accumulation $\phi_c$ of odd echoes can be expressed as [11, 44]

$$\phi_c = \gamma G v_c \tau^2, \tag{12}$$

where $\gamma$ is the gyromagnetic ratio. A detailed derivation is given in the Appendix A section of this specification.

For a steady flow, with a distribution of flow velocities, the net phase accumulation $\phi_{odd}$ of odd echoes can be expressed as $$\phi_{odd} = \frac{1}{J}\gamma G\tau^2\left(\sum_{j=1}^J v_j\right) = \gamma G\tau^2\left(\frac{1}{J}\sum_{j=1}^J v_j\right) = \gamma G v_{avg}\tau^2, \tag{13}$$

where $v_{avg}$ is the average velocity. For a general laminar flow in a pipe, we can also calculate the net phase accumulation $\phi_{odd}$ of odd echoes by integration $$\phi_{odd} = \frac{\int\int\phi r dr d\theta}{\int\int r dr d\theta} = \frac{\int_0^R \phi r dr}{\int_0^R r dr} = \frac{\int_0^R (\gamma G v(r)\tau^2) r dr}{\int_0^R r dr} \tag{14}$$

$$= \gamma G\tau^2\frac{\int_0^R \left(v_{max}\left(1 - \frac{r^m}{R^m}\right)\right) r dr}{\int_0^R r dr} = \frac{m}{m+2}v_{max}\gamma G\tau^2$$

$$= \gamma G v_{avg}\tau^2,$$

where R is the pipe radius.

It can be seen from Eqs. (13)-(14) that the $\phi_{odd}$ depends on G, vavg and τ, and therefore vavg can be determined from $v_{avg} = \phi_{odd}/\gamma G\tau^2$. The vavg, determined from net phase accumulation of an echo, suffers from the signal-to-noise ratio (SNR) of the echo measured. In another embodiment, to obtain vavg more reliably, multiple odd echo phase accumulations at different T were employed. The odd echo net phase accumulations at different τ2 were fitted by Eq. (13), and the slope k can be used to determine $v_{avg} = k/\gamma G$. This method means that many times of measurements of the traditional CMPG are needed. Theoretically, just one measurement is needed to meet the requirement of the processing method using the varied echo time CPMG scheme. The measurement can be described as $$90_x^0 - \left[\tau_n - 180_y^0 - \tau_n - \text{echo} - \tau_n - 180_y^0 - \tau_n - \text{echo}\right]_n, \tag{15}$$

where $\tau_n$ would be incremented after every even echo. For a steady flow, the net phase accumulation $\phi_{odd}$ of odd echoes in this measurement can be expressed as $$\phi_{odd} = \gamma G v_{avg} \tau_n^2. \tag{16}$$

A detailed derivation is given in the Appendix A section of this specification. It can be seen from Eq. (16) that the $\phi_{odd}$ depends on G, vavg and $\tau_n$. One measurement of the varied echo time CPMG scheme provides the $\phi_{odd}$ at the different $$\tau_n^2,$$

which can be employed to determine the vavg by fitting.

Magnitude-Based Method

Under laminar flow conditions, the flow velocity profile is a distribution of velocities, which results in a distribution of accumulated phases at the odd echoes, leading to a change in signal magnitude. Employing odd echo magnitudes is therefore a workable strategy to determine some flow parameters. Assuming complete polarization, the odd echo magnitude $M_{odd}$ detected with a flow-directed gradient can be expressed as $$M_{odd} = M_0 M_R M_\phi, \tag{17}$$

where M0 is the equilibrium magnetization value, which depends on the detected fluid type and quantity. $M_R$ is the normalized magnitude caused by the decay of T2 relaxation, which depends on the detected fluid relaxation property. $M_\phi$ is the normalized magnitude resulting from the phase accumulation, related to the velocity distribution. M0 and $M_R$ are independent of the flow, and thus $M_\phi$ can be obtained from dividing the acquired magnitude for stationary solution by the acquired magnitude with flow with the same acquisition parameters.

The normalized signal $S_\phi$ of all odd echoes due to the phase accumulation is the same, which can be expressed as $$S_\phi = \frac{\iint \exp(-i\phi_{odd}) r \, dr \, d\theta}{\iint ds} = \frac{\int \cos(\phi_{odd}) r \, dr}{\int r \, dr} - i\frac{\int \sin(\phi_{odd}) r \, dr}{\int r \, dr}, \tag{18}$$

where i is the imaginary unit, and $ds = r \, dr \, d\theta$ is differential of cross-sectional area. From Eq. (18), the normalized real signal $$S_{Re} = \frac{\int \cos(\phi_{odd}) r \, dr}{\int r \, dr}$$

and the normalized imaginary signal $$S_{Im} = -\frac{\int \sin(\phi_{odd}) r \, dr}{\int r \, dr}$$

due to the phase accumulation for all odd echoes. For a circular pipe with a radius of R, they can be modified as $$S_{Re} = \frac{\int_0^R \cos(\phi_{odd}) r \, dr}{\int_0^R r \, dr} = \frac{\int_0^R \cos\left(X\left(1 - \frac{r^m}{R^m}\right)\right) r \, dr}{\int_0^R r \, dr} \tag{19}$$

$$= \frac{e^{Xi}(-i)^{-\frac{2}{m}}\left(\Gamma\left(\frac{2}{m}\right) - \Gamma\left(\frac{2}{m}, Xi\right)\right) + e^{-Xi} i^{-\frac{2}{m}}\left(\Gamma\left(\frac{2}{m}\right) - \Gamma\left(\frac{2}{m}, -Xi\right)\right)}{mX^{\frac{2}{m}}},$$

and $$S_{Im} = \frac{\int_0^R \sin(\phi_{odd}) r \, dr}{\int_0^R r \, dr} = -\frac{\int_0^R \sin\left(X\left(1 - \frac{r^m}{R^m}\right)\right) r \, dr}{\int_0^R r \, dr} \tag{20}$$

$$= i\frac{e^{Xi}(-i)^{-\frac{2}{m}}\left(\Gamma\left(\frac{2}{m}\right) - \Gamma\left(\frac{2}{m}, Xi\right)\right) + e^{-Xi} i^{-\frac{2}{m}}\left(\Gamma\left(\frac{2}{m}\right) - \Gamma\left(\frac{2}{m}, -Xi\right)\right)}{mX^{\frac{2}{m}}},$$

where $X = \frac{m+2}{m}\gamma G v_{avg} \tau^2$ and $\Gamma(a, x) = \int_x^\infty w^{a-1} e^{-w} dw$.

The normalized magnitude $M_\phi$ of odd echoes due to the phase accumulation can be calculated from $$M_\phi = \sqrt{(S_{Re})^2 + (S_{Im})^2} = \tag{21}$$

$$\frac{2}{mX^{\frac{2}{m}}}\sqrt{\left(\Gamma\left(\frac{2}{m}\right) - \Gamma\left(\frac{2}{m}, -Xi\right)\right)\left(\Gamma\left(\frac{2}{m}\right) - \Gamma\left(\frac{2}{m}, -Xi\right)\right)}.$$

It can be seen from Eq. (21) that $M_\phi$ is not only related to instrument and acquisition parameters, G and T, but also to laminar flow parameters, m and vavg. Based on Eqs. (14) and (21), we present some schemes for determining the laminar flow parameters, as follow:

Scheme 1: We just use one odd echo to calculate laminar flow parameters. The vavg is determined from the echo net phase accumulation using Eq. (14), and then m is solved by Eq. (21) with the calculated vavg. This scheme, only involving one odd echo data may suffer from noise, and thus the results may have a poor reliability for realistic flow measurements.

Scheme 2: Based on the magnitude data of odd echoes at different $\tau$, the vavg and m are directly fitted by Eq. (21). Due to the complexity of Eq. (21), insufficient data detected might affect the fitting accuracy for this scheme.

Scheme 3: Based on the net phase accumulation of odd echoes at different $\tau$, the vavg is fitted by Eq. (14). Subsequently, the m is fitted by Eq. (21) based on the magnitude data of odd echoes and the fitted vavg.

Schemes 1-3 all employ odd echo signals detected with CPMG measurement with a flow-directed constant G, to solve for the laminar flow parameters, m and vavg. In another embodiment, it would be feasible to use vavg determined from a known volumetric flow rate and pipe diameter as an alternative to the vavg determined by the net phase accumulation of odd echoes in Schemes 1 and 3.

Velocity Spectrum Method

The complex signal S(q) of all odd echoes in a CPMG measurement after removing diffusion effect can be expressed as [16, 45]

$$S(q) = \int_{-\infty}^{+\infty} p(v)\exp(-iqv)dv, \tag{22}$$

where $q=\gamma G\tau^2$, and p(v) is the velocity spectrum. Eq. (22) shows that S(q) is the Fourier transform of p(v) with respect to v. p(v) can therefore be determined by the inverse Fourier transform of S(q) with respect to q, described as $$p(v) = \int_{-\infty}^{+\infty} S(q)\exp(-iqv)dq. \tag{23}$$

For an acquisition system with a constant magnetic field gradient, one can only change T during the measurement. Note that this method does not involve the use of phase-, frequency-, and motion-encoding magnetic resonance gradients. When the magnetic field gradient is parallel to the flow direction, q is a positive number, and thus Eq. (23) can be modified as $$p(v) = \int_{0}^{+\infty} S(q)\exp(-iqv)dq. \tag{24}$$

To meet the uniform sample of q, τ2 is increased with a constant step size. The Field of Flow (FOF) is determined by $2\pi/\Delta q$, where $\Delta q=\gamma G\Delta(\tau^2)$ is the step size of q. Since FOF should be no less than the maximum velocity of flow, a short step size of τ2 is required. To obtain a velocity spectrum with an adequate resolution, a large step size of τ2 is recommended. To have a combined consideration, a compromise step size of τ2 should be recommended for each measurement. When the velocities are more than the maximum velocity of flow, their amplitudes should be zero in the velocity spectrum. One can therefore determine the maximum velocity based on the break point in the velocity spectrum. Combined with the average velocity from the net phase accumulation of odd echoes or volumetric flow rate and pipe diameter, m can be solved with a known maximum velocity.

For a Poiseuille flow, one can directly use the velocity spectrum to calculate the flow profile by [15, 16]

$$r^2(v) = R^2\left[1 - \int_{v_{min}}^{v} p(v)dv\right], \tag{25}$$

where r(v) is the radial position associated with a flow velocity, and vmin is the minimum velocity at r=R.

Numerical Simulations and Analyses

To assess methods according to some embodiments of the present invention for determining the flow parameters in circular pipe, a few numerical simulation tests were performed. Owing to the use of the normalized data during the whole simulations, we can replace the simulations on the whole circular pipe from those on a circular cross-section. The cross-section was discretized using a 500×500 grid, and a diagram of discretized cross-section via a 10×10 grid was shown in FIG. 5. We note larger grid (>5002) did not show appreciable changes for the normalized signal simulated. The intersections on the grid in the circular cross-section were considered during the simulations. The velocity of each intersection can be calculated based on the flow velocity profile (Eq. 9). The normalized real and imaginary signal due to a phase accumulation, for odd echoes during CPMG measurement, can be written by discrete form $$S_{Re} = \frac{1}{N}\sum_{i=1}^{N}\cos(\gamma Gv_i\tau^2), \tag{26}$$

and $$S_{Im} = -\frac{1}{N}\sum_{i=1}^{N}\sin(\gamma Gv_i\tau^2), \tag{27}$$

where N is the number of intersections in the circular cross-section, and $v_i$ is the velocity at the ith intersection. Therefore, the net phase accumulation $\phi_{odd}$ of odd echoes can be calculated by $$\phi_{odd} = \arctan\left(-\frac{S_{Im}}{S_{Re}}\right) = \arctan\left[\frac{\sum_{i=1}^{N}\sin(\gamma Gv_i\tau^2)}{\sum_{i=1}^{N}\cos(\gamma Gv_i\tau^2)}\right]. \tag{28}$$

The normalized magnitude $M_\phi$ of odd echoes due to the phase accumulation can be determined from $$M_\phi = \sqrt{(S_{Re})^2 + (S_{Im})^2} = \frac{1}{N}\sqrt{\left[\sum_{i=1}^{N}\cos(\gamma Gv_i\tau^2)\right]^2 + \left[\sum_{i=1}^{N}\sin(\gamma Gv_i\tau^2)\right]^2}. \tag{29}$$

The radius of the cross-section was set to 1 cm and the magnetic field gradient was set to 65 gauss/cm during the simulations. To match the experimental data, Gaussian noises with a SNR of 50 were added to the real and imaginary signal. We verified the effectiveness of the three type methods in Section 2.3 to determine the laminar flow parameters via processing the simulated data, as follow.

Figure 5:
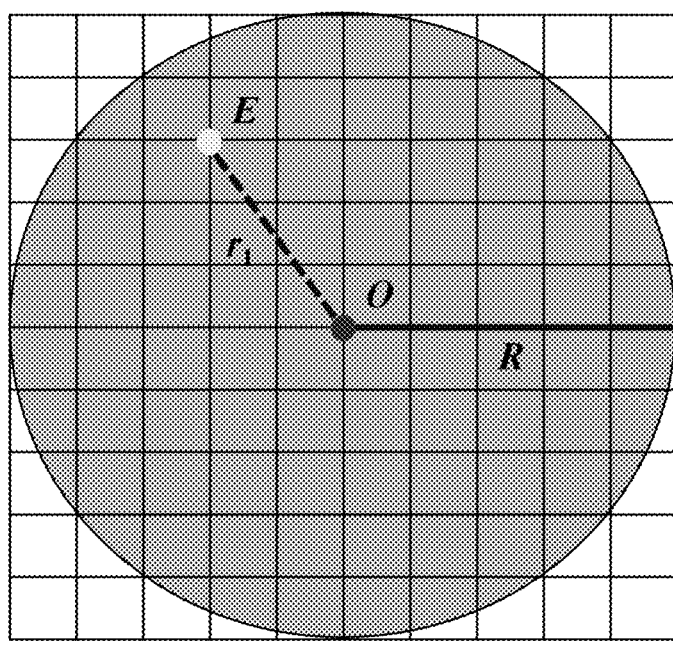
FIG. 5 is a diagram of discretized cross-section via a 10×10 grid.

FIG. 5 is a diagram of discretized cross-section via a 10×10 grid. It was assumed all fluids were positioned on the intersections of the grid in the circular cross-section, and there is nothing inside a single grid. The flow velocity can be calculated on each intersection, for example, $$v_E = \frac{m+2}{m}v_{avg}\left(1 - \frac{r_1^m}{R^m}\right)$$

at the intersection E, where r1 is the distance of the intersection E from the centre O.

Phase-Based Method Verification

The normalized real and imaginary signals of odd echoes for the three type of laminar flows shown in FIG. 4, at seven different T ranging from 100 to 400 µs with a step size of 50 µs, were calculated based on Eqs. (26)-(27). After adding noise, the net phase accumulations can be determined by Eq. (28). FIGS. 6(a-c) showed the relation of the net phase accumulation $\phi_{odd}$ of odd echoes to $\tau2$ for the laminar flows, where $\phi_{odd}$ were the mean of 10 separate simulations and error bars were determined by their standard deviations. From FIGS. 6(a-c), we can see that the net phase accumulation of odd echoes, at the same vavg, are very close, independent of the flow type.

The simulated data were fitted employing Eq. (13), and the vavg were determined to be 5.01±0.01, 4.94±0.02, and 5.04±0.02 cm/s for Poiseuille flow, shear-thickening flow, and shear-thinning flow, respectively, which are similar to the model vavg=5 cm/s, within 1%. These indicated that the net phase accumulation of odd echoes can be used to determine the average velocity of any type of laminar flow.

Figure 6A:
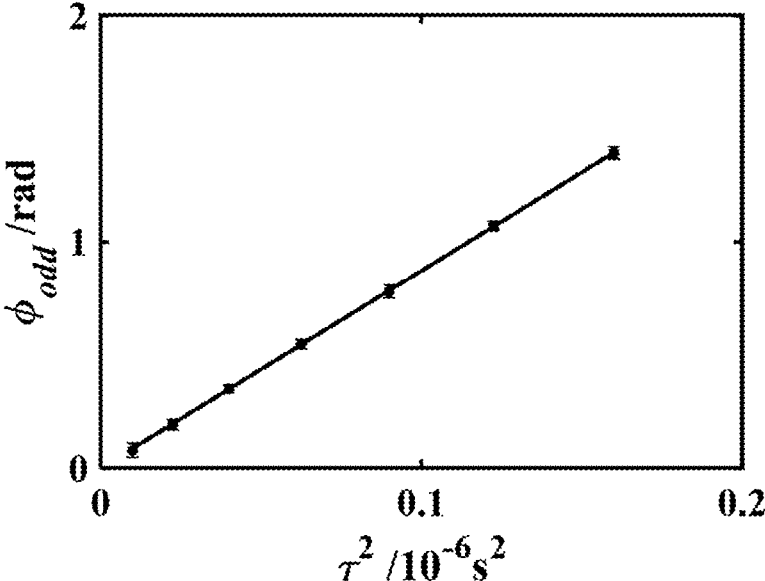
FIG. 6(a) is a graph of fitted results of $\phi_{odd}$ for Poiseuille flow.
Figure 6B:
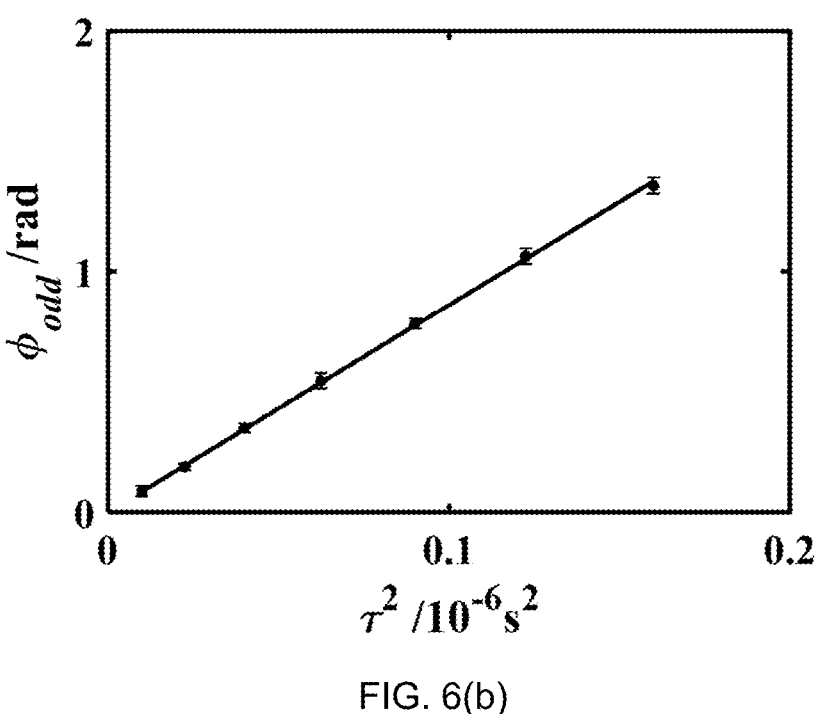
FIG. 6(b) is a graph of fitted results of $\phi_{odd}$ for shear-thickening flow (FIG. 6(a))
Figure 6C:
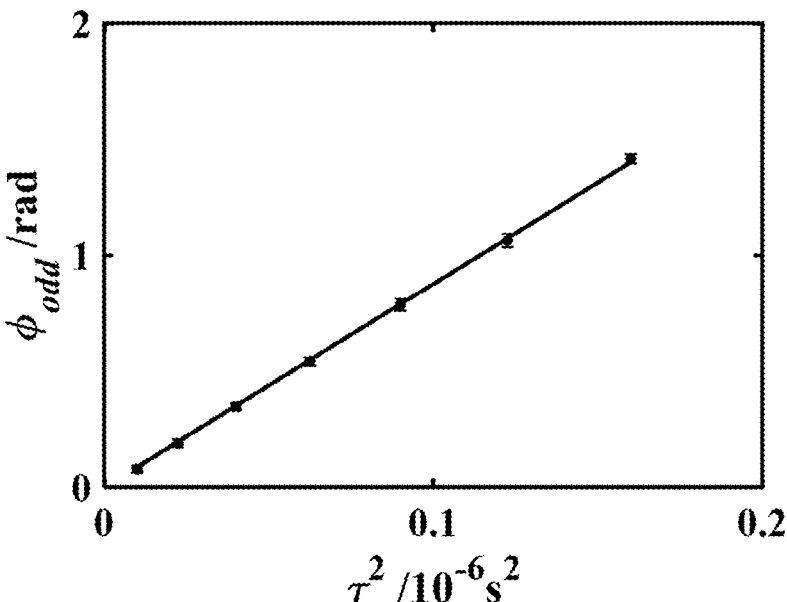
FIG. 6(c) is a graph of fitted results of $\phi_{odd}$ for shear-thinning flow.

FIG. 6(a), FIG. 6(b) and FIG. 6(c) are graphs of fitted results of $\phi_{odd}$ at different $\tau2$: for Poiseuille flow (FIG. 6(a)), shear-thickening flow (FIG. 6(b)), and shear-thinning flow (FIG. 6(c)). The fitted relationships between $\phi_{odd}$ and $\tau2$ were $\phi_{odd}=(5.01\pm0.01)\gamma G\tau^2$ for FIG. 6(a), $\phi_{odd}=(4.94\pm0.02)\gamma G\tau^2$ for FIG. 6(b), and $\phi_{odd}=(5.04\pm0.02)\gamma G\tau^2 f$ FIG. 6(c).

Magnitude-Based Method Verification

To ensure the accuracy of the magnitude-based method, it is desirable to employ more magnitude data of odd echoes. Here the normalized magnitudes $M_\phi$ of odd echoes due to phase accumulation at 19 different T ranging from 100 to 1000 μs with a step size of 50 μs were employed. FIGS. 7(a-c) showed the relation of $M_\phi$ to $\tau2$ for the laminar flows, where $M_\phi$ are the mean of 10 separate simulations and error bars are determined by their standard deviations. The trends of $M_\phi$ significantly differ with the type of laminar flows at the same vavg. The schemes 2 and 3 were both employed to process the simulated magnitude data to obtain the laminar flow parameters. For scheme 3, the fitted vavg from the phase-based method in Section 3.1 was used. The fitted results of the two schemes are shown in FIGS. 7(a-c).

For the Poiseuille flow, m=1.92±0.03 and vavg=4.93±0.06 by the scheme 2, and m=1.98±0.02 by the scheme 3. For the shear-thickening flow, m=1.54±0.03 and vavg=5.05±0.10 by the scheme 2, and m=1.48±0.02 by the scheme 3. For the shear-thinning flow, m=4.99±0.03 and vavg=4.97±0.03 by the scheme 2, and m=5.04±0.03 by the scheme 3. The fitted m and vavg by the scheme 2 agree with the model, within 4% and 1%, similarly, the fitted m by the scheme 3 are close to the model, within 1%, for three type of laminar flows. The fitted results indicated that the schemes 2 and 3 can both be used to determine the laminar flow parameters by processing the normalized magnitude of odd echoes during CPMG measurement with a flow-directed gradient. The error of the fitted m by scheme 3 is slightly lower than those by scheme 2, due to less output parameters of scheme 3, revealing that scheme 3 is a bit superior to scheme 2.

Based on the fitted flow parameters by schemes 2 and 3, the flow velocity profiles were reconstructed and then compared with the model, as shown in FIGS. 8(a-c). From FIGS. 8(a-c), we can see that the reconstructed 1D flow velocity profiles for the three laminar flows are very close to the model. The error plots exhibited that the velocity errors in the pipe are less than 0.2 cm/s, revealing the effectiveness of the magnitude-based method to determine the flow parameters.

Figure 7A:
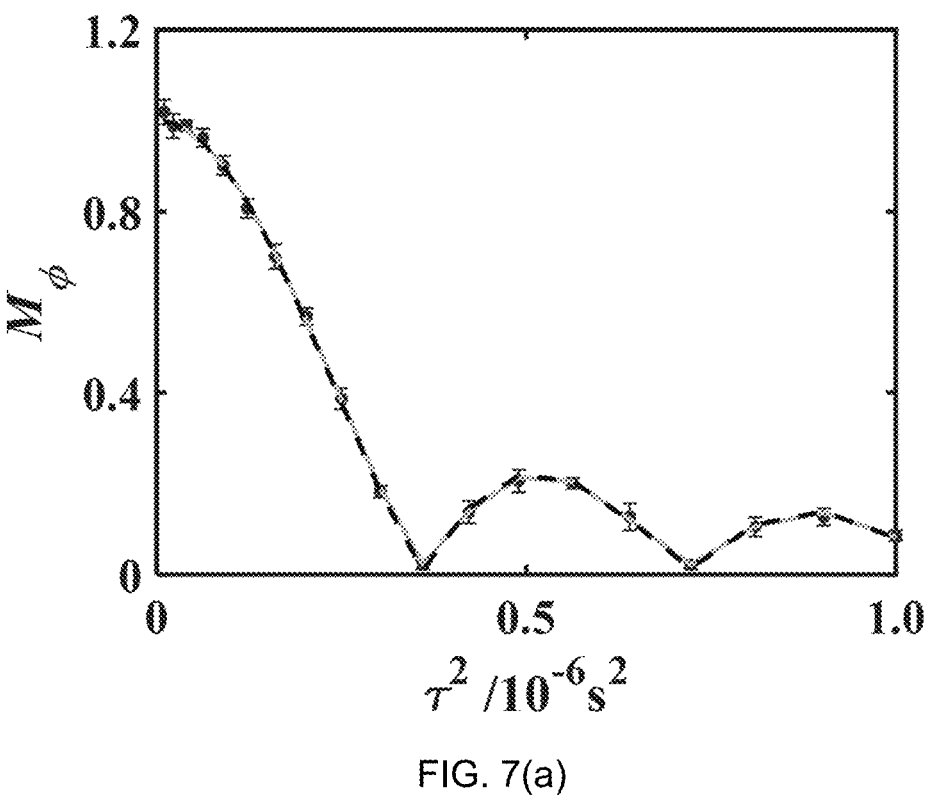
FIG. 7(a) are fitted results of $M_\phi$ using scheme 2 and scheme 3 according to aspects of the present disclosure for Poiseuille flow.
Figure 7B:
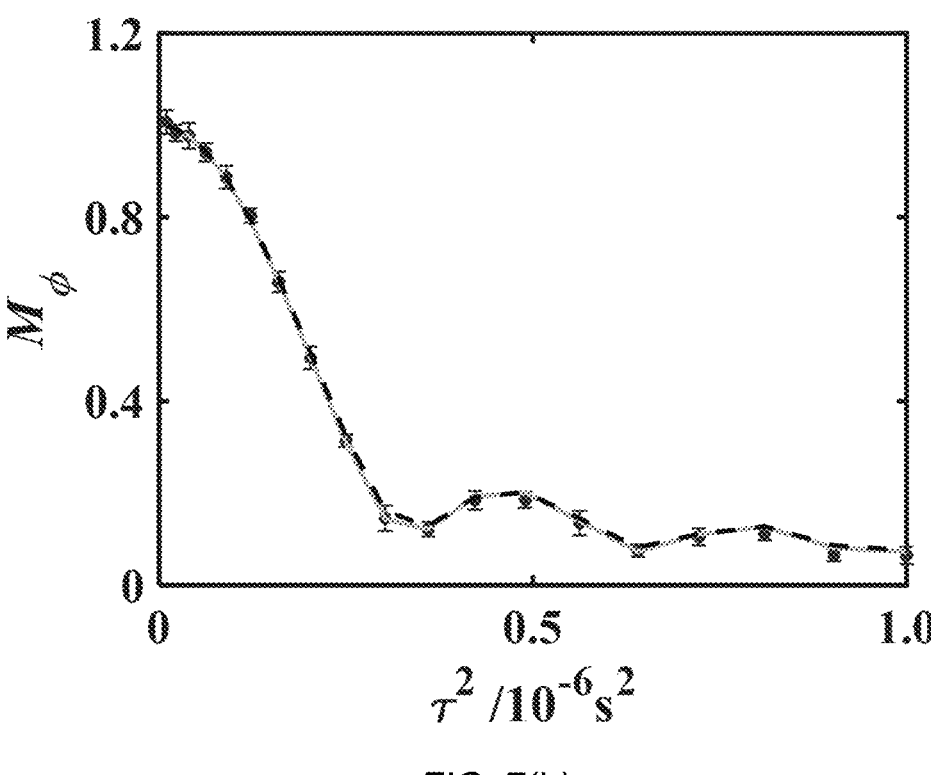
FIG. 7(b) are fitted results of $M_\phi$ using scheme 2 and scheme 3 according to aspects of the present disclosure for shear-thickening flow.
Figure 7C:
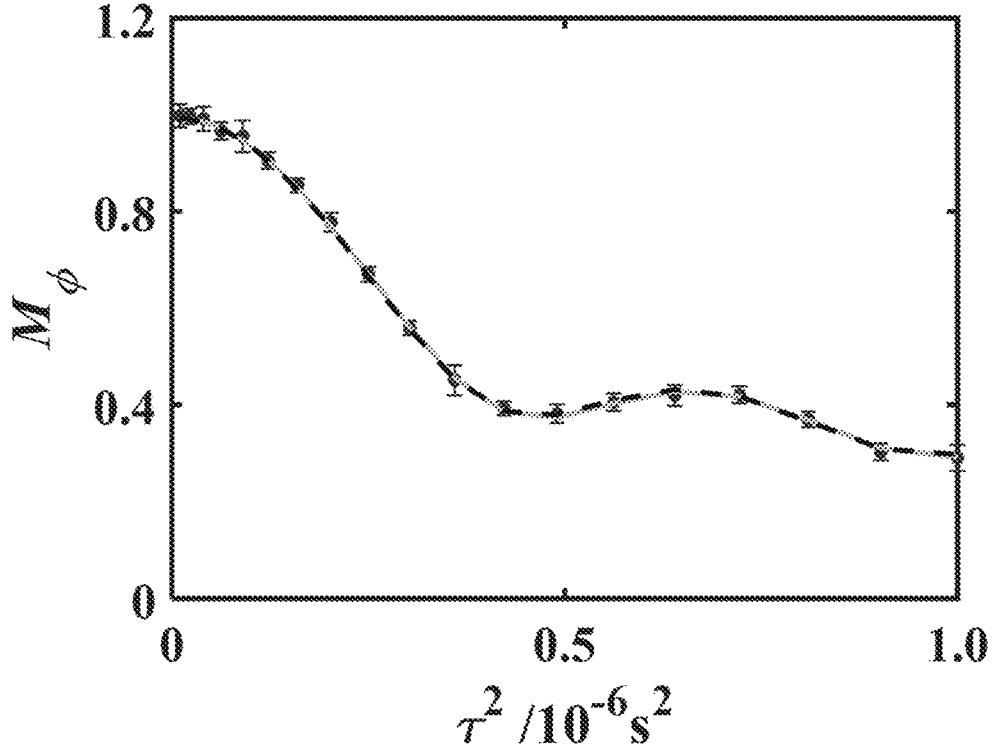
FIG. 7(c) are fitted results of $M_\phi$ using scheme 2 and scheme 3 according to aspects of the present disclosure for shear-thinning flow.

FIG. 7(a), FIG. 7(b) and FIG. 7(c) are fitted results of $M_\phi$ at different $\tau2$ using scheme 2 (-) and scheme 3 (----) for Poiseuille flow (FIG. 7(a)), shear-thickening flow (FIG. 7(b)), and shear-thinning flow (FIG. 7(c)). All the $M_\phi$ for different laminar flows decreases with oscillations as $\tau2$ increases. The trends of $M_\phi$ significantly differ with the type of laminar flows at the same vavg. The fitted curves by schemes 2 and 3 are both in agreement with the simulated data.

Figures 8A, 8B:
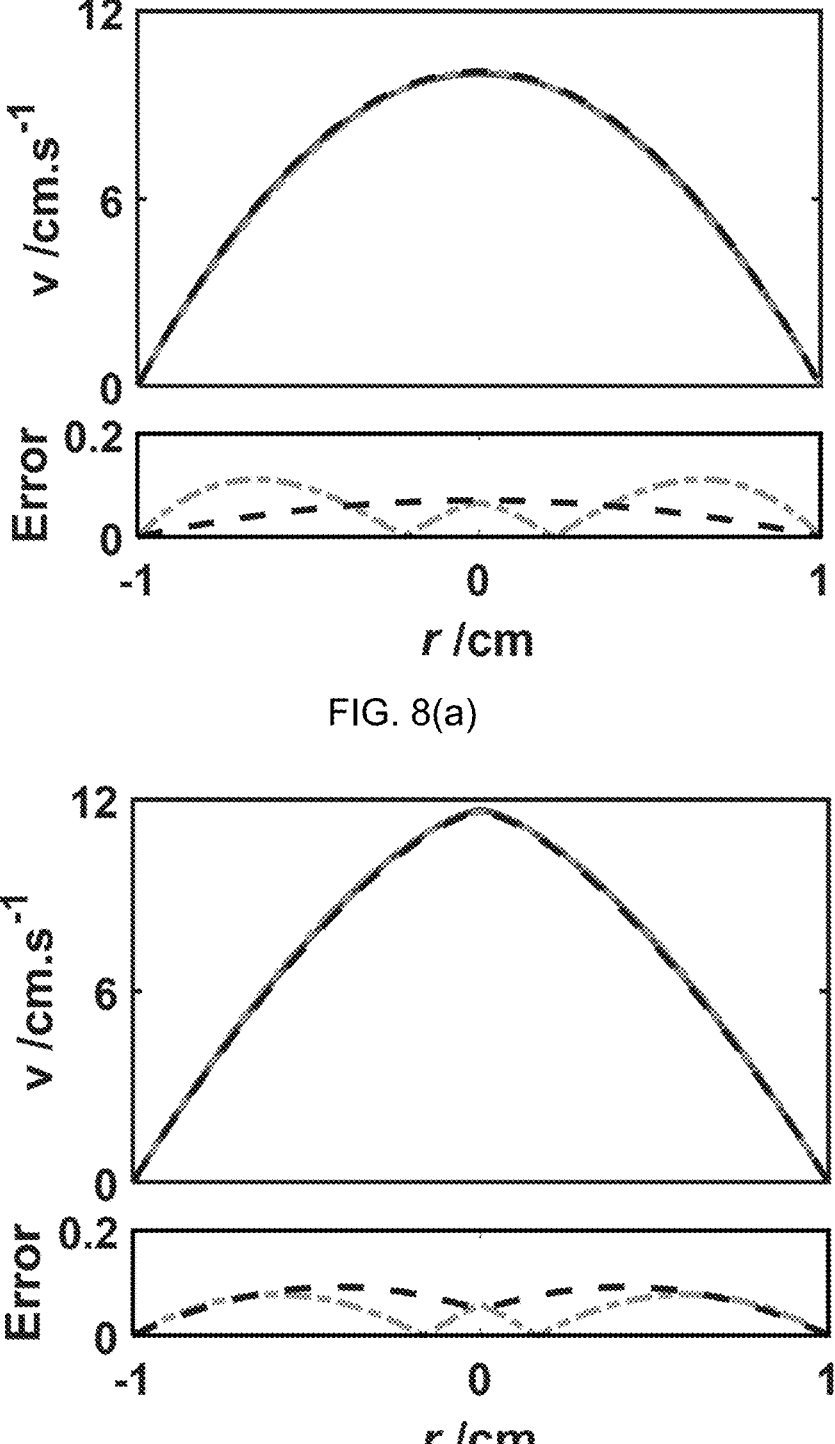
FIG. 8(a) is a comparison of a 1D flow velocity profile model with those reconstructed by scheme 2 and scheme 3 according to aspects of the present disclosure for Poiseuille flow.
FIG. 8(b) is a comparison of a 1D flow velocity profile model with those reconstructed by scheme 2 and scheme 3 according to aspects of the present disclosure for shear-thickening flow.
Figure 8C:
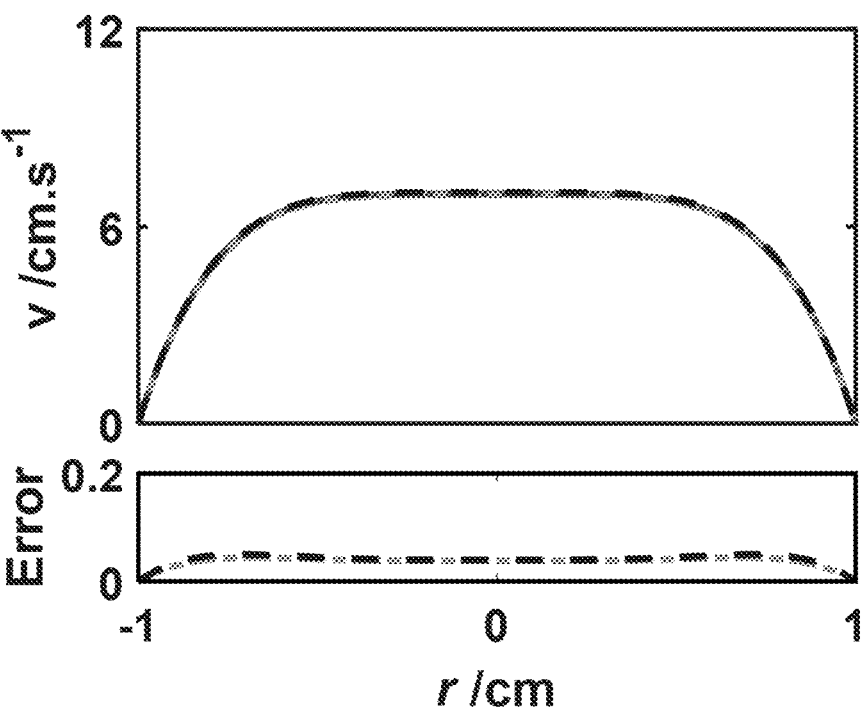
FIG. 8(c) is a comparison of a 1D flow velocity profile model with those reconstructed by scheme 2 and scheme 3 according to aspects of the present disclosure for shear-thinning flow.

FIG. 8(a), FIG. 8(b) and FIG. 8(c) are comparisons of 1D flow velocity profile models (-) with those reconstructed by scheme 2 (----) and scheme 3 (----) for Poiseuille flow (FIG. 8(a)), shear-thickening flow (FIG. 8(b)), and shear-thinning flow (FIG. 8(c)). The bottom subplots represent the absolute error between the reconstructed profile and model, displaying that the velocity errors for any laminar flows in the pipe are less than 0.2 cm/s.

Velocity Spectrum Method Verification

To meet the requirement of the velocity spectrum method, the data must be sampled with a fixed increment of $\tau2$. During the simulations, the normalized signals at 128 different $\tau2$ ranging from 6.25×10-4 to 31.75 ms2 with a step size of 0.25 ms2, for the three flows, were calculated and then added Gaussian noises. The FOF was therefore 14.45 cm/s. Before undertaking Fourier transformation of simulated data, the exponential filtering method [46] was employed to improve the resolution of velocity spectrum. The velocity spectrums for Poiseuille flow, shear-thickening flow, and shear-thinning flow were shown in FIG. 9(a), FIG. 9(b) and FIG. 9(c).

Figure 9A:
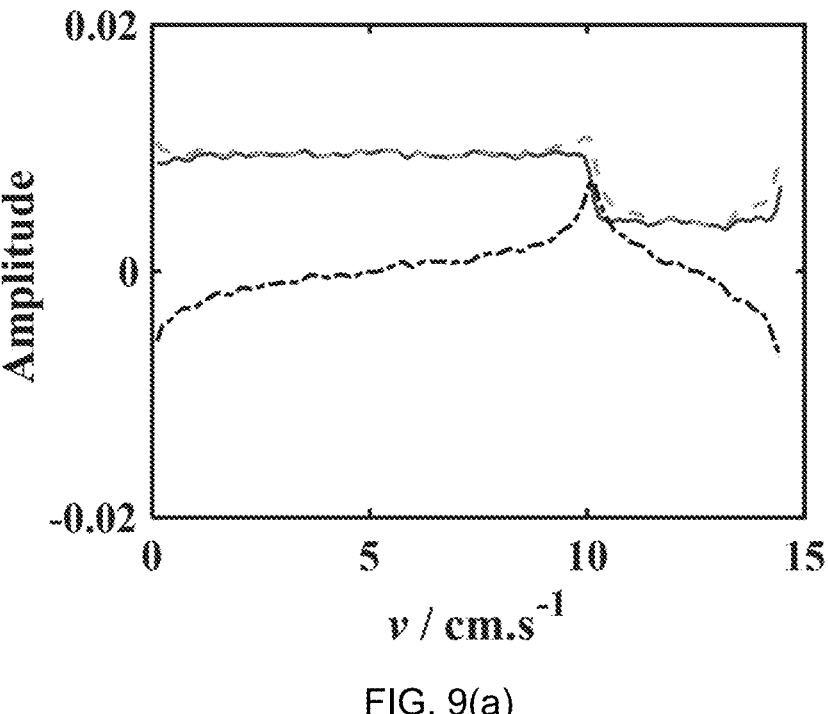
FIG. 9(a) are real, imaginary, and magnitude velocity spectrums obtained by Fourier transformation of the simulated signals of odd echoes for Poiseuille flow.
Figure 9B:
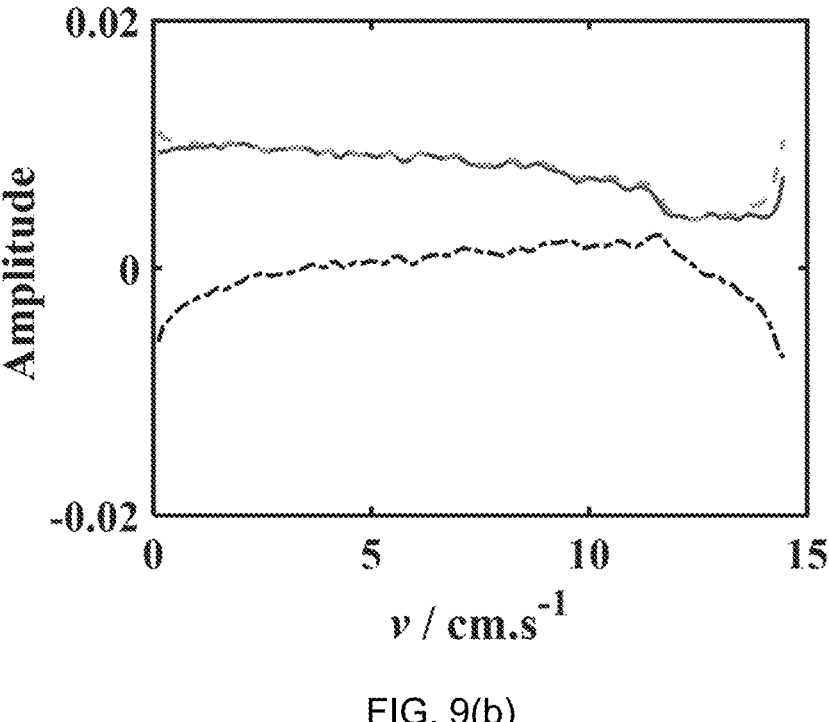
FIG. 9(b) are real, imaginary, and magnitude velocity spectrums obtained by Fourier transformation of the simulated signals of odd echoes for shear-thickening flow.
Figure 9C:
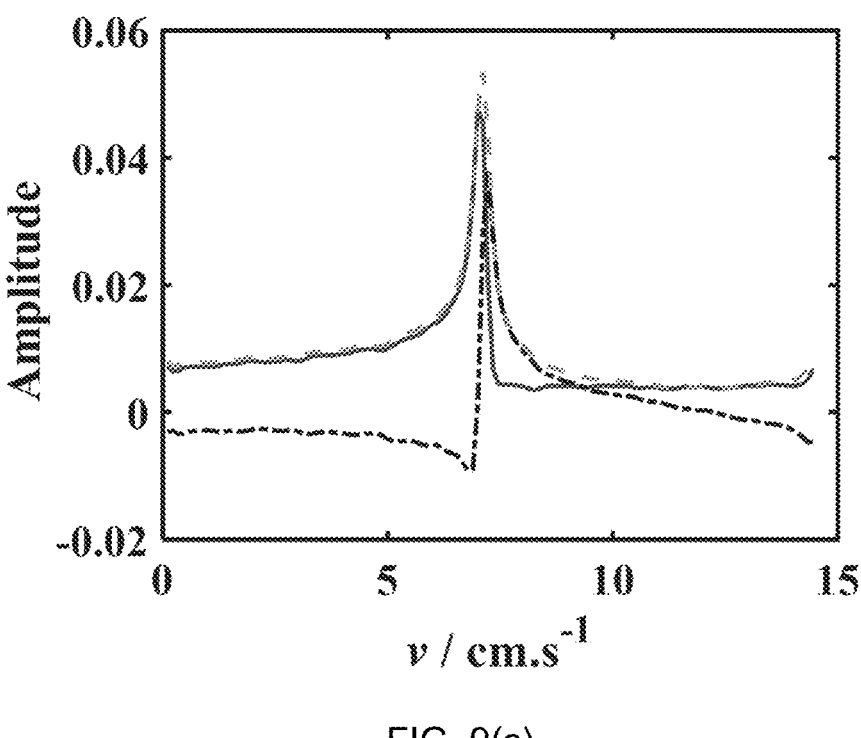
FIG. 9(c) are real, imaginary, and magnitude velocity spectrums obtained by Fourier transformation of the simulated signals of odd echoes for shear-thinning flow.

FIG. 9(a), FIG. 9(b) and FIG. 9(c) are real (-), imaginary (----), and magnitude (----) velocity spectrums obtained by Fourier transformation of the simulated signals of odd echoes for Poiseuille flow (FIG. 9(a)), shear-thickening flow (FIG. 9(b)), and shear-thinning flow (FIG. 9(c)). Based on the break point at the velocity spectrums, the maximum velocities of the three flows were 10.05±0.11, 11.63±0.11, and 7.11±0.11, respectively.

It can be seen from FIG. 9(a), FIG. 9(b) and FIG. 9(c) that the characteristics of the velocity spectrum vary from the laminar flow type. Based on their characteristics, the flow type can be identified qualitatively. More importantly, the vmax of the laminar flows can be determined from the break point at the velocity spectrums. The vmax of the three flows were 10.05±0.11, 11.63±0.11, and 7.11±0.11, respectively. Combined with their vavg from net phase accumulation in the Phase-based method described above, their m were determined to be 1.99, 1.48, and 4.87, respectively, by Eq. (10). Their calculated m values are similar to the models, within 3%.

Figure 10:
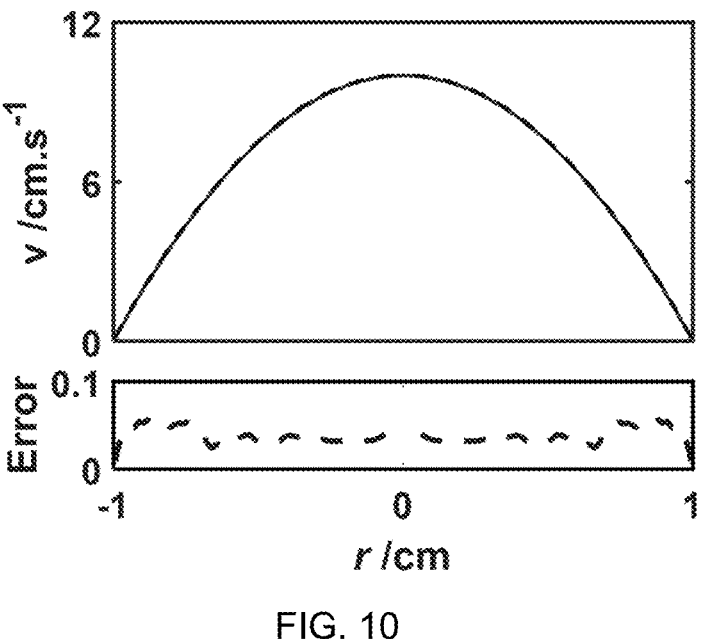
FIG. 10 is a comparison graph of Poiseuille flow velocity profile model with that reconstructed by the velocity spectrum.

For Poiseuille flow, the 1D flow velocity profile was reconstructed by Eq. (25) based on the real velocity spectrum, as shown in FIG. 10. The reconstructed velocity profile coincides with the model, and the absolute error is no more than 0.1 cm/s, which verifies the feasibility of the velocity spectrum method to reconstruct Poiseuille flow profile.

FIG. 10 is a comparison of Poiseuille flow velocity profile model (-) with that reconstructed by the velocity spectrum (----). The bottom subplots represent the absolute error between the reconstructed profile and model, displaying that the velocity errors for the Poiseuille flow in the pipe are less than 0.1 cm/s.

Experiments

Two solutions, one Newtonian fluid and one shear-thinning fluid, were prepared for flow experiments. Distilled water and glycerol were mixed in a ratio of 6:1 to prepare the Newtonian fluid. Xanthan gum solution, one of shear-thinning fluid [18, 47], was prepared in concentration of 0.42 wt % using distilled water. Xanthan gum complete dissolution was achieved by stirring for 10 h using a low gear mixer (Mastercraft, Toronto, Canada). The two solutions were doped with 0.33 wt % CuSO4 to reduce their T1 lifetimes and ensure the measured fluid was completely polarized. T1 lifetimes of the glycerol/distill water solution and the xanthan gum solution were 42 ms and 39 ms.

Glycerol/distilled water solution flow experiments were performed at flow rates of 40±1 mL/min and 78±1 mL/min to produce average velocities of 1.89±0.05 cm/s and 3.69±0.05 cm/s. Reynolds numbers were 82 and 160 for the two flows, and thus the flows are of laminar flow type. Xanthan gum solution flow experiments were performed at flow rates of 35±1 mL/min and 66±1 mL/min to produce average velocities of 1.65±0.05 cm/s and 3.12±0.05 cm/s. These are within the laminar flow regime which is typically observed for Reynolds numbers up to 2000 [48]. All the flow rates were determined from outflow with a measuring cylinder and timer.

The CPMG measurement was employed to measure the two types of flows. Echo CPMG measurement using a single echo time required approximately 2.5 min with a repetition time of 300 ms and 512 averages. The 90x° and 180y° pulse durations were both set to 3.2 μs by the quadrature echo method during the CPMG measurement [49]. The desired tip angle of each pulse was achieved by adjusting the RF amplitude. Before the flow experiments, measurements of tap water Poiseuille flow at a known average velocity were performed with different τ. It is very close to the gradient determined with the experimental field data, which indicating the feasibility of the Proteus magnet for flow measurement.

The measured magnitude data of flow were divided by a corresponding data collected for a stationary solution with the same measurement parameters, to obtain the normalized magnitude $M_\phi$ of odd echoes due to phase accumulation. The phase and $M_\phi$ of the first odd echo were processed employing the phase-based method and the magnitude-based method discussed above with respect to Flow Parameter Determination from CPMG measurement, as follows.

Based on the experimental real and imaginary signals, phase accumulations of the first odd echo at different $\tau^2$, for the two types of flows, were calculated. The phase accumulations $\phi$ were plotted with respect to $\tau^2$, as shown in FIGS. 11(a-d). Since the experimental data contain a system phase $\phi_0$, the phase accumulation $\phi$ of odd echoes can be written as $$\phi = \phi_0 + \phi_{odd} = \phi_0 + \gamma G v_{avg} \tau^2. \tag{30}$$

Based on Eq. (30), the phase accumulations $\phi$ were fitted for each flow by a linear fitting method, and the fitted results were shown as solid lines in FIGS. 11(a-d). The fitted $\phi_0 = -0.65 \pm 0.01$ rad and vavg=1.88±0.02 cm/s for the Poiseuille flow at vavg=1.89±0.05 cm/s, $\phi_0 = -0.64 \pm 0.01$ rad and vavg=3.57±0.04 cm/s for the Poiseuille flow at vavg=3.69±0.05 cm/s, $\phi_0 = -0.58 \pm 0.01$ d and vavg=1.62±0.02 cm/s for the shear-thinning flow at vavg=1.65±0.05 cm/s, and $\phi_0 = -0.68 \pm 0.01$ rad and vavg=3.15±0.02 cm/s for the shear-thinning flow at vavg=3.12±0.05 cm/s.

FIGS. 11(a-d) shows that the fitted phase accumulation of the first odd echo agrees with the measured phase accumulation, indicating the reliability of the fitted parameters. The fitted vavg is similar to the actual vavg for each flow, within 3%. The processed results of experimental data reveal that the phase-based method is feasible and practical in determining the average velocity of laminar flow.

Figure 11A:
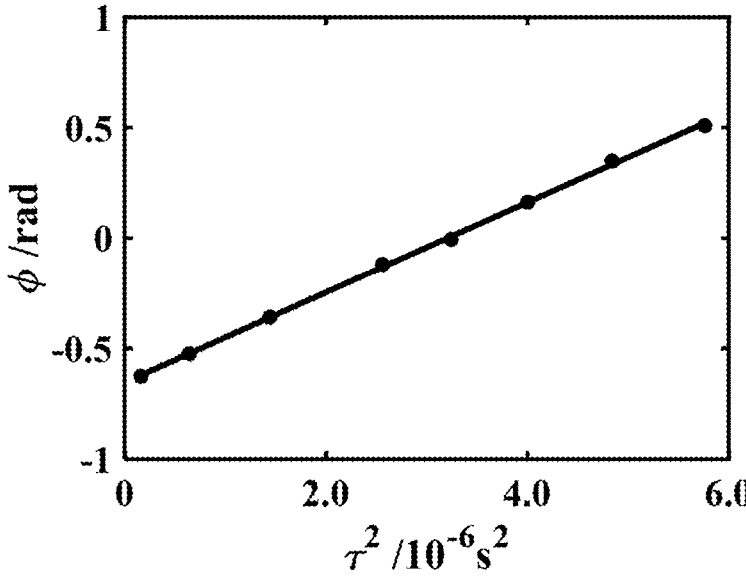
FIG. 11(a) is a graph of processed results of the phase-based method for glycerol/distilled water flows at vavg=1.89±0.05 cm/s.
Figure 11B:
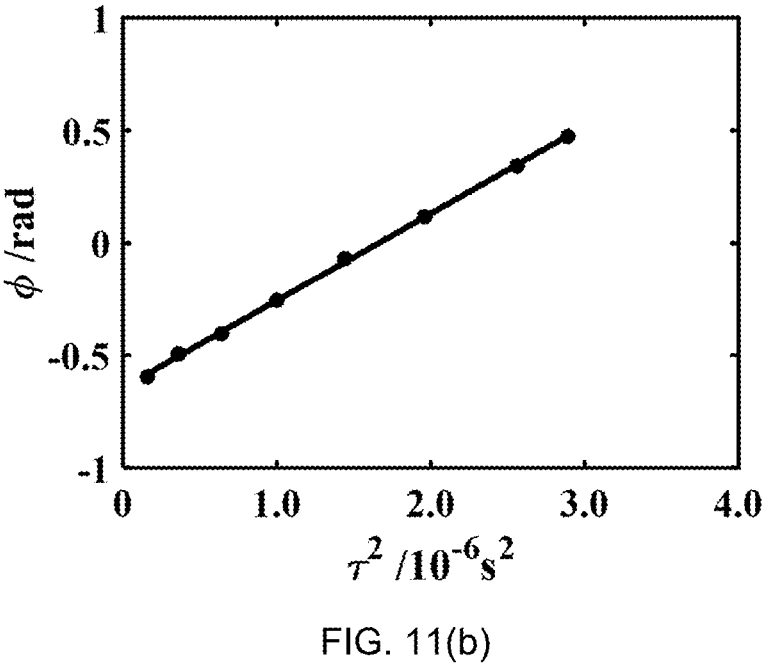
FIG. 11(b) is a graph processed results of the phase-based method for glycerol/distilled water flows at vavg=3.69±0.05 cm/s.
Figure 11C:
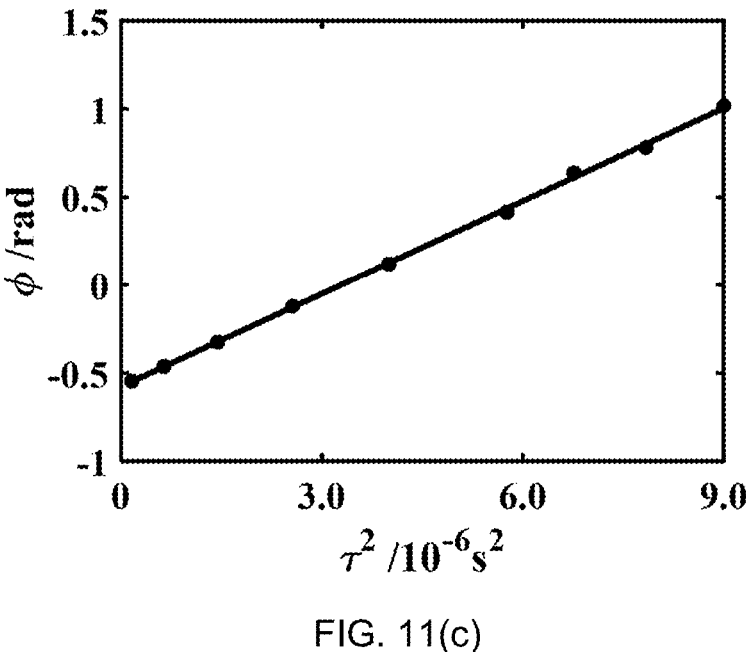
FIG. 11(c) is a graph processed results of the phase-based method for xanthan gum solution flows at vavg=1.65±0.05 cm/s.
Figure 11D:
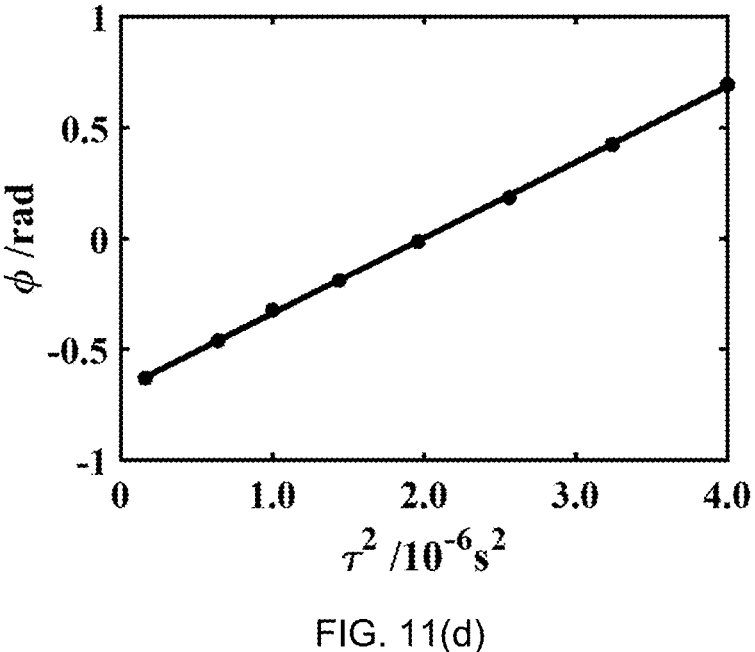
FIG. 11(d) is a graph processed results of the phase-based method for xanthan gum solution flows at vavg=3.12±0.05 cm/s.
Figure 12A:
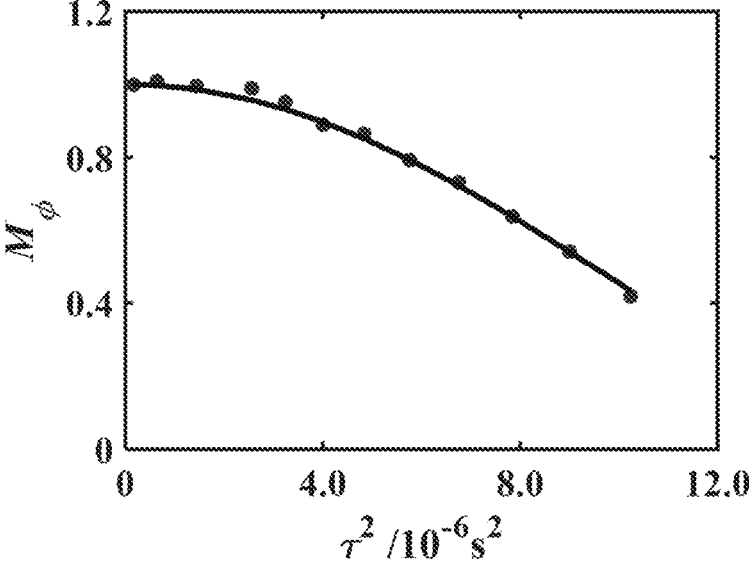
FIG. 12(a) is a graph of fitted $M_\phi$ of flow with respect to $\tau^2$ using the magnitude-based method (scheme 3) according to an aspect of the present disclosure for the glycerol/distilled water flows at vavg=1.89±0.05 cm/s.
Figure 12B:
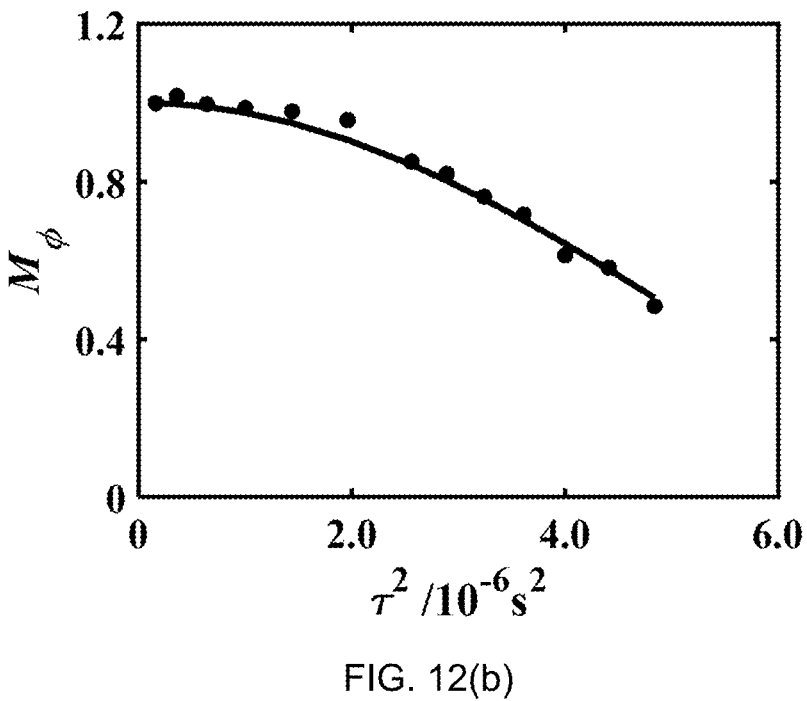
FIG. 12(b) is a graph of fitted $M_\phi$ of flow with respect to $\tau^2$ using the magnitude-based method (scheme 3) according to an aspect of the present disclosure for the glycerol/distilled water flows at vavg=3.69±0.05 cm/s.
Figure 12C:
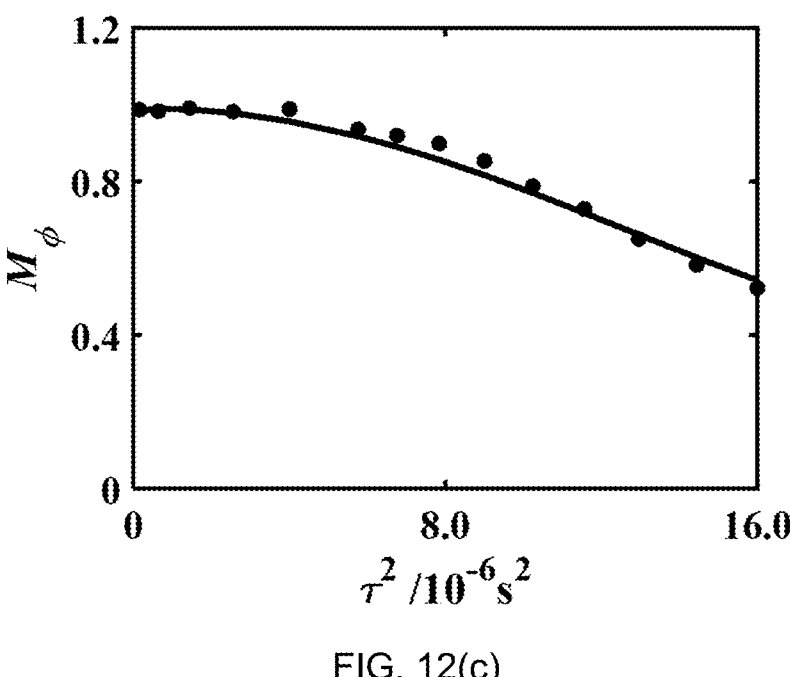
FIG. 12(c) is a graph of fitted $M_\phi$ of flow with respect to $\tau^2$ using the magnitude-based method (scheme 3) according to an aspect of the present disclosure for xanthan gum solution flows at vavg=1.65±0.05 cm/s.
Figure 12D:
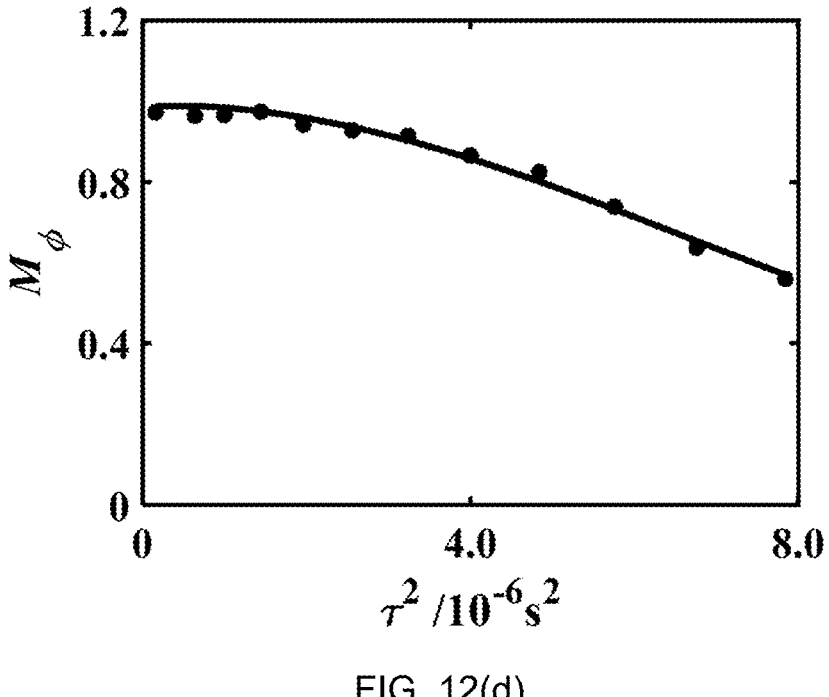
FIG. 12(d) is a graph of fitted $M_\phi$ of flow with respect to $\tau^2$ using the magnitude-based method (scheme 3) according to an aspect of the present disclosure for xanthan gum solution flows at vavg=3.12±0.05 cm/s.

FIG. 11(a), FIG. 11(b), FIG. 11(c) and FIG. 11(d) are processed results of the phase-based method for the glycerol/distilled water flows at vavg=1.89±0.05 cm/s (FIG. 11(a)) and 3.69±0.05 cm/s (FIG. 11(b)) and for the xanthan gum solution flows at vavg=1.65±0.05 cm/s (FIG. 11(c)) and 3.12±0.05 cm/s (FIG. 11(d)). Symbols (•) show the calculated phase accumulation data of the first odd echo, and the solid line shows the fitted results based on Eq. (30). The fitted $\phi_0 = -0.65 \pm 0.01$ d and vavg=1.88±0.02 cm/s for FIG. 11(a), $\phi_0 = -0.64 \pm 0.01$ rad and vavg=3.57±0.04 cm/s for FIG. 11(b), $\phi_0 = -0.58 \pm 0.01$ d and vavg=1.62±0.02 cm/s for FIG. 11(c), and $\phi_0 = -0.68 \pm 0.01$ rad and vavg=3.15±0.02 cm/s for FIG. 11(d).

The normalized magnitude $M_\phi$ of the first odd echo at different $\tau^2$, for the two types of flows, were displayed as red dots in FIGS. 12(a-c). After the vavg was determined from the phase-based method, the scheme 3 was employed to process the experimental data to obtain their flow parameter m. The fitted $M_\phi$ of different flows with respect to r are shown as solid lines in FIG. 12(a), FIG. 12(b), FIG. 12(c) and FIG. 12(d): processed results of the magnitude-based method (scheme 3) for the glycerol/distilled water flows at vavg=1.89±0.05 cm/s (FIG. 12(a)) and 3.69±0.05 cm/s (FIG. 12(b)), and for the xanthan gum solution flows at vavg=1.65±0.05 cm/s (FIG. 12(c)) and 3.12±0.05 cm/s (FIG. 12(d)). Symbols (•) show the $M_\phi$ data of the first odd echo, and the solid line shows the fitted results based on Eq. (21). The fitted m=2.11±0.06 cm/s for (FIG. 12(a)), m=1.97±0.09 cm/s for (FIG. 12(b)), m=5.38±0.19 cm/s for (FIG. 12(c)), and m=5.37±0.17 cm/s for (FIG. 12(d)).

The fitted m=2.11±0.06 cm/s and 1.97±0.09 cm/s for the glycerol/distilled water flows at vavg=1.89±0.05 cm/s and vavg=3.69±0.05 cm/s. The fitted m=5.38±0.19 cm/s and m=5.37±0.17 cm/s for the xanthan gum solution flows at vavg=1.65±0.05 cm/s and 3.12±0.05 cm/s. A comparison of the fitted m for the glycerol/distilled water flows with theoretical m of Poiseuille flow shows that the fitted m is very close to the actual m, within 6%, which reveals the effectiveness and practicality of the scheme 3 for laminar flows. Fitted m both are more than 2.0 for the xanthan gum solution flow. It confirms that the flows are shear-thinning flows, which is accordant with the real condition. The flow behaviour index ω=0.23 was determined from the fitted m at two flow velocities for the xanthan gum solution flow. The calculated w is very similar to that from Blythe et al. [17] for the similar solution concentrations under laminar conditions, verifying the reliability of the scheme 3 for non-Newtonian flows.

Figure 13A:
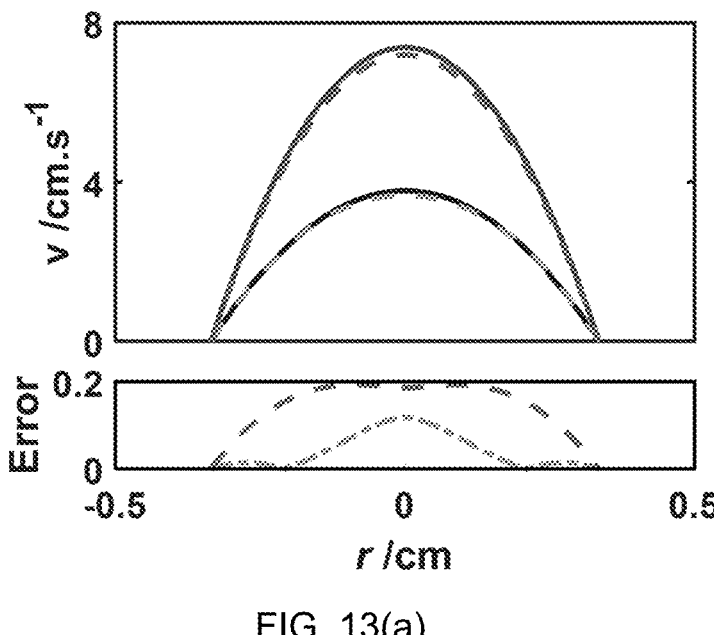
FIG. 13($a$) is a plot of comparisons of 1D flow velocity profiles for the glycerol/distilled water flows from the magnitude-based method according to an aspect of the present disclosure.
Figure 13B:
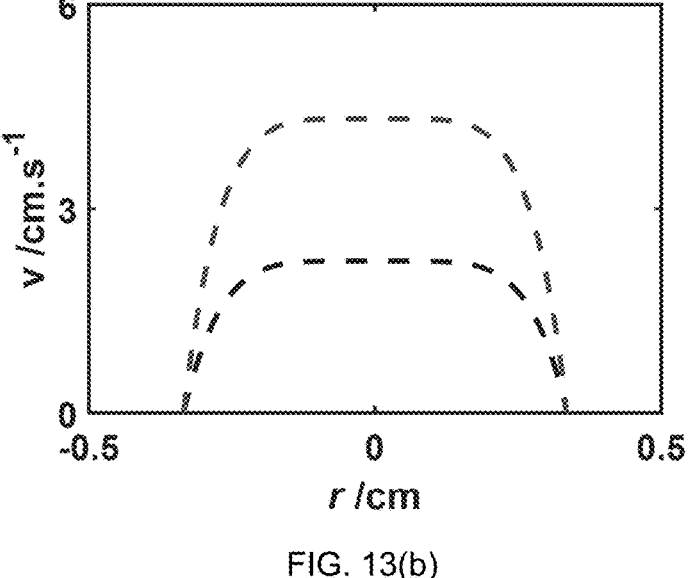

Based on the fitted flow parameters m and vavg by the phase-based method and the magnitude-based method, their flow velocity profiles were reconstructed, as shown in FIG. 13(a) and FIG. 13(b). For Poiseuille flow, the flow velocity profiles can be predicted by flow rates due to known m=2.0. The theoretical predictions are shown as a solid line in FIG. 13(a), where the bottom subplot represents the absolute error between the reconstructed profile and model. It shows that the velocity errors between reconstructed profiles and theoretical predictions in the pipe are less than 0.2 cm/s, which indicates the reliable precision of the phase-based method and the magnitude-based method.

FIG. 13(a) is a plot of comparisons of 1D flow velocity profiles for the glycerol/distilled water flows from the magnitude-based method (dashed line) with the theoretical prediction (solid line), where the bottom subplot of FIG. 13(a) represents the absolute error between the reconstructed profile and actual profile, displaying that the velocity errors between reconstructed profiles and theoretical predictions in the pipe are less than 0.2 cm/s. FIG. 13(b) is a plot of 1D flow velocity profiles for the xanthan gum solution flows based on the fitted m and vavg.

The Proteus magnet according to another embodiment of the present invention includes two pre-polarizing magnets 16 which may optionally be placed upstream from the two portable disk magnets 2. Pre-polarizing magnets 16 increase the time during which spins along the different streamlines in a flowing fluid polarize and thereby leads to higher polarization. In one embodiment, full polarization is achieved along all streamlines even with a long T1 sample. The pre-polarizing magnets 16 may be selected from an array of permanent magnets or may be constructed based on a solenoidal electromagnet whose field strength is controlled by the current in the electromagnet. In another embodiment, one pre-polarizing magnet may be used and in a further embodiment, the pre-polarizing magnet may be an electromagnet.

Further Theory and Methodology According to Another Embodiment of the Present Invention Described above are methods according to embodiments of the present invention relating to a bulk MR-based method, combining first odd echo phase shifts and magnitudes at different echo times, to determine the laminar flow velocity profile in a circular pipe. The methods discussed above in this DETAILED DESCRIPTION section of this disclosure, are based on the fact that the phase of the odd echo is related to average fluid velocity, while the dispersion of phase due to the spatial distribution of fluid flow results in a change of signal magnitude. The magnitude change depends on the distribution of phases, which may be parameterized by the average velocity and the flow behaviour index. Complete polarization of the fluid detected is required for the above methods. Complete polarization may require the addition of contrast agents to reduce the spin lattice relaxation time (T1) of the fluid, which can hinder widespread utilization. To address this issue, methods according to other embodiments of the invention as discussed in further detail below, determine the average velocity and flow behaviour index based on magnetic resonance flow measurements with incomplete polarization to reconstruct the velocity profile of laminar flow in for example a circular pipe. Numerical simulations and flow experiments were utilized to verify these methods.

Methods according to embodiments of the present invention discussed below are useful when a sample does not undergo complete polarization, such as for example when there is insufficient time for complete polarization. For example, for a fluid flowing through a conduit, incomplete polarization occurs when the flow velocity of individual streamlines of the flow results in a residence time in the magnet which is shorter than 5*T1 where T1 is the spin lattice relaxation time of the fluid. However, the methods of the embodiments of the present invention discussed below can also be used when the sample undergoes complete polarization.

In the discussion below, a new notation is employed for the power law fluid to use industry consistent notation, i.e., m is the fluid consistency coefficient, n is the flow behaviour index, and $$n' = \frac{1}{n} + 1.$$

22

In the discussion above for the complete polarization embodiments, k is employed as the fluid consistency coefficient, $\omega$ as the flow behaviour index, and $$m = \frac{1}{\omega} + 1.$$

Laminar flow of a fluid in a straight pipe results in movement of all the fluid particles in parallel lines. The velocity v(r) at radial position r, for laminar flows through a circular pipe cross-section with a radius of R, is given by the following equation [68,69]

$$v(r) = v_{max}\left[1 - \left(\frac{r}{R}\right)^{n'}\right] = \frac{n'+2}{n'}v_{avg}\left[1 - \left(\frac{r}{R}\right)^{n'}\right] \quad (31)$$

where $$n' = \frac{1}{n} + 1,$$

and n is the flow behaviour index. $v_{avg}$ and $v_{max}$ are the average velocity and the maximum velocity of the laminar flow, respectively.

Different flow regimes are described by different n' under laminar flow conditions. 1<n'<2 corresponds to shear-thickening flow, n'=2 is for Poiseuille flow, while n'>2 is for shear-thinning flow. From Eq. (31), we can see that the laminar flow velocity profile is related to n' and vavg. If one knows n' and vavg for a particular flow, one knows the flow velocity profile.

The velocity profile of laminar flow is a distribution of velocities. When a CPMG measurement is undertaken with a constant flow-oriented gradient, a net phase shift will occur for all odd echoes [11, 66, 32, 44]. The distribution of phases contributing to the odd echoes leads to a signal magnitude change. The odd echo magnitude Modd detected at incomplete polarization, with a flow-oriented gradient, can be written as $$M_{odd} = f(v)M_0 M_R M_\phi \quad (32)$$

where $M_0$, related to the type and quantity of fluid detected, is the equilibrium magnetization. $M_R$ is a fractional attenuation of the normalized magnitude resulting from spin-spin relaxation and diffusion. $M_\phi$ is the fractional attenuation of the magnitude caused by phase dispersion, dependent on the velocity distribution of laminar flow. f(v) is the pre-polarization factor, $$f(v(r)) = 1 - \exp\left(-\frac{L_{pol}}{v(r)T_1}\right),$$

related to the effective polarization length Lpol, the T1 lifetime of fluid detected, and the flow velocity distribution. It is noted that the velocity profile will be a factor in both $M_\phi$ and f(v(r)).

Since $M_0$ and $M_R$ are independent of the flow field, $$M'_\phi = f(v)M_\phi$$

can be calculated by dividing the detected signal magnitude for flowing fluid at incomplete polarization by the detected signal magnitude at complete polarization for stationary solution with the same acquisition parameters. It may be that practical data acquisition parameters can be employed that eliminate the need for normalization. Such parameters would include a short echo time to limit diffusive attenuation and relaxation decay. The normalized odd echo signal $$S'_\phi$$

due to incomplete polarization and phase dispersion, for laminar flow in an R radius pipe, is given by:

$$S'_\phi = \frac{\int\int f(v(r))\exp(-i\phi(r))ds}{\int\int ds} \tag{33}$$

$$= \frac{\int_0^R f(v(r))\exp(-i\phi(r))rdr}{\int_0^R rdr}$$

$$= \begin{cases} \Gamma\left(\frac{2}{n'}-1\right)\frac{2C^{\frac{2}{n'}}}{n'}{}_0D_{t=\frac{1}{C}}^{-\frac{2}{n'}+1}\left(\left(1-e^{-\frac{1}{t}}\right)e^{-iAt}\left(\frac{1}{C}-t\right)\right), & 1<n'<2 \\ C_0N_{t=\frac{1}{C}}\left(e^{-\frac{1}{t}}e^{-iAt}\right), & n'=2 \\ \Gamma\left(\frac{2}{n'}\right)\frac{2C^{\frac{2}{n'}}}{n'}{}_0D_{t=\frac{1}{C}}^{-\frac{2}{n'}}\left(\left(1-e^{-\frac{1}{t}}\right)e^{-iAt}\right), & n'>2 \end{cases}$$

where ds=rdrdθ stands for the cross-section area differential and i is the imaginary unit. $\Gamma(x)$ is the Gamma function, $$\Gamma(x)=\int_0^\infty w^{x-1}e^{-w}dw(x>0); {}_aD_x^{-p}f(x)$$

-continued $${}_aD_x^{-p}f(x)=\frac{1}{\Gamma(p)}\int_a^x(x-w)^{p-1}f(w)dw;$$

is the Riemann-Liouville fractional integral, ${}_aN_xf(x)$ is a new function we define as $${}_aN_xf(x)=\int_a^x f(w)dw;$$

$$C=\frac{L_{pol}}{T_1 v_{max}}=\frac{n'L_{pol}}{(n'+2)T_1 v_{avg}};$$

and $$A=\gamma G v_{max}\tau^2 C=\frac{\gamma GL_{pol}\tau^2}{T_1}.$$

Detailed derivation of Eq. (33) is presented in the Appendix. Based on Eq. (33), the normalized signal magnitude $$M'_\phi$$

and the "observed" net phase accumulation $$\phi'_{add}$$

for odd echoes, due to incomplete polarization and phase dispersion, are given by:

$$(34)$$

$$M'_\phi=|S'_\phi|=$$

$$\sqrt{S'_\phi\overline{S'_\phi}}=\begin{cases} \Gamma\left(\frac{2}{n'}-1\right)\frac{2C^{\frac{2}{n'}}}{n'}\sqrt{\left[{}_0D_{t=\frac{1}{C}}^{-\frac{2}{n'}+1}\left(\left(1-e^{-\frac{1}{t}}\right)\left(\frac{1}{C}-t\right)e^{-iAt}\right)\right]\left[{}_0D_{t=\frac{1}{C}}^{-\frac{2}{n'}+1}\left(\left(1-e^{-\frac{1}{t}}\right)\left(\frac{1}{C}-t\right)e^{iAt}\right)\right]}, & 1<n'<2 \\ C\sqrt{\left[{}_0N_{t=\frac{1}{C}}\left(e^{-\frac{1}{t}}e^{-iAt}\right)\right]\left[{}_0N_{t=\frac{1}{C}}\left(e^{-\frac{1}{t}}e^{iAt}\right)\right]}, & n'=2 \\ \Gamma\left(\frac{2}{n'}\right)\frac{2C^{\frac{2}{n'}}}{n'}\sqrt{\left[{}_0D_{t=\frac{1}{C}}^{-\frac{2}{n'}}\left(\left(1-e^{-\frac{1}{t}}\right)e^{-iAt}\right)\right]\left[{}_0D_{t=\frac{1}{C}}^{-\frac{2}{n'}}\left(\left(1-e^{-\frac{1}{t}}\right)e^{iAt}\right)\right]}, & n'>2 \end{cases}$$

-continued $$\phi'_{add} = \arctan\left(\frac{S'_{\phi,Im}}{S'_{\phi,Re}}\right) = \begin{cases} \arctan\left(\dfrac{_0D^{-\frac{2}{n'}+1}_{t=\frac{1}{C}}\left[\left(1-e^{-\frac{1}{t}}\right)\left(\frac{1}{C}-t\right)\sin(At)\right]}{_0D^{-\frac{2}{n'}+1}_{t=\frac{1}{C}}\left[\left(1-e^{-\frac{1}{t}}\right)\left(\frac{1}{C}-t\right)\cos(At)\right]}\right), & 1 < n' < 2 \\[20pt] \arctan\left(\dfrac{_0N_{t=\frac{1}{C}}\left(e^{-\frac{1}{t}}\sin(At)\right)}{_0N_{t=\frac{1}{C}}\left(e^{-\frac{1}{t}}\cos(At)\right)}\right), & n' = 2 \\[20pt] \arctan\left(\dfrac{_0D^{-\frac{2}{n'}}_{t=\frac{1}{C}}\left[\left(1-e^{-\frac{1}{t}}\right)\sin(At)\right]}{_0D^{-\frac{2}{n'}}_{t=\frac{1}{C}}\left[\left(1-e^{-\frac{1}{t}}\right)\cos(At)\right]}\right), & n' > 2 \end{cases}$$ (35)

The $$\phi'_{add}$$

observed via Eq. (35) ranges from $-\pi$ to $\pi$.

$$\phi'_{add} < 0$$

means the observed phase accumulation is negative, but the actual phase accumulation is greater than $\pi$. It can be seen from Eqs. (34) and (35) that both $$M'_{\phi} \text{ and } \phi'_{add}$$

are related to hardware parameters, G and Lpol, acquisition parameter $\tau$, and fluid parameters, T1, n' and $v_{avg}$. One can therefore fit the first odd echo $$M'_{\phi} \text{ and } \phi'_{add}$$

at different $\tau$ to obtain the n' and $v_{avg}$ of interest, with known G, Lpol and T1, based on Eqs. (34) and (35). To fit n' and $v_{avg}$, the objective function for least-squares minimization was constructed as:

$$\min_{\substack{n'>1 \\ v_{avg}>0}} \Psi^2, \text{ with } \Phi^2 = \sum_{h=1}^{H}\left[Res^2\left(\phi''_{odd,h}\right) + Res^2\left(M''_{\phi,h}\right)\right]$$ (36)

where H is the number of first odd echoes acquired.

$$\left(Res''_{odd,h}\right)$$

is the residual between the fitted phase accumulation and the measured phase accumulation.

$$Res\left(M''_{\phi,h}\right)$$

is the residual between the fitted normalized signal magnitude and the measured normalized signal magnitude for the first odd echo from the hth CPMG measurement. Therefore, $$Res\left(\phi''_{odd,h}\right) \text{ and } Res\left(M''_{\phi,h}\right)$$

can be written as $$\begin{cases} Res\left(\phi''_{odd,h}\right) = \phi'_{odd,h} - \phi''_{odd,h} \\ Res\left(M''_{\phi,h}\right) = M'_{\phi,h} - M''_{\phi,h} \end{cases}$$ (37)

where $$\phi'_{odd,h} \text{ and } M'_{\phi,h}$$

denote the measured phase accumulation and normalized signal magnitude of the first odd echo from the hth CPMG measurement.

$$\phi''_{odd,h} \text{ and } M''_{\phi,h}$$

denote the corresponding predictions from Eqs. (34) and (35).

Figure 16:
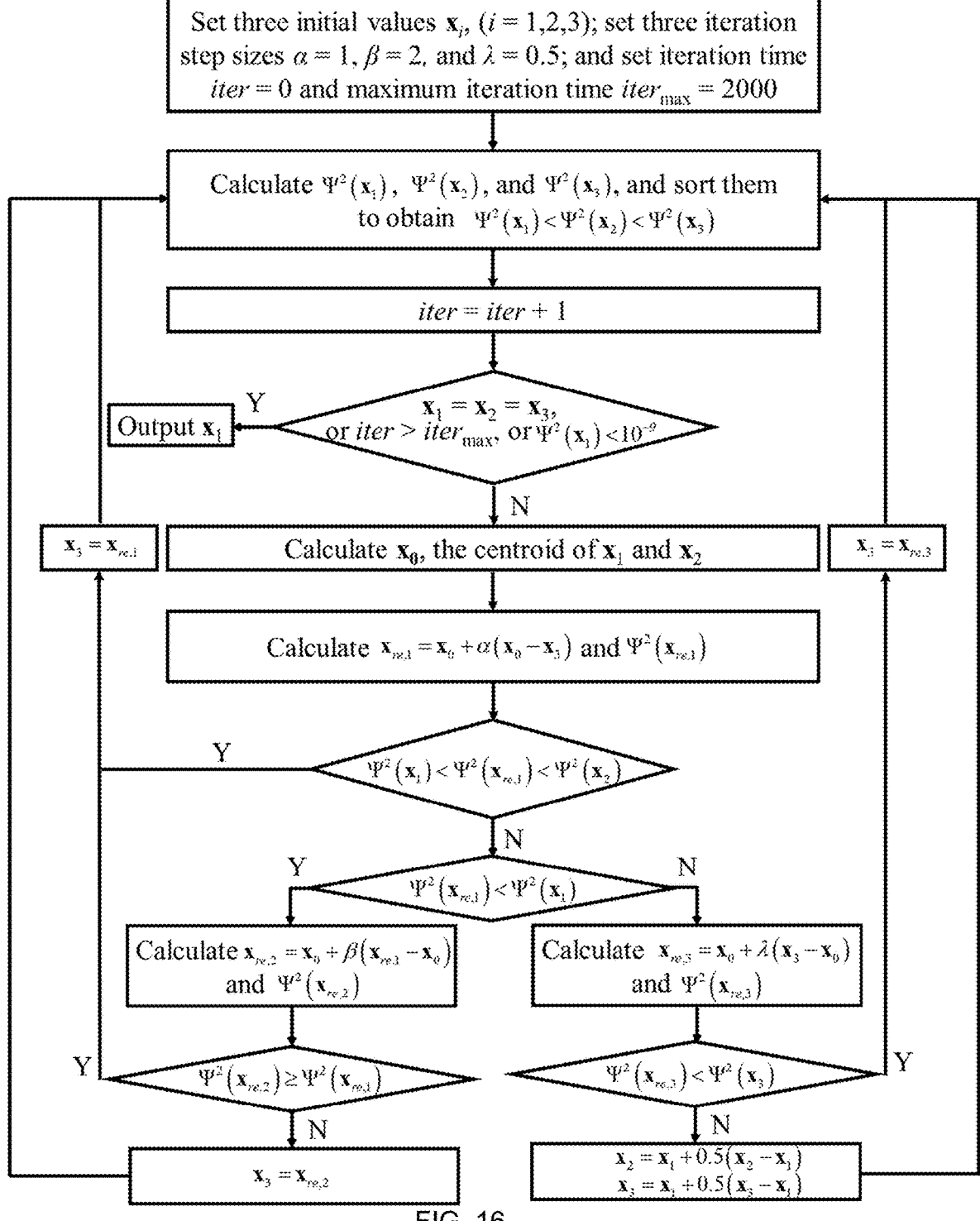
FIG. 16 is a flowchart of the Nelder-Mead algorithm for determining the optimum n' and $v_{avg}$.

The Nelder-Mead algorithm [70] was employed to solve Eq. (36). The method works by creating a simplex (a num-dimensional object with flat sides and num+1 vertices) in the solution space. The vertices are continuously adjusted so that the simplex closes on the minimum of the function. Since there are only two parameters of interest, n' and $v_{avg}$, the solution space for this problem is 2-dimensional, and the simplex will be a triangle in the n'$v_{avg}$ plane. To avoid unrealistic fitting results, n' would be set to 9.9999 if n'>10 and $v_{avg}$ would be set to 19.9999 if $v_{avg} \geq 20$ during iterations of the Nelder Mead algorithm. In order to facilitate the algorithm description, x=(n', $v_{avg}$) was defined as the solution of Eq. (36). The flowchart of the Nelder-Mead algorithm is shown in FIG. 16.

Further Numerical Simulations and Analyses

To verify the method according to an embodiment of the present invention as a means to determine the laminar fluid flow parameters n' and $v_{avg}$ in a circular pipe, a number of simulations were performed. We performed the simulations for a circular cross-section rather than for the whole circular pipe, due to the requirement of normalized data. A circular pipe cross-section was discretized with a 1000×1000 grid, with the grid intersections being considered during the simulations. At each intersection, the fluid velocity was calculated by $$v(r) = \frac{n'+2}{n'} v_{avg}\left(1 - \left(\frac{r}{R}\right)^{n'}\right).$$

The odd echo imaginary and real signals, due to incomplete polarization and phase dispersion, were discretized by $$S'_{\phi,Im} = -\frac{1}{N}\sum_{j=1}^{N} f(v_j)\sin(\phi(v_j)) = -\frac{1}{N}\sum_{j=1}^{N}\left(1 - \exp\left(-\frac{L_{pol}}{T_1 v_j}\right)\right)\sin(\gamma G v_j \tau^2) \tag{38}$$

$$S'_{\phi,Re} = \frac{1}{N}\sum_{ii=1}^{N} f(v_j)\cos(\phi(v_j)) = \frac{1}{N}\sum_{j=1}^{N}\left(1 - \exp\left(-\frac{L_{pol}}{T_1 v_j}\right)\right)\cos(\gamma G v_j \tau^2) \tag{39}$$

where $v_j$ is the velocity at the jth intersection and N is the interaction number in the cross-section. Equations. (38)-(39) should allow calculations of $$\phi'_{add} \text{ and } M'_{\phi}$$

of odd echoes through $$\phi'_{add} = \arctan\left(-\frac{S'_{\phi,Im}}{S'_{\phi,Re}}\right) = \arctan\left[\frac{\sum_{j=1}^{N}\left(1 - \exp\left(-\frac{L_{pol}}{T_1 v_j}\right)\right)\sin(\gamma G v_j \tau^2)}{\sum_{j=1}^{N}\left(1 - \exp\left(-\frac{L_{pol}}{T_1 v_j}\right)\right)\cos(\gamma G v_j \tau^2)}\right] \tag{40}$$

and $$M'_{\phi} = \sqrt{\left(S'_{\phi,Re}\right)^2 + \left(S'_{\phi,Im}\right)^2} = \frac{1}{N}\sqrt{\left[\sum_{j=1}^{N}\left(1 - \exp\left(-\frac{L_{pol}}{T_1 v_j}\right)\right)\sin(G v_j \tau^2) + \left[\sum_{j=1}^{N}\left(1 - \exp\left(-\frac{L_{pol}}{T_1 v_j}\right)\right)\cos(\gamma G v_j \tau^2)\right]^2} \tag{41}$$

The simulated parameters were set as follows: the inner diameter of the pipe was 0.67 cm, the fluid T1 lifetime was 1 s, the effective polarization length Lpol was 5 cm, and the magnetic field gradient was 65 G/cm. Twenty values of T were chosen in the range of 200 to 1000 μsec with a constant step size between them. The first odd echo real and imaginary signals at different τ, for the three laminar flows (n'=1.5, 2.0, and 5.0) with average velocities of 5 cm/s and 8 cm/s, were simulated based on Eqs. (38) and (9). A signal-to-noise ratio of 200 resulted from Gaussian noise added to the simulated imaginary and real signals. Based on the noisy imaginary and real signals, the first odd echo $$\phi'_{add} \text{ and } M'_{\phi}$$

at different τ were calculated by Eqs. (40) and (41). They were then processed by the Nelder-Mead algorithm to obtain n' and $v_{ag}$, as shown in FIGS. 17 and 18. It is noted that $$\phi'_{add} < 0$$

for shear-thinning flow in FIGS. 17(c) and 18(c) has an actual phase accumulation that is greater than π. The negative observed phase accumulation is due to phase wrapping. The fitting method proposed does not require unwrapping the observed phase accumulation.

From FIG. 17, n'=1.53 and vavg=5.05 cm/s resulted from fitting for shear-thickening flow. An n'=2.01 and vavg=5.03 cm/s resulted from fitting for Poiseuille flow. An n'=4.98 and vavg=4.99 cm/s resulting from fitting for shear-thinning flow. From FIG. 3, n'=1.54 and vavg=8.12 cm/s resulted from fitting for shear-thickening flow. An n'=2.02 and vavg=7.98 cm/s resulted from fitting for Poiseuille flow. An n'=4.98 and vavg=7.99 cm/s resulting from fitting for shear-thinning flow. The fitted n' and vavg for each model are similar to their theoretical values. Each one-dimensional (1D) flow velocity profile at average velocities of 5 cm/s and 8 cm/s in a 0.67 cm inner diameter pipe was constructed with the fitted n' and vavg, as shown in FIGS. 19 and 20. The reconstructed 1D velocity profiles agree well with the three laminar flow models. The error subplots exhibit absolute errors of <0.2 cm/s for the predicted velocities. These comparisons demonstrate that the proposed method is effective and accurate for the determination of n' and vavg of laminar flow in a pipe.

FIG. 17(a)-(f) are graphs of simulated first odd echo $$\phi'_{add} \text{ and } M'_{\phi}$$

(● and ■) at different τ, theoretical first odd echo $$\phi'_{add} \text{ and } M'_{\phi}$$

(-) at different τ, and processed results (----) by the Nelder-Mead algorithm, for shear-thickening flow (a and d), for Poiseuille flow (b and e), and for shear-thinning flow (c and f) at an average of 5 cm/s. Phase angles are in radians.

$$\phi'_{add} < 0$$

in (c) means the observed phase accumulation is negative, but the actual phase accumulation is greater than π.

FIG. 18(a)-(f) are simulated first odd echo $$\phi'_{add} \text{ and } M'_{\phi}$$

(● and ■) at different τ, theoretical first odd $$\phi'_{add} \text{ and } M'_{\phi}$$

(_) at different τ, and processed results (----) by the Nelder-Mead algorithm, for shear-thickening flow (a and d), for Poiseuille flow (b and e), and for shear-thinning flow (c and f) at an average of 8 cm/s. Phase angles are in radians.

$$\phi'_{add} < 0$$

in (c) means the observed phase accumulation is negative, but the actual phase accumulation is greater than π.

FIG. 19(a)-(c) are graphs of comparisons of the constructed 1D flow velocity profiles (----) with the corresponding model (-) for shear-thickening flow (a), for Poiseuille flow (b), and for shear-thinning flow (c) at an average of 5 cm/s. The bottom subplots show the absolute error of predicted velocity. All predicted velocity errors are less than 0.1 cm/s.

FIG. 20(a)-(c) are graphs of comparisons of the constructed 1D flow velocity profiles (----) with the corresponding model (-) for shear-thickening flow (a), for Poiseuille flow (b), and for shear-thinning flow (c) at an average of 8 cm/s. The bottom subplots show the absolute error of predicted velocity. All predicted velocity errors are less than 0.2 cm/s.

Further Experimental

Tap water, a Newtonian fluid with a T1 lifetime of 2.96 s, was employed for flow experiments to verify the proposed method. A gravity-fed flow network was utilized, as illustrated in FIG. 21. The upper reservoir was suspended one foot above the magnet. The lower reservoir was on the floor near the magnet. A Simple Deluxe 1056 GPH submersible pump was placed in the lower reservoir and easily outpaced the water outflow through the magnet. An overflow line kept a constant head in the upper reservoir. The water flowed vertically downward through a glass pipe with an inner diameter of 8.6 mm inside the magnet. The distance from the entry end of the glass pipe to the centre of the RF window was 95 cm. The distance from the entry end to the edge of the magnet coil was 70 cm. These conditions guarantee the flow in the glass pipe in the magnet coil region was steady.

A 4.7 T vertical bore superconducting magnet (Cryomagnetics, TN) was used with a homebuilt 3D gradient set and a DOTY DSI-874 1H RF probe (Doty Scientific, Inc., Columbia, SC). The length of the magnet coil was estimated to be 50 cm based on magnet determination. The polarization length of the 4.7 T magnet was therefore 25 cm. The Z-directed (vertical) magnetic field gradient was turned on for the duration of the CPMG measurement at a value 57.6 G/cm, which is 80% of the maximum possible GZ. Including 4 ms of ramp-up and 2 ms for ramp-down time, the gradient pulses were less than 8 ms. The temperature of the gradient coils was monitored during the measurements, but no heating was observed. During the measurements, the duration of the 90° and 180° RF pulses was kept constant with the 90° pulse having half the amplitude of the 180° pulse. The pulse durations were 44 μs.

Tap water flow experiments were undertaken with an average velocity of 8.0 cm/s in the glass pipe. Average flow speeds were independently calculated using the inner diameter of the pipe and a volume flow rate found using a graduated cylinder and stopwatch. The Reynolds number was 650.

The normalized signal magnitude $$M'_\phi$$

of the first odd echo was obtained from the first odd echo signal magnitude for flow measurement divided by that for stationary fluid measurement at the same echo time. It is noted that the normalized first odd echo signal magnitude $$M'_\phi$$

can also be calculated from the signal magnitude for flow measurement divided by $$M_0 \exp\left(-\frac{2}{3}\gamma^2 G^2 \tau^3 D\right),$$

where M0 is the equilibrium magnetization magnitude, which can be assumed to be the magnitude of the first even echo at a short echo time. The "observed" net phase accumulation $$\phi'_{add},$$

for the first odd echo, was calculated based on the imaginary signal magnitude and real signal magnitude ratio.

Based on the flow and stationary measurements, the "observed" net phase accumulation $$\phi'_{add}$$

add and the normalized signal magnitude $$M'_\phi$$

at different τ, were calculated. The results of the measured first odd echoes are shown in FIG. 7. The fitted vavg was 7.90 cm/s with n'=2.04 from the proposed method, which agrees with the known flow velocity of 8.0 cm/s and n'=2 for Poiseuille flow. The corresponding flow velocity profile in the glass pipe are reconstructed by Eq. (1), as shown in FIG. 8. From FIG. 8, the absolute error between the flow velocity profiles from the theoretical prediction and the proposed method is less than 0.4 cm/s in any position of pipe. The comparison results show that the proposed method is practical to measure the velocity profile of laminar flow in a circular pipe.

FIG. 22(a)-(b) are graphs of measured and fitted results for the tap water flow measurements. (a) The measured and fitted phase shifts (● and -) and (b) the measured and fitted normalized signal magnitude (■ and -) for the first odd echoes at different τ.

FIG. 23 is a graph comparison of 1D velocity profiles of the tap water flow from the theoretical prediction (-) with from the proposed method (----). The bottom subplot shows the error of the flow velocity profile from the proposed method.

The present invention according to some embodiments relates to an MR sensor, indicated generally at 30 in FIG. 24, suitable for use with an NMR measuring device, wherein the sensor includes two rectangular magnets 32 which are rectangular into the plane of FIG. 24. Each rectangular magnet 32 is separated and tilted at an angle θ to generate a magnetic field gradient in the direction of flow (indicated as "flow direction" in FIG. 24) in conduit 40. The field distribution is improved if steel plates 34 are placed above and below the measurement volume adjacent to the permanent magnets 32 top and bottom. The steel plates 34 homogenize the field in the direction transverse to the flow direction and help define a better magnetic field gradient in the direction of flow. The MR sensor 30 includes two pre-polarizing magnets 36 which may optionally be placed upstream from the two portable rectangular magnets 32. Pre-polarizing magnets 36 increase the time during which spins along the different streamlines in a flowing fluid polarize and thereby leads to higher polarization. In one embodiment, the Lpol of the sensor is 5 cm-15 cm in length. The RF coil 42 is displaced left of centre from the mid point of the conduit 40 to increase Lpol. The static field is z oriented. The flow sensitizing gradient magnetic field is x directed.

In one embodiment, full polarization is achieved along all streamlines even with a long T1 sample. The pre-polarizing magnets 36 may be selected from an array of permanent magnets or may be constructed based on a solenoidal electromagnet whose field strength is controlled by the current in the electromagnet. In another embodiment, one pre-polarizing magnet may be used and in a further embodiment, the pre-polarizing magnet may be an electromagnet. In certain embodiments, the sensor 30 can be used for incomplete polarization methods of the present disclosure.

Sensors and methods according to some embodiments of the present invention may use any magnet assembly with a constant magnetic field gradient in the direction of flow for the measurements described in this specification.

In order to carry out methods according to embodiments of the present invention, a switched magnetic field gradient in a conventional MR/MRI instrument may be used. The switched gradient is turned on, with a stable value, and left on for the duration of an individual measurement, such as a CPMG measurement. The gradient is then switched off to control the gradient duty cycle to prevent over-heating. The process of switch on and stabilization is then repeated for signal averaging or alternate values of the measurement, for example change in the echo time.

Methods and devices according to some embodiments of the present invention permit determination of flow behaviour (rheology) of food materials, consumer products, polymers, pharmaceuticals and petroleum products.

Appendix A

A.1. Net Phase Accumulation of Odd Echoes for a CPMG Measurement

When the flow fluid is measured by CPMG MR method with a constant magnetic field gradient (G) in the direction of flow, the phase shift would occur. For a constant velocity v flow, the net phase accumulation φ, related to time t, can be expressed as $$\phi = \gamma v \int G(t) t dt = \gamma v G \int t dt. \tag{A.1}$$

The phase at the 180y° pulse will be reversed during the measurement. The net phase accumulation of the first odd echo can therefore be calculated from $$\phi_1 = \gamma G v \int_0^\tau t dt + \gamma G v \int_\tau^{2\tau} t dt = \gamma G v \tau^2, \tag{A.2}$$

where τ is the interval between 90x° and 180y° pulses. Due to net phase accumulation cancellations of all even echoes [44], the net phase accumulation of the (n+1)th (n≥1) odd echo can be calculated by $$\phi_{n+1} = -\phi_{even,n} - \gamma G v \int_{4n\tau}^{(4n+1)\tau} t dt + \gamma G v \int_{(4n+1)\tau}^{(4n+2)\tau} t dt \tag{A.3}$$

$$= \phi_{even,n} + \gamma G v \tau^2$$

$$= \gamma G v \tau^2,$$

where $\phi_{even,n} = 0$ is the net phase accumulation of the nth even echo and 4nτ is the time of even echo. In summary, the net phase accumulations of all odd echoes, with a flow-directed magnetic field gradient, are the same and equal to $\gamma G v \tau^2$.

Net phase accumulation of odd echoes for a varied echo time CPMG measurement

Figure 14:
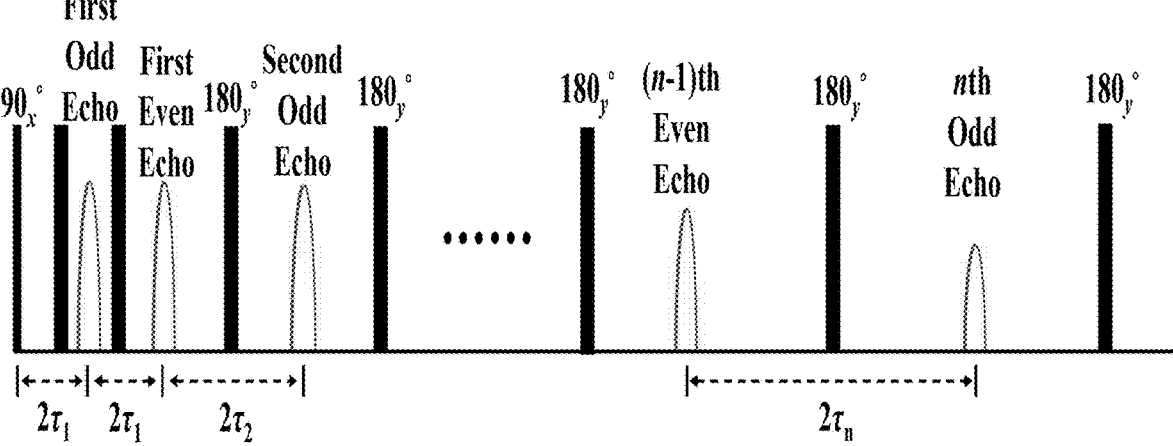
FIG. 14 is a diagram of a varied echo time CPMG scheme.

A diagram of the varied echo time CPMG was shown in FIG. 14. $\tau_n$ was increased after every even echo. Based on the derivations above, the net phase accumulation of the first odd echo with a flow-directed gradient, for a constant velocity v flow, is $$\gamma G v \tau_1^2,$$

and the net phase accumulation of the first even echo is zero.

The net phase accumulations of all even echoes are now shown as zero for a varied echo time CPMG measurement. Assuming the net phase accumulation of the nth (n≥1) even echo $\phi_{even,n}$ is zero, and then that of the (n+1)th even echo can be calculated by $$\phi_{even,n+1} = \phi_{even,n} + \gamma G v \int_{T_n}^{T_n+\tau_{n+1}} t dt - \gamma G v \int_{T_n+\tau_{n+1}}^{T_n+3\tau_{n+1}} t dt + \tag{A.4}$$

$$\gamma G v \int_{T_n+3\tau_{n+1}}^{T_n+4\tau_{n+1}} t dt$$

$$= \frac{1}{2}\gamma G v (2T_n\tau_{n+1} + \tau_{n+1}^2) - \frac{1}{2}\gamma G v (8T_n\tau_{n+1} + 4\tau_{n+1}^2) +$$

$$\frac{1}{2}\gamma G v (7T_n\tau_{n+1} + 2\tau_{n+1}^2)$$

$$= 0,$$

where $T_n$ is the time of the nth even echo. Therefore, the net phase accumulation cancels for all even echoes for a varied echo time CPMG measurement.

Similarly, the net phase accumulation of the (n+1)th (n≥1) odd echo can be calculated by $$\phi_{n+1} = \phi_{even,n} - \gamma G v \int_{T_n}^{T_n+\tau_{n+1}} t dt + \gamma G v \int_{T_n+\tau_{n+1}}^{T_n+2\tau_{n+1}} t dt \tag{A.5}$$

$$= 0 - \frac{1}{2}\gamma G v (2T_n\tau_{n+1} + \tau_{n+1}^2) + \frac{1}{2}\gamma G v (2T_n\tau_{n+1} + 3\tau_{n+1}^2)$$

-continued $$= \gamma G v \tau_{n+1}^2.$$

Eq. (A.5) shows that the net phase accumulation of all odd echoes for a varied echo time CPMG measurement with a flow-directed gradient is independent of previous echo times for a constant velocity v flow.

FIG. 15 is a diagram of a varied echo time CPMG scheme. During this CPMG measurement, $\tau_n$ would be incremented after every even echo.

In a further embodiment, a conventional flow meter can be added to a measurement system according to the present invention. If a flow meter is used to measure the flow rate in volume per time then by dividing by the cross section area of the conduit tube the average flow velocity can be determined. The benefit of this is that if the average velocity is independently known, either the magnitude, using Eq, (34), or the phase, using Eq. (35), can be used to solve for n'.

Sensors according to some embodiments of the invention may be connected via RF sensor connections 23 to a conventional MR instrument shown as block 22 in FIG. 1(*b*) as a programmed radio frequency pulses, signal acquisition and processing method steps. Signal Processing steps according to some embodiments of the present invention may be implemented as computer-implemented methods in conventional MR instrument hardware or conventional computer hardware and may be implemented separately from signal acquisition steps. Computers suitable for the execution of a computer program can be based on general or special purpose microprocessors, both, or any other kind of CPU. Generally, a CPU will receive instructions and data from a read-only memory (ROM) or a random access memory (RAM) or both. The essential elements of a computer are a CPU for performing or executing instructions and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, an MR instrument.

Normalized signal of odd echoes at incomplete polarization due to phase shift for laminar flow in a circular pipe The normalized odd echo signal $$S'_\phi$$

at incomplete polarization due to phase shift, for laminar flow, can be written as $$S'_\phi = \frac{\iint f(v(r))\exp(-i\phi(r))ds}{\iint ds} = \frac{\int_0^R f(v(r))\exp(-i\phi(r))rdr}{\int_0^R rdr} \quad (A6)$$

where $f(v(r)) = 1 - \exp\left(-\frac{L_{pol}}{v(r)T_1}\right),$ $$\phi(r) = \gamma G v(r)\tau^2, \text{ and}$$

$$v(r) = v_{max}\left(1 - \frac{r^{n'}}{R^{n'}}\right).$$

We define $$C = \frac{L_{pol}}{T_1 v_{max}}$$

and $X = \gamma G v_{max}\tau^2$, and the term $$\int_0^R f(v(r))\exp(-i\phi(r))rdr$$

can be written as $$\int_0^R f(v(r))\exp(-i\phi(r))rdr = \quad (A7)$$

$$\int_0^R \left(1 - \exp\left(-\frac{C}{1 - \frac{r^{n'}}{R^{n'}}}\right)\right)\exp\left(-iX\left(1 - \frac{r^{n'}}{R^{n'}}\right)\right)rdr$$

Then, we define $$y = \frac{1 - \frac{r^{n'}}{R^{n'}}}{C} \text{ and } A = XC = \frac{\gamma G L_{pol}\tau^2}{T_1},$$

and Eq. (A7) can be written. For n'=2, Eq. (A7) can be written as $$\int_0^R f(v(r))\exp(-i\phi(r))rdr = \int_0^R \left(1 - \exp\left(-\frac{C}{1 - \frac{r^{n'}}{R^{n'}}}\right)\right)$$

$$\exp\left(-iX\left(1 - \frac{r^{n'}}{R^{n'}}\right)\right)rdr$$

$$= \frac{CR^2}{2}\int_0^{\frac{1}{T}} e^{-\frac{1}{y}}e^{-iAy}dy$$

We define a new function $$_aN_xf(x) = \int_a^x f(w)dw,$$

Eq. (A8) can be written as $$\int_0^R f(v(r))\exp(-i\phi(r))r\,dr = \frac{CR^2}{2}{}_0N_{t=\frac{1}{C}}\left(e^{-\frac{1}{t}}e^{-iAt}\right) \quad (A9)$$

Thus, for Poiseuille flow n'>2, the normalized signal $S'_\phi$ of odd echoes at incomplete polarization due to phase shift can be written as $$S'_\phi = C_0 N_{t=\frac{1}{C}}\left(e^{-\frac{1}{t}}e^{-iAt}\right) \quad (A10)$$

For n'≈2, Eq. (A7) can be written as $$\int_0^R f(v(r))\exp(-i\phi(r))r\,dr = \int_0^R \left(1 - \exp\left(-\frac{C}{1-\frac{r^{n'}}{R^{n'}}}\right)\right) \quad (A11)$$

$$\exp\left(-iX\left(1-\frac{r^{n'}}{R^{n'}}\right)\right)r\,dr$$

$$= -\int_{\frac{1}{T}}^0 \frac{C^{\frac{2}{n'}}R^2}{n'}\left(\frac{1}{C}-y\right)^{\frac{2}{n'}-1}\left(1-e^{-\frac{1}{y}}\right)e^{-iXCy}dy$$

$$= \frac{C^{\frac{2}{n'}}R^2}{n'}\int_0^{\frac{1}{T}}\left(\frac{1}{C}-y\right)^{\frac{2}{n'}-1}\left(1-e^{-\frac{1}{y}}\right)e^{-iAy}dy$$

The Riemann-Liouville fractional integral $$_aD_x^{-p}f(x) = \frac{1}{\Gamma(p)}\int_a^x (x-w)^{p-1}f(w)dw$$

$$\Gamma(x) = \int_0^\infty w^{x-1}e^{-w}dw(x>0).$$

and the gamma function
For 1<n'<2, Eq. (A 11) can be expressed as $$\int_0^R f(v(r))\exp(-i\phi(r))r\,dr = \frac{C^{\frac{2}{n'}}R^2}{n'}\int_0^{\frac{1}{T}}\left(\frac{1}{C}-y\right)^{\frac{2}{n'}-2} \quad (A12)$$

$$\left(\frac{1}{C}-y\right)\left(1-e^{-\frac{1}{y}}\right)e^{-iAy}dy$$

$$= \Gamma\left(\frac{2}{n'}-1\right)\frac{R^2 C^{\frac{2}{n'}}}{n'}{}_0D_{t=\frac{1}{C}}^{-\frac{2}{n'}+1}$$

$$\left(\left(1-e^{-\frac{1}{t}}\right)e^{-iAt}\left(\frac{1}{C}-t\right)\right)$$

Thus, for Shear-thickening flow 1<n'<2, the normalized signal $S'_\phi$ of odd echoes at incomplete polarization due to phase shift can be written as $$S'_\phi = \Gamma\left(\frac{2}{n'}-1\right)\frac{2C^{\frac{2}{n'}}}{n'}D_{t=\frac{1}{C}}^{-\frac{2}{n'}+1}\left(\left(1-e^{-\frac{1}{t}}\right)e^{-iAt}\left(\frac{1}{C}-t\right)\right). \quad (A13)$$

For n'>2, Eq. (A 11) can be expressed as $$\int_0^R f(v(r))\exp(-i\phi(r))r\,dr = \frac{C^{\frac{2}{n'}}R^2}{n'}\int_0^{\frac{1}{T}}\left(\frac{1}{C}-y\right)^{\frac{2}{n'}-2} \quad (A14)$$

$$\left(\frac{1}{C}-y\right)\left(1-e^{-\frac{1}{y}}\right)e^{-iAy}dy$$

$$= \Gamma\left(\frac{2}{n'}\right)\frac{R^2 C^{\frac{2}{n'}}}{n'}{}_0D_{t=\frac{1}{C}}^{-\frac{2}{n'}}\left(\left(1-e^{-\frac{1}{t}}\right)e^{-iAt}\right)$$

Thus, for Shear-thinning flow n'>2, the normalized signal $S'_\phi$ of odd echoes at incomplete polarization due to phase shift can be written as $$S'_\phi = \Gamma\left(\frac{2}{n'}\right)\frac{2C^{\frac{2}{n'}}}{n'}{}_0D_{t=\frac{1}{C}}^{-\frac{2}{n'}}\left(\left(1-e^{-\frac{1}{t}}\right)e^{-iAt}\right) \quad (A15)$$

In summary, the normalized signal $S'_\phi$ of odd echoes at incomplete polarization due to phase shift, for laminar flow, can be written as $$S'_\phi = \begin{cases} \Gamma\left(\frac{2}{n'}-1\right)\frac{2C^{\frac{2}{n'}}}{n'}{}_0D_{t=\frac{1}{C}}^{-\frac{2}{n'}+1}\left(\left(1-e^{-\frac{1}{t}}\right)e^{-iAt}\left(\frac{1}{C}-t\right)\right), & 1<n'<2 \\[2mm] C_0 N_{t=\frac{1}{C}}\left(e^{-\frac{1}{t}}e^{-iAt}\right), & n'=2 \\[2mm] \Gamma\left(\frac{2}{n'}\right)\frac{2C^{\frac{2}{n'}}}{n'}{}_0D_{t=\frac{1}{C}}^{-\frac{2}{n'}}\left(\left(1-e^{-\frac{1}{t}}\right)e^{-iAt}\right), & n'>2 \end{cases} \quad (A16)$$

We term Eq. (A16) the Denton-Davidson equations.

REFERENCES

[1] Streeter, V. L., and J. Kestin, "Handbook of fluid dynamics," J. Appl. Mech. 28(4), 640 (1961).
[2] Yamada, M., M. Nakashima, and M. Seki, "Pinched flow fractionation: continuous size separation of particles utilizing a laminar flow profile in a pinched microchannel," Anal. Chem. 76(18), 5465-5471 (2004).

[3] Chhabra, R. P., and J. F. Richardson, "Non-Newtonian flow and applied rheology: Engineering applications," Butterworth-Heinemann (2011).

[4] Eshtiaghi, N., F. Markis, S. D. Yap, J. C. Baudez, and P. Slatter, "Rheological characterisation of municipal sludge: a review," Water Res. 47(15), 5493-5510 (2013).

[5] Callaghan, P. T., "Rheo-NMR and velocity imaging," Curr. Opin. Colloid Interface Sci. 11(1), 13-18 (2006).

[6] Havisto, S., M. J. Cardona, J. Salmela, R. L. Powell, M. J. McCarthy, M. Kataja, and A. I. Koponen, "Experimental investigation of the flow dynamics and rheology of complex fluids in pipe flow by hybrid multi-scale velocimetry," Exp. Fluids 58(11), 1-13 (2017).

[7] Kim, S. K., "Flow-rate based method for velocity of fully developed laminar flow in tubes." J. Rheol. 62(6), 1397-1407 (2018).

[8] Coussot, P., "Progress in rheology and hydrodynamics allowed by NMR or MRI techniques," Exp. Fluids 61(9), 1-20 and 207 (2020).

[9] Gladden, L. F., and A. J. Sederman, "Recent advances in flow MRI," J. Magn. Reson. 229, 2-11 (2013).

[10] Edelhoff, D., L. Walczak, S. Henning, F. Weichert, and D. Suter, "High-resolution MRI velocimetry compared with numerical simulations," J. Magn. Reson. 235, 42-49 (2013).

[11] Pope, J. M., and S. Yao, "Quantitative NMR imaging of flow," Concept. Magn. Reson. 5(4), 281-302 (1993).

[12] Fukushima, E., "Nuclear magnetic resonance as a tool to study flow," Annu. Rev. Fluid Mech. 31(1), 95-123 (1999).

[13] Elkins, C. J., and M. T. Alley, "Magnetic resonance velocimetry: Applications of magnetic resonance imaging in the measurement of fluid motion," Exp. Fluids 43(6), 823-858 (2007).

[14] Lim, V., A. M. Hobby, M. J. McCarthy, and K. L. McCarthy, "Laminar mixing of miscible fluids in a SMX mixer evaluated by magnetic resonance imaging (MRI)," Chem. Eng. Sci. 137, 1024-1033 (2015).

[15] Gibbs, S. J., D. E. Haycock, W. J. Frith, S. Ablett, and L. D. Hall, "Strategies for rapid NMR rheometry by magnetic resonance imaging velocimetry," J. Magn. Reson. 125(1), 43-51 (1997).

[16] Wu, D. H., A. I. D. I. Chen, and C. S. Johnson, "Flow imaging by means of 1D pulsed-field-gradient NMR with application to electroosmotic flow," J. Magn. Reson. Series A 115(1), 123-126 (1995).

[17] Blythe, T. W., A. J. Sederman, J. Mitchell, E. H. Stitt, A. P. E. York, and L. F. Gladden, "Characterising the rheology of non-Newtonian fluids using PFG-NMR and cumulant analysis," J. Magn. Reson. 255, 122-131 (2015).

[18] Blythe, T. W., A. J. Sederman, E. H. Stitt, A. P. York, and L. F. Gladden, "PFG NMR and Bayesian analysis to characterise non-Newtonian fluids," J. Magn. Reson. 274, 103-114 (2017).

[19] Adair, A., S. Richard, and B. Newling, "Gas and liquid phase imaging of foam flow using pure phase encode magnetic resonance imaging," Molecules 26(1), 28 (2021).

[20] Zhang, J., and B. J. Balcom, "Magnetic resonance imaging of two-component liquid-liquid flow in a circular capillary tube," Phys. Rev. E 81(5), 056318 (2010).

[21] Li, T. Q., J. D. Seymour, R. L. Powell, K. L. McCarthy, L. Odberg, and M. J. McCarthy, "Turbulent pipe flow studied by time-averaged NMR imaging: measurements of velocity profile and turbulent intensity," Magn. Reson. Imaging 12(6), 923-934 (1994).

[22] Gach, H. M., and I. J. Lowe, "Characterization of flow emerging from a stenosis using MRI," Magn. Reson. Med. 40(4), 559-570 (1998).

[23] Newling, B., C. C. Poirier, Y. Zhi, J. A. Rioux, A. J. Coristine, D. Roach, and B. J. Balcom, "Velocity imaging of highly turbulent gas flow," Phy. Rev. Lett. 93(15), 154503 (2004).

[24] Tayler, A. B., D. J. Holland, A. J. Sederman, and L. F. Gladden, "Exploring the origins of turbulence in multi-phase flow using compressed sensing MRI," Phys. Rev. Lett. 108(26), 264505 (2012).

[25] Gummerson, R. J., C. Hall, W. D. Hoff, R. Hawkes, G. N. Holland, and W. S. Moore, "Unsaturated water flow within porous materials observed by NMR imaging," Nature 281(5726), 56-57 (1979).

[26] Granwehr, J., E. Harel, S. Han, S. Garcia, A. Pines, P. N. Sen, and Y. Q. Song, "Time-of-flight flow imaging using NMR remote detection," Phys. Rev. Lett. 95(7), 075503 (2005).

[27] Li, L., Q. Chen, A. E. Marble, L. Romero-Zerón, B. Newling, and B. J. Balcom, "Flow imaging of fluids in porous media by magnetization prepared centric-scan SPRITE," J. Magn. Reson. 197(1), 1-8 (2009).

[28] Suryan, G., "Nuclear resonance in flowing liquids," In Proceedings of the Indian Academy of Sciences-Section A, Springer India (1951).

[29] Singer, J. R., "Blood flow rates by nuclear magnetic resonance measurements," Science 130(3389), 1652-1653 (1959).

[30] Hirschel, L. R., and L. F. Libelo, "NMR signal dependence on fluid velocity," J. Appl. Phys. 33(5), 1895-1896 (1962).

[31] Arnold, D. W., and L. E. Burkhart, "Spin-echo NMR response from a flowing sample," J. Appl. Phys. 36(3), 870-871 (1965).

[32] Stejskal, E. O., "Use of spin echoes in a pulsed magnetic-field gradient to study anisotropic, restricted diffusion and flow," J. Chem. Phys. 43(10), 3597-3603 (1965).

[33] Grover, T., and J. R. Singer, "NMR spin-echo flow measurements," J. Appl. Phys. 42(3), 938-940 (1971).

[34] Hayward, R. J., K. J. Packer, and D. J. Tomlinson, "Pulsed field-gradient spin echo NMR studies of flow in fluids," Mol. Phys. 23(6), 1083-1102 (1972).

[35] Song, Y. Q., and U. M. Scheven, "An NMR technique for rapid measurement of flow," J. Magn. Reson. 172(1), 31-35 (2005).

[36] Fridjonsson, E. O., P. L. Stanwix, and M. L. Johns, "Earth's field NMR flow meter: Preliminary quantitative measurements," J. Magn. Reson. 245, 110-115 (2014).

[37] Osán, T. M., J. M. Ollé, M. Carpinella, L. M. C. Cerioni, D. J. Pusiol, M. Appel, J. Freeman, and I. Espejo, "Fast measurements of average flow velocity by Low-Field 1H NMR," J. Magn. Reson. 209(2), 116-122 (2011).

[38] Richard, S. J., and B. Newling, "Measuring flow using a permanent magnet with a large constant gradient," Appl. Magn. Reson. 50(5), 627-635 (2019).

[39] Chen, W., L. Xiao, H. Liu, G. Liao, W. Liu, Y. Zhang, Q. Wu, Z. Sun, and W. Zheng, "Design and implementation of a robust NMR fluid analyzer with multiple antennas," Appl. Magn. Reson. 50(1), 263-275 (2019).

[40] O'Neill, K. T., E. O. Fridjonsson, P. L. Stanwix, and M. L. Johns, "Quantitative velocity distributions via nuclear magnetic resonance flow metering," J. Magn. Reson. 269, 179-185 (2016).

[41] O'Neill, K. T., A. Klotz, P. L. Stanwix, E. O. Fridjonsson, and M. L. Johns, "Quantitative multiphase flow characterisation using an Earth's field NMR flow meter," Flow Meas. Instrum. 58, 104-111 (2017).

[42] O'Neill, K. T., L. Brancato, P. L. Stanwix, E. O. Fridjonsson, and M. L. Johns, "Two-phase oil/water flow measurement using an Earth's field nuclear magnetic resonance flow meter," Chem. Eng. Sci. 202, 222-237 (2019).

[43] Hinch, E. J., Lecture 3: Simple Flows (Woods Hole Oceanographic Institution, https://gfd.whoi.edu/wp-content/uploads/sites/18/2018/03/lecture03_28327.pdf, 2018).

[44] Packer, K. J., "The study of slow coherent molecular motion by pulsed nuclear magnetic resonance," Mol. Phys. 17(4), 355-368 (1969).

[45] Callaghan, P. T., "Translational dynamics and magnetic resonance: Principles of pulsed gradient spin echo NMR," Oxford University Press (2011).

[46] Archibald, R., and A. Gelb, "A method to reduce the Gibbs ringing artifact in MRI scans while keeping tissue boundary integrity," IEEE Trans. Med. Imaging 21(4), 305-319 (2002).

[47] Zhong, L., M. Oostrom, M. J. Truex, V. R. Vermeul, and J. E. Szecsody, "Rheological behavior of xanthan gum solution related to shear thinning fluid delivery for subsurface remediation," J. Hazard. Mater. 244, 160-170 (2013).

[48] Coulson, J. M., J. F. Richardson, J. R. Backhurst, and J. H. Harker, "Fluid flow, heat transfer and mass transfer," Butterworth-Heinemann (1999).

[49] Benson, T. B., and P. J. McDonald, "Profile amplitude modulation in stray-field magnetic-resonance imaging," J. Magn. Reson. Series A 112(1), 17-23 (1995).

[50] R. Johnson, Handbook of Fluid Dynamics, 2nd ed. (CRC Press, Boca Raton, 2016).

[51] S. Haavisto, M. J. Cardona, J. Salmela, R. L. Powell, M. J. McCarthy, M. Kataja, and A. I. Koponen, "Experimental investigation of the flow dynamics and rheology of complex fluids in pipe flow by hybrid multi-scale velocimetry," Exp. Fluids 58(11), 158 (2017).

[52] A. M. Karim, "Experimental dynamics of Newtonian and non-Newtonian droplets impacting liquid surface with different rheology," Phys. Fluids 32(4), 043102 (2020).

[53] B. Sharma and R. N. Barman, "Steady laminar flow past a slotted circular cylinder," Phys. Fluids 32(7), 073605 (2020).

[54] M. Malik, R. Bouffanais, and M. Skote, "Viscoelastic laminar drag bounds in pipe flow," Phys. Fluids 32(3), 031702 (2020).

[55] M. Bonesi, D. Churmakov, and I, Meglinski, "Study of flow dynamics in complex vessels using Doppler optical coherence tomography," Meas. Sci. Technol. 18, 3279-3286 (2007).

[56] J. Lauri, A. V. Bykov, A. V. Priezzhev, and R. Myllyls, "Experimental study of the multiple scattering effect on the flow velocity profiles measured in intralipid phantoms by DOCT," Laser Phys. 21, 813-817 (2011).

[57] S. Haavisto, J. Salmela, and A. Koponen, "Accurate velocity measurements of boundary-layer flows using Doppler optical coherence tomography," Exp. Fluids 56, 1-6 (2015).

[58] B. Ouriev and E. J. Windhab, "Rheological study of concentrated suspensions in pressure-driven shear fow using a novel in-line ultrasound Doppler method," Exp. Fluids 32, 204-211 (2002).

[59] J. Wiklund and M. Stading, "Application of in-line ultrasound Doppler-based UVP-PD rheometry method to concentrated model and industrial suspensions," Flow Meas. Instrum. 19, 171-179 (2008).

[60] J. Zhang and B. J. Balcom, "Magnetic resonance imaging of two-component liquid-liquid flow in a circular capillary tube," Phys. Rev. E 81, 056318 (2010).

[61] E. E. Ehrichs, H. M. Jaeger, G. S. Karczmar, J. B. Knight, V. Y. Kuperman, and S. R. Nagel, "Granular convection observed by magnetic resonance imaging," Science 267, 1632-1634 (1995).

[62] A. Penn, T. Tsuji, D. O. Brunner, C. M. Boyce, K. P. Pruessmann, and C. R. Müller, "Real-time probing of granular dynamics with magnetic resonance," Sci. Adv. 3, e1701879 (2017).

[63] L. Fullard, D. J. Holland, P. Galvosas, C. Davies, P. Y. Lagrée, and S. Popinet, "Quantifying silo flow using MRI velocimetry for testing granular flow models," Phys. Rev. Fluids 4, 074302 (2019).

[64] A. B. Tayler, D. J. Holland, A. J. Sederman, and L. F. Gladden, "Exploring the origins of turbulence in multiphase flow using compressed sensing MRI," Phys. Rev. Lett. 108, 264505 (2012).

[65] M. Ziegler, J. Lantz, T. Ebbers, and P. Dyverfeldt, "Assessment of turbulent flow effects on the vessel wall using four-dimensional flow MRI," Magn. Reson. Med. 77, 2310-2319 (2017).

[66] A. Caprihan and E. Fukushima, "Flow measurements by NMR," Phys. Rep. 198 (4), 195-235 (1990).

[67] Y. Q. Song and U. M. Scheven, "An NMR technique for rapid measurement of flow," J. Magn. Reson. 172(1), 31-35 (2005).

[68] J. Guo, M. M. B. Ross, B. Newling, and B. J. Balcom, "Non-Newtonian fluid velocity profiles determined with simple magnetic resonance spin echoes," Phys. Rev. Appl. 16(2), L021001 (2021).

We claim:

1. A magnetic resonance method for characterizing a pattern of flow of a flowing fluid comprising the steps of:

flowing the fluid through a conduit, wherein a segment of the conduit defines a measurement volume;

subjecting the flowing fluid in the measurement volume to
a magnetic field gradient generally in the direction of flow of the fluid, wherein the magnetic field gradient in the direction of flow comprises a fixed value in the measurement volume and
radio frequency excitation pulses generating a signal in the form of a series of echoes, wherein the radio frequency excitation pulses are applied as part of an echo train measurement;
and wherein the magnetic field gradient is generated by at least two opposing non-parallel permanent magnets equally inclined with respect to a central axis of the direction of flow, or by a switched magnetic field that is turned on with a stable value for a duration of the echo train measurement;

acquiring at least one odd echo from the series of echoes, wherein the at least one odd echo comprises signals from streamlines in the flowing fluid in the measurement volume;

processing the signals from the streamlines to concurrently determine a signal magnitude and a net phase accumulation and using the signal magnitude and the net phase accumulation to determine a flow behaviour index and an average velocity for the flowing fluid; and calculating velocity as a function of a radius of the conduit using the flow behaviour index and the average velocity and relating the function to the pattern of flow to characterize the pattern of flow exhibited by the flowing fluid, where the step of concurrently determining the signal magnitude and the net phase accumulation is determined using the equations:

$$M'_\phi = |S'_\phi| = \sqrt{S'_\phi \overline{S'_\phi}} =$$

$$\begin{cases} \Gamma\left(\frac{2}{n'}-1\right)\frac{2C^{\frac{2}{n'}}}{n'}\sqrt{\left[{}_0D^{-\frac{2}{n'}+1}_{t=\frac{1}{C}}\left(\left(1-e^{-\frac{1}{t}}\right)\left(\frac{1}{C}-t\right)e^{-iAt}\right)\right],} \\ \qquad\qquad \sqrt{\left[{}_0D^{-\frac{2}{n'}+1}_{t=\frac{1}{C}}\left(\left(1-e^{-\frac{1}{t}}\right)\left(\frac{1}{C}-t\right)e^{-iAt}\right)\right]} \\ C\sqrt{\left[{}_0N_{t=\frac{1}{C}}\left(e^{-\frac{1}{t}}e^{-iAt}\right)\right]\left[{}_0N_{t=\frac{1}{C}}\left(e^{-\frac{1}{t}}e^{-iAt}\right)\right],} \\ \Gamma\left(\frac{2}{n'}\right)\frac{2C^{\frac{2}{n'}}}{n'}\sqrt{\left[{}_0D^{-\frac{2}{n'}}_{t=\frac{1}{C}}\left(\left(1-e^{-\frac{1}{t}}\right)e^{-iAt}\right)\right],} \\ \qquad\qquad \sqrt{\left[{}_0D^{-\frac{2}{n'}}_{t=\frac{1}{C}}\left(\left(1-e^{-\frac{1}{t}}\right)e^{-iAt}\right)\right]} \end{cases}$$

$$\begin{matrix} 1 < n' < 2 \\ n' = 2 \quad \text{and} \\ n' > 2 \end{matrix}$$

$$\phi'_{add} =$$

$$\arctan\left(\frac{S'_{\phi,Im}}{S'_{\phi,Re}}\right) = \begin{cases} \arctan\left(\dfrac{{}_0D^{-\frac{2}{n'}+1}_{t=\frac{1}{C}}\left(\left(1-e^{-\frac{1}{t}}\right)\left(\frac{1}{C}-t\right)\sin(At)\right)}{{}_0D^{-\frac{2}{n'}+1}_{t=\frac{1}{C}}\left(\left(1-e^{-\frac{1}{t}}\right)\left(\frac{1}{C}-t\right)\cos(At)\right)}\right), & 1 < n' < 2 \\ \arctan\left(\dfrac{{}_0N_{t=\frac{1}{C}}\left(e^{-\frac{1}{t}}\sin(At)\right)}{{}_0N_{t=\frac{1}{C}}\left(e^{-\frac{1}{t}}\cos(At)\right)}\right), & n' = 2 \\ \arctan\left(\dfrac{{}_0D^{-\frac{2}{n'}}_{t=\frac{1}{C}}\left(\left(1-e^{-\frac{1}{t}}\right)\sin(At)\right)}{{}_0D^{-\frac{2}{n'}}_{t=\frac{1}{C}}\left(\left(1-e^{-\frac{1}{t}}\right)\cos(At)\right)}\right), & n' > 2 \end{cases}$$

wherein $M'_\phi$ is a normalized signal magnitude;

$S'_\phi$ is a normalized odd echo signal due to phase shift;

$\phi'_{add}$ is a net phase accumulation of odd echoes;

$S'_{\phi,Im}$ is an imaginary signal component of the measurement;

$S'_{\phi,Re}$ is a real signal component of the measurement $\Gamma$ is a gamma distribution function according to the equation $$\Gamma(x) = \int_0^\infty w^{x-1}e^{-w}dw(x > 0);$$

n' is a flow behaviour index;

C is determined using the equation $$C = \frac{L_{pol}}{T_1 v_{max}}$$

$L_{pol}$ is effective polarization length;

$T_1$ is a spin lattice relaxation time of a fluid;

$V_{max}$ is the maximum flow velocity of the fluid;

D is a Riemann-Liouville fractional integral;

A is determined using the equation $$A = \gamma G v_{max}\tau^2 C$$

$\gamma$ is the gyromagnetic ratio;

G is a constant magnetic field gradient in the direction of flow;

$\tau$ is the time interval between pulses;

X is determined by the equation $$\frac{n'+2}{n'}$$

$$X = \frac{m+2}{m}\gamma G v_{avg}\tau^2;$$

and m is a laminar flow parameter; and

N is a function defined by the equation $$_aN_x f(x) = \int_a^x f(w)dw.$$

2. The method of claim 1, wherein the step of concurrently determining the signal magnitude and the net phase accumulation is carried out at different $\tau$ values, where T is the time interval between pulses.

3. The method of claim 2, wherein the flowing fluid in the measured volume undergoes incomplete polarized magnetization.

4. The method of claim 1, wherein the radio frequency excitation pulses are applied as part of a Carr-Purcell-Meiboom-Gill magnetic resonance measurement and the at least one odd echo comprises a plurality of odd echoes.

5. The method of claim 1, wherein a second segment of the conduit defines a pre-polarization volume immediately upstream of the measurement volume; and the method further comprises subjecting the flowing fluid in the pre-polarization volume to at least one pre-polarization magnetic field.

6. The method of claim 1, wherein the steps of determining the flow behavior index and the average velocity comprises:

processing the signals to obtain magnitude data of the at least one echo and calculating the flow behavior index and the average velocity through a fitting method using the equation $$M_\phi =$$

$$\sqrt{(S_{Re})^2 + (S_{Im})^2} = \frac{2}{mX^{\frac{2}{m}}}\sqrt{\left(\Gamma\left(\frac{2}{m}\right)-\Gamma\left(\frac{2}{m},-Xi\right)\right)\left(\Gamma\left(\frac{2}{m}\right)-\Gamma\left(\frac{2}{m},-Xi\right)\right)}.$$

wherein $M_\phi$ is a normalized magnitude of odd echoes;

$S_{Im}$ is an imaginary signal component of the measurement;

$S_{Re}$ is a real signal component of the measurement $\Gamma$ is a gamma distribution function according to the equation $$\Gamma(x) = \int_0^\infty w^{x-1} e^{-w} dw (x > 0);$$

m is a laminar flow parameter;

$\gamma$ is the gyromagnetic ratio;

G is a constant magnetic field gradient in the direction of flow;

$\tau$ is the time interval between pulses;

$v_{avq}$ is average velocity;

X is determined by the equation $$X = \frac{m+2}{m} \gamma G v_{avg} \tau^2.$$

7. The method of claim 6, wherein the radio frequency excitation pulses are applied as part of a Carr-Purcell-Meiboom-Gill magnetic resonance measurement and the at least one odd echo comprises a plurality of odd echoes.

8. The method of claim 1, wherein the steps of determining the flow behavior index and the average velocity comprises:

processing the signals from the streamlines to obtain a phase shift value;

determining the average velocity though a fitting method using the phase shift value and the equation $$\phi_{odd} = = \frac{\iint \phi r dr d\theta}{\iint r dr d\theta} = \frac{\int_0^R \phi r dr}{\int_0^R r dr} = \frac{\int_0^R (\gamma G v(r) \tau^2) r dr}{\int_0^R r dr}$$

$$= \gamma G \tau^2 \frac{\int_0^R \left( v_{max} \left( 1 - \frac{r^m}{R^m} \right) \right) r dr}{\int_0^R r dr} = \frac{m}{m+2} v_{max} \gamma G \tau^2$$

$$= \gamma G v_{avg} \tau^2,$$

determining the flow behaviour index though a fitting method using the calculated average velocity and the equation $$M_\phi =$$

$$\sqrt{(S_{Re})^2 + (S_{Im})^2} = \frac{2}{m X^{\frac{2}{m}}} \sqrt{\left( \Gamma\left(\frac{2}{m}\right) - \Gamma\left(\frac{2}{m}, -Xi\right) \right) \left( \Gamma\left(\frac{2}{m}\right) - \Gamma\left(\frac{2}{m}, -Xi\right) \right)}.$$

wherein $\phi$ are phase accumulation;

$M_\phi$ is a normalized magnitude of odd echoes;

$S_{Im}$ is an imaginary signal component of the measurement;

$S_{Re}$ is a real signal component of the measurement;

$r dr d\theta$ is cross-sectional area of the conduit;

$\Gamma$ is a gamma distribution function according to the equation $$\Gamma(X) = \int_0^\infty w^{x-1} e^{-w} dw (x > 0);$$

m is a laminar flow parameter;

$\gamma$ is the gyromagnetic ratio;

$\tau$ is the time interval between pulses;

$v_{avg}$ is average velocity;

X is determined by the equation $$X = \frac{m+2}{m} \gamma G v_{avg} \tau^2;$$

r is radial position; and

R is the radius of the conduit.

9. The method of claim 8, wherein the radio frequency excitation pulses are applied as part of a Carr-Purcell-Meiboom-Gill magnetic resonance measurement and the at least one odd echo comprises a plurality of odd echoes.

10. The method of claim 8, wherein a second segment of the conduit defines a pre-polarization volume immediately upstream of the measurement volume; and the method further comprises subjecting the flowing fluid in the pre-polarization volume to at least one pre-polarization magnetic field.

11. The method of claim 8 wherein the magnetic field gradient is generated by the at least two opposing non-parallel permanent magnets equally inclined with respect to the central axis of the direction of flow.

12. The method of claim 8, wherein the magnetic field gradient is the switched magnetic field gradient.

13. The method of claim 1, wherein the step of determining the average velocity comprises calculating the average velocity from a provided flow rate of the flowing fluid and a provided diameter of the conduit in a segment of measurement volume.

14. A computer-implemented method for characterizing a pattern of flow of a flowing fluid comprising:

processing at least one odd echo acquired from radio frequency pulses of a measurement volume containing a flowing fluid, wherein the radio frequency pulses are applied as part of an echo train measurement, and wherein the flowing fluid is subjected to a magnetic field gradient generated by at least two opposing non-parallel permanent magnets equally inclined with respect to the central axis of the direction of flow, or a switched magnetic field that is turned on with a stable value, and left on for the duration of the echo train measurement, and wherein the echo includes signals from streamlines in the flowing fluid in the measurement volume;

processing the signals to concurrently determine a signal magnitude and a net phase accumulation and using the signal magnitude and the net phase accumulation to determine a flow behaviour index and an average velocity for the flowing fluid; and calculating velocity as a function of a radius of the conduit using the flow behaviour index and the average velocity and relating the function to the pattern of flow to characterize the pattern of flow exhibited by the flowing fluid, where the step of concurrently determining the signal magnitude and the net phase accumulation is determined using the equations:

$$M'_\phi =$$

$$|S'_\phi| = \sqrt{S'_\phi \overline{S'_\phi}} = \begin{cases} \Gamma\left(\frac{2}{n'}-1\right)\frac{2C^{\frac{2}{n'}}}{n'}\sqrt{\left[{}_0D^{-\frac{2}{n'}+1}_{t=\frac{1}{C}}\left(\left(1-e^{-\frac{1}{t}}\right)\left(\frac{1}{C}-t\right)e^{-iAt}\right)\right]\left[{}_0D^{-\frac{2}{n'}+1}_{t=\frac{1}{C}}\left(\left(1-e^{-\frac{1}{t}}\right)\left(\frac{1}{C}-t\right)e^{iAt}\right)\right]}, & 1 < n' < 2 \\[2em] C\sqrt{\left[{}_0N_{t=\frac{1}{C}}\left(e^{-\frac{1}{t}}e^{-iAt}\right)\right]\left[{}_0N_{t=\frac{1}{C}}\left(e^{-\frac{1}{t}}e^{iAt}\right)\right]}, & n' = 2 \\[2em] \Gamma\left(\frac{2}{n'}\right)\sqrt{\frac{2C^{\frac{2}{n'}}}{n'}\left[{}_0D^{-\frac{2}{n'}}_{t=\frac{1}{C}}\left(\left(1-e^{-\frac{1}{t}}\right)e^{-iAt}\right)\right]\left[{}_0D^{-\frac{2}{n'}}_{t=\frac{1}{C}}\left(\left(1-e^{-\frac{1}{t}}\right)e^{iAt}\right)\right]}, & n' > 2 \end{cases}$$

and $$\phi'_{add} = \arctan\left(\frac{S'_{\phi,Im}}{S'_{\phi,Re}}\right) = \begin{cases} \arctan\left(\dfrac{{}_0D^{-\frac{2}{n'}+1}_{t=\frac{1}{C}}\left(\left(1-e^{-\frac{1}{t}}\right)\left(\frac{1}{C}-t\right)\sin(At)\right)}{{}_0D^{-\frac{2}{n'}+1}_{t=\frac{1}{C}}\left(\left(1-e^{-\frac{1}{t}}\right)\left(\frac{1}{C}-t\right)\cos(At)\right)}\right), & 1 < n' < 2 \\[2.5em] \arctan\left(\dfrac{{}_0N_{t=\frac{1}{C}}\left(e^{-\frac{1}{t}}\sin(At)\right)}{{}_0N_{t=\frac{1}{C}}\left(e^{-\frac{1}{t}}\cos(At)\right)}\right), & n' = 2 \\[2.5em] \arctan\left(\dfrac{{}_0D^{-\frac{2}{n'}}_{t=\frac{1}{C}}\left(\left(1-e^{-\frac{1}{t}}\right)\sin(At)\right)}{{}_0D^{-\frac{2}{n'}}_{t=\frac{1}{C}}\left(\left(1-e^{-\frac{1}{t}}\right)\cos(At)\right)}\right), & n' > 2 \end{cases}$$

wherein $M'_\phi$ is a normalized signal magnitude;

$S'_\phi$ is a normalized odd echo signal due to phase shift;

$\phi'_{odd}$ is a net phase accumulation of odd echoes;

$S'_{\phi,Im}$ is an imaginary signal component of the measurement;

$S'_{\phi,Re}$ is a real signal component of the measurement $\Gamma$ is a gamma distribution function according to the equation $$\Gamma(x) = \int_0^\infty w^{x-1}e^{-w}dw(x > 0);$$

$n'$ is a flow behaviour index;

C is determined using the equation $$C = \frac{L_{pol}}{T_1 v_{max}}$$

$L_{pol}$ is effective polarization length;

$T_1$ is a spin lattice relaxation time of a fluid;

$V_{max}$ is the maximum flow velocity;

D is a Riemann-Liouville fractional integral;

A is determined using the equation $$A = \gamma G v_{max}\tau^2 C$$

$\gamma$ is the gyromagnetic ratio;

G is a constant magnetic field gradient in the direction of flow;

$\tau$ is the time interval between pulses;

X is determined by the equation $$X = \frac{n'+2}{n'}\gamma G v_{avg}\tau^2$$

m is a laminar flow parameter; and

N is a function defined by the equation $$_aN_x f(x) = \int_a^x f(w)dw.$$

* * * * *